United States Patent
Bittner et al.

(10) Patent No.: US 9,354,524 B2
(45) Date of Patent: May 31, 2016

(54) PROJECTION EXPOSURE APPARATUS WITH OPTIMIZED ADJUSTMENT POSSIBILITY

(75) Inventors: Boris Bittner, Roth (DE); Holger Walter, Abtsgmuend (DE); Matthias Roesch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/427,030

(22) Filed: Mar. 22, 2012

(65) Prior Publication Data

US 2012/0188524 A1 Jul. 26, 2012

Related U.S. Application Data

(63) Continuation of application No. 13/069,551, filed on Mar. 23, 2011, now Pat. No. 8,203,696, which is a continuation of application No. PCT/EP2009/062140, filed on Sep. 18, 2009.

(60) Provisional application No. 61/099,948, filed on Sep. 25, 2008.

(30) Foreign Application Priority Data

Sep. 25, 2008 (DE) .......................... 10 2008 042 356

(51) Int. Cl.
*G03B 27/52* (2006.01)
*G03B 27/68* (2006.01)
(Continued)

(52) U.S. Cl.
CPC ............ *G03F 7/70308* (2013.01); *G03F 7/705* (2013.01); *G03F 7/70266* (2013.01); *G03F 7/70891* (2013.01)

USPC .................. 355/55; 355/52; 355/53; 355/67; 355/71

(58) Field of Classification Search
CPC . G03F 7/70266; G03F 7/70308; G03F 7/705; G03F 7/70508; G03F 7/70525; G03F 7/706
USPC .............. 355/52, 53, 55, 67–71, 77; 359/811, 359/813–830; 250/492.1, 492.2, 492.22, 250/548; 430/5, 8, 22, 30, 311, 312, 321
See application file for complete search history.

(56) References Cited

U.S. PATENT DOCUMENTS 4,920,505 A 4/1990 Suzuki
5,202,748 A 4/1993 MacDonald et al.
(Continued)

FOREIGN PATENT DOCUMENTS

DE 36 42 418 A1 6/1987
DE 3642418 A1 6/1987
(Continued)

OTHER PUBLICATIONS

The International Search Report and Written Opinion from the counterpart PCT Application No. PCT/EP2009/062140, dated Dec. 4, 2009.
(Continued)

*Primary Examiner* — Christina Riddle
(74) *Attorney, Agent, or Firm* — Fish & Richardson P.C.

(57) ABSTRACT

A microlithography projection objective includes an optical element, a manipulator configured to manipulate the optical element, and a control unit configured to control the manipulator. The control unit includes a first device configured to control movement of the manipulator, a memory comprising an upper bound for a range of movement of the manipulator, and a second device configured to generate a merit function based on a square of a root mean square (RMS) of at least one error and configured to minimize the merit function subordinate to the upper bound for the range of movement of the manipulator.

66 Claims, 13 Drawing Sheets

(51) Int. Cl.
*G03B 27/54* (2006.01)
*G03F 7/20* (2006.01)
*G03B 27/42* (2006.01)
*G03B 27/72* (2006.01)

(56) References Cited

U.S. PATENT DOCUMENTS

| | | | |
|---|---|---|---|
| 5,581,324 A | 12/1996 | Miyai et al. | |
| 5,964,951 A | 10/1999 | Yamamoto et al. | |
| 6,416,913 B1 | 7/2002 | Suzuki | |
| 6,429,981 B2* | 8/2002 | Ishii et al. | 359/813 |
| 6,678,240 B2* | 1/2004 | Geh et al. | 355/77 |
| 6,741,331 B2 | 5/2004 | Boonman et al. | |
| 7,301,615 B2 | 11/2007 | Fukagawa et al. | |
| 7,328,074 B2 | 2/2008 | Das et al. | |
| 7,436,521 B2 | 10/2008 | Emer et al. | |
| 7,580,113 B2* | 8/2009 | Tel et al. | 355/53 |
| 7,800,732 B2* | 9/2010 | Zimmermann et al. | 355/53 |
| 7,817,249 B2 | 10/2010 | Uehara | |
| 7,830,611 B2* | 11/2010 | Conradi et al. | 359/665 |
| 2001/0053962 A1 | 12/2001 | Yoshida et al. | |
| 2002/0012109 A1 | 1/2002 | Suzuki et al. | |
| 2002/0045106 A1 | 4/2002 | Baselmans et al. | |
| 2002/0159040 A1* | 10/2002 | Hamatani et al. | 355/52 |
| 2002/0191165 A1* | 12/2002 | Baselmans et al. | 355/52 |
| 2003/0147150 A1 | 8/2003 | Kohl et al. | |
| 2003/0174300 A1* | 9/2003 | Endo et al. | 355/55 |
| 2004/0051057 A1 | 3/2004 | Yoshida | |
| 2004/0090617 A1* | 5/2004 | Geh et al. | 356/124 |
| 2004/0105085 A1 | 6/2004 | Suzuki | |
| 2004/0257549 A1* | 12/2004 | Leenders et al. | 355/53 |
| 2005/0231700 A1 | 10/2005 | Emer | |
| 2005/0237506 A1* | 10/2005 | Reisinger et al. | 355/55 |
| 2006/0008716 A1 | 1/2006 | Jeunink et al. | |
| 2006/0016308 A1 | 1/2006 | Katai et al. | |
| 2006/0017898 A1 | 1/2006 | Okada | |
| 2006/0023179 A1* | 2/2006 | Tschischgale et al. | 355/53 |
| 2006/0046165 A1 | 3/2006 | Laan et al. | |
| 2006/0072104 A1 | 4/2006 | Engel et al. | |
| 2006/0074045 A1 | 4/2006 | Yu et al. | |
| 2006/0077373 A1 | 4/2006 | Mulkens et al. | |
| 2006/0119822 A1* | 6/2006 | Fehr et al. | 355/55 |
| 2006/0119838 A1 | 6/2006 | Emer et al. | |
| 2006/0197930 A1 | 9/2006 | Kawashima et al. | |
| 2006/0244940 A1* | 11/2006 | Uehara | 355/69 |
| 2007/0115458 A1* | 5/2007 | Fukagawa et al. | 356/124 |
| 2008/0002174 A1 | 1/2008 | Tinnemans | |
| 2008/0291412 A1 | 11/2008 | Kazinczi et al. | |
| 2008/0297922 A1* | 12/2008 | Lule | 359/824 |
| 2009/0103065 A1* | 4/2009 | Yoshihara et al. | 355/52 |
| 2009/0231565 A1 | 9/2009 | Conradi | |
| 2010/0128367 A1 | 5/2010 | Beckenbach et al. | |
| 2010/0201958 A1 | 8/2010 | Hauf et al. | |
| 2010/0302524 A1 | 12/2010 | Shigenobu et al. | |
| 2011/0080569 A1 | 4/2011 | Eva et al. | |
| 2011/0216303 A1 | 9/2011 | Emer | |

FOREIGN PATENT DOCUMENTS

| | | |
|---|---|---|
| DE | 10 2004 035 595 A1 | 11/2005 |
| DE | 10 2007 062 265 A1 | 7/2008 |
| DE | 10 2008 006 687 A1 | 7/2008 |
| DE | 102007062265 A1 | 7/2008 |
| DE | 102008006687 A1 | 7/2008 |
| DE | 602 23 102 | 8/2008 |
| EP | 0 851 304 A2 | 7/1998 |
| EP | 851305 B1 | 7/1998 |
| EP | 1 246 014 | 10/2002 |
| EP | 1 251 402 A | 10/2002 |
| EP | 1251402 A | 10/2002 |
| EP | 0 851 305 B1 | 4/2004 |
| EP | 1 426 840 | 6/2004 |
| EP | 1 584 982 | 10/2005 |
| EP | 1 670 041 A1 | 6/2006 |
| EP | 1670041 A1 | 6/2006 |
| JP | 11-102860 | 4/1999 |
| JP | 11-121372 | 4/1999 |
| JP | 2001-284249 A | 10/2001 |
| JP | 2001-284289 | 10/2001 |
| JP | 2002-280286 A | 9/2002 |
| JP | 2002-334835 | 11/2002 |
| JP | 2002334835 | 11/2002 |
| JP | 2005-517292 | 6/2005 |
| JP | 2005-327769 | 11/2005 |
| JP | 2005-327769 A | 11/2005 |
| JP | 2006-007404 | 1/2006 |
| JP | 2006074045 | 3/2006 |
| JP | 2006-114904 | 4/2006 |
| JP | 2006-279028 | 10/2006 |
| JP | 2007-139773 | 6/2007 |
| JP | 2007139773 | 6/2007 |
| JP | 2008-047875 | 2/2008 |
| WO | WO 01/63233 A2 | 8/2001 |
| WO | WO 03/075096 | 9/2003 |
| WO | WO 2004/019128 A2 | 3/2004 |
| WO | WO 2004/019128 A2 | 3/2004 |
| WO | WO 2004/099877 A | 11/2004 |
| WO | WO 2004/099877 A | 11/2004 |
| WO | WO 2005/069055 A2 | 7/2005 |
| WO | WO 2005/069055 A2 | 7/2005 |
| WO | WO 2008/003442 A | 1/2008 |
| WO | WO 2008/034636 A2 | 3/2008 |
| WO | WO 2008/037496 A2 | 4/2008 |
| WO | WO 2008/080537 A1 | 7/2008 |
| WO | WO 2008/080537 A1 | 7/2008 |
| WO | WO 2008/089953 | 7/2008 |
| WO | WO 2008089953 A1 * | 7/2008 |
| WO | WO 2009/026970 A1 | 3/2009 |

OTHER PUBLICATIONS

C. Hildreth, A quadratic programming procedure, Naval Res. Logistics Quart. 4 (1957) 79-85 (Erratum, ibid., p. 361).

D.A. D'Esopo, A convex programming procedure, Naval Res. Logistics Quart. 6 (1959) 33-42.

Dueck et. al., "Threshold Accepting: A General Purpose Optimization Algorithm Appearing superior to Simulated Annealing", *Journal of Comp. Physics*, vol. 9, pp. 161-175, 199.

K. Schittkowski (1981): The nonlinear programming method of Wilson, Han, and Powell with an Augmented Lagrangian Type Line Search Function, Part 1: Convergence analysis, Numerische Mathematik, vol. 38, 83-114.

K. Schittkowski (1981): The nonlinear programming method of Wilson, Han, and Powell with an Augmented Lagrangian Type Line Search Function, Part 2: An efficient implementation with linear least squares subproblems, *Numerische Mathematik*, vol. 38, 115-127.

Mehrotra, S., "On the implementation of primal-dual interior point method", SIAM J. Optim. 2 1992), No. 4, 575-601.

N. Karmarkar, "A new polynomial-time algorithm for linear programming", *Combinatorica* 4 1984), No. 4, 373-395.

Philip Wolfe, "The Simplex Method for Quadratic Programming," *Econometrica*, vol. 27, No. 3, (Jul. 1959), pp. 382-398.

Fiacco, A.V., McCormick, G. P., "Nonlinear Programming: Sequential Unconstrained Minimization Techniques", John Wiley & Sons, 1968, Chapter 3, pp. 39-52.

Generalized Inverses: Theory and Applications, Adi Ben-Israel, et. al. Springer, New York, 2003, p. 27 Definition Penrose-Inverse, p. 36 Theorem 4, p. 37-38 Theorem 5, p. 38 Ex.21.

Herbert Gross, *Handbook of Optical Systems, vol. 1: Fundamentals of Technical Optics*, p. 257.

P.C. Hansen, "Analysis of discrete ill-posed problems by means of the L-curve", SIAM Review, 34, 4, 1992, pp. 561-580.

Nelder, J.A. And Mead, R., "A Simplex Method for Function Minimization", *Computer Journal* 7 (4): 308-313 (Jan. 1965).

http://www.nikonprecision.com/NSR-S620D/pdf/Nikon_SOKUDO_Breakfast2.pdf, bearing the date Jul. 13, 2011.

The English translation of Japanese Office Action for corresponding JP Appl No. 2011-528297, dated Aug. 23, 2011.

Japanese Office Action, with translation thereof, for corresponding JP Appl No. 2012-100417, dated Oct. 22, 2013.

(56) References Cited

OTHER PUBLICATIONS

Korean Office Action, with translation thereof, for corresponding KR App. No. 1020117006816, mailed on Feb. 25, 2012.
Korean Office Action, with translation thereof, for corresponding KR Appl No. 1020117006816, mailed on Aug. 27, 2013.
Japanese Office Action, with translation thereof, for corresponding JP Appl No. 2011-52829, mailed on Aug. 23, 2011.
Chinese Office Action, with translation thereof, for corresponding CN Appl No. 200980137566.6, mailed Jan. 15, 2013.
European Office Action, for corresponding EP Appl No. 09783195.2, mailed Mar. 27, 2012.
International Search Report and Written Opinion for corresponding PCT Appl No. PCT/EP2009/062140, mailed Dec. 4, 2009.
Andrew J. Hazelton et al., "Recent Performance results of Nikon immersion lithography tools", *Proc. of SPIE*, vol. 6924, pp. 69241N-1-69241N-8 (2008).
Jun Ishikawa et al., "New advanced lithography tools with mix-and-match strategy", *Proc. of SPIE*, vol. 5377, pp. 798-805 (2004).
S. Wakamoto et al., "Improved Overlay Control Through Automated High Order Compensation", *Proc. of SPIE*, vol. 6519, pp. 65180J-1-65180J-8 (2007).
Condition Noumber From Wikipedia, http://en.wikipedia.org/wiki/Condition_number, 4 pages (downloaded on Feb. 26, 2014).
Numerical Stability From Wikipedia, http://en.wikipedia.org/wiki/Numerical_stability, 4 pages (downloaded on Feb. 26, 2014).
Preconditioner From Wikipedia, http://en.wi kipedia.org/wiki/Preconditioner, 8 pages (downloaded on Feb. 26, 2014).
Well-Posed Problem From Wikipedia, http://en.wikipedia.org/wiki/Well-posed_problem, 2 pages (downloaded on Feb. 26, 2014).
Korean Office Action, with translation thereof, for KR Application No. 10-2014-7018834, dated Sep. 22, 2014.
Korean Intellectual Property Office's Notice of Preliminary Rejection for Korean Application No. 10-2013-7031547 dated Jul. 20, 2014 (7 pages).
English Translation of Decision of Rejection for Japanese Application No. 2012-100417 by Examiner E. Tanabe dated Sep. 30, 2014 (3 pages).
T. Nakashima et al., "Thermal aberration control in projection lens", *Proc. of SPIE*, vol. 6924, pp. 69241V-1-69241V-9 (2004).

\* cited by examiner

PROJECTION EXPOSURE APPARATUS WITH OPTIMIZED ADJUSTMENT POSSIBILITY

CROSS-REFERENCE TO RELATED APPLICATIONS

This application is a continuation application of U.S. application Ser. No. 13/069,551, filed Mar. 23, 2011, which is a continuation application of International Application No. PCT/EP2009/062140, filed Sep. 18, 2009, which claims priority from German Patent Application No. 10 2008 042 356.4, filed on Sep. 25, 2008, and claims the benefit under 35 U.S.C 119(e) of U.S. Provisional Patent Application No. 61/099,948, filed on Sep. 25, 2008. The complete disclosures of these applications are incorporated into this application by reference.

BACKGROUND

The disclosure relates to a projection apparatus for microlithography.

Furthermore, the disclosure relates to a projection exposure apparatus for microlithography.

Furthermore, the disclosure relates to a method for operating a projection exposure apparatus for microlithography.

Projection exposure apparatuses for microlithography generally include a light source, an illumination system, which processes the light beams emitted by the light source, an object to be projected, generally called a reticle or mask, a projection objective, called objective for short hereinafter, which images an object field onto an image field, and a further object, onto which projection is effected, generally called a wafer. The reticle or at least part of the reticle is situated in the object field and the wafer or at least part of the wafer is situated in the image field. The objective may define an optical axis with respect to which the optical elements associated with the objective are arranged. In general, said optical elements are rotationally symmetrical with respect to said optical axis and the optical axis is a normal to object field and image field. In this case, the design of the objective is called rotationally symmetrical.

If the reticle is situated completely in the region of the object field, and the wafer is exposed without a relative movement of wafer and image field, then the projection exposure apparatus is generally referred to as a wafer stepper. If only part of the reticle is situated in the region of the object field, and the wafer is exposed during a relative movement of wafer and image field, then the projection exposure apparatus is generally referred to as a wafer scanner.

During the exposure of the wafer, the projection exposure apparatus is operated with a predefined geometrical aperture and a setting predefined by the illumination system, for example a fully coherent, partly coherent, especially dipole or quadrupole setting. In this case, the geometrical aperture is understood to mean the quotient of numerical aperture and refractive index of the underlying medium. The geometrical aperture is thus identical to the sine of the half-side aperture angle of the objective. The geometrical aperture is predefined by the illumination system and/or defined by a diaphragm in the objective. Customary image-side geometrical apertures for objectives for microlithography are values of between 0.5 and 0.6, or 0.6 and 0.7, or 0.7 and 0.8, or 0.8 and 0.9, or else above the latter. A setting is generally predefined by optical elements of the illumination system such as e.g. an axicon, a diaphragm or a micromirror array or one or a plurality of changeable DOEs (diffractive optical elements).

During the exposure, from each field point associated with the object field, a maximum light beam trimmed by the aperture stop passes from the object field to the image field. In an ideally manufactured objective, the imaging aberrations of which are determined only by the optical design of the objective, the wavefront defined by said maximum light beam, in the vicinity of the image point associated with the field point, corresponds approximately to a spherical wave with the image point as midpoint. The possible resolution of such an objective is therefore determined by the diffraction orders which still lie within the geometrical aperture. Therefore, objectives of this type are also referred to as diffraction-limited objectives.

If the region between the last optical element of the objective and the wafer is filled with a gas as medium, then the refractive index thereof is generally approximately 1.00 and the geometrical aperture matches the numerical aperture.

If the region between the last optical element of the objective and the wafer is filled with a liquid as medium, then this is referred to as an immersion objective. One possible immersion liquid is water, which has a refractive index of approximately 1.43. The image-side geometrical apertures indicated above thus have to be increased by the factor of 1.43 in order to determine the assigned image-side numerical apertures. This results in image-side numerical apertures for immersion objectives of approximately 0.75 to 0.9 or 0.9 to 1.05 or 1.05 to 1.2 or 1.2 to 1.35 or else above the latter.

The possible resolution R, that can be achieved with such an objective for microlithography is inversely proportional to the numerical aperture NA and proportional to the operating wavelength $\lambda$ of the objective and a process parameter $k_1$:

$$R = k_1 \frac{\lambda}{NA},$$

where $k_1$ is always at least 0.25. The operating wavelength is generally 365 nm, 248 nm, 193 nm or 13 nm. In the case of 13 nm, the objectives are catoptric objectives, that is to say objectives consisting only of mirrors. These catoptric objectives may have an optical axis or not. These catoptric objectives are operated in a vacuum with geometrical—and correspondingly numerical—apertures of 0.2 to 0.25 or 0.25 to 0.3 or 0.3 to 0.4 or 0.4 to 0.45 or above the latter. Further types of objectives for microlithography are dioptric objectives, that is to say objectives consisting only of lenses, and also catadioptric objectives, that is to say objectives consisting of lenses and mirrors.

Diffraction-limited objectives and in particular objectives for microlithography react very sensitively to adjustment faults.

The term adjustment fault generally denotes a fault which arises as a result of an erroneous alignment of the optical elements of the objective with respect to one another or relative to the object and/or image field thereof.

In the context of this application, the term adjustment fault is intended to be interpreted more generally: it is intended also to encompass those faults which result from the materials used during production, assembly and subsequent operation of the objective. Besides the abovementioned erroneous alignments of the optical elements, the faults include variations in the refractive index—for short: index—of optically active materials, undesirable variations in the surface forms of the optical elements associated with the objective, drift in the relative position of optical elements in the mounts thereof, stresses during assembly of the objective with the resulting effects of stress birefringence and polarization-dependent index distributions thereby induced in the optical elements of the objective, and also heating of the objective with the resultant temporally variable, scalar index distributions, accompanied with alteration of the shape, of the optical elements associated with the objective. Finally, the changes in the optical elements of the objective or in the entire objective which arise under changing ambient influences such as ambient air pressure and ambient temperature, specifically ambient temperature of the objective, are also intended to be referred to as adjustment faults.

The individual image aberrations which determine the imaging performance of the objective have to satisfy specifications which ensure a sufficiently good imaging performance. The specifications concerning image aberrations are specified in general, as for example in the case of Zernike coefficients, by upper bounds for the absolute values of the image aberrations. As an alternative to the Zernike coefficients, it is also possible to use other coefficients resulting from function systems other than the Zernike polynomials.

As an alternative, besides the absolute values, use is also made of norms which functionally combine a plurality of image aberrations and which therefore have to satisfy a common specification.

Thus, by way of example, the rms values (root-mean-square) are specified as image aberrations using a, possibly weighted, Euclidean norm. Other norms are specifically coordinated with the design of the imaging optical assembly, in order, by way of example, to weight the field edge of the imaging optical assembly more highly than the field center thereof.

For a selection of field points in the image field of the objective and a given aperture, the wavefronts of the light beams associated with the field points are measured or calculated from measurement variables such as air pressure or temperature, for example, or temporally extrapolated on the basis of a prediction model from already known wavefronts and/or further measurement variables. The measurement of the wavefronts generally takes place interferometrically. The individual wavefronts, more precisely: their deviation from a spherical wave, are respectively expanded into a function system that is generally an orthogonal, in particular an orthonormal system. By way of example the Zernike polynomials form such an orthogonal system. The coefficients of this expansion, also called Zernike coefficients, are then referred to as image aberrations. Further image aberrations such as scale error, telecentricity error, overlay and depth of focus, best focus, and also image aberrations produced by integration of a plurality of field points, such as rms, grouped rms, residual rms, and fading, or other image aberrations, are derived on the basis of, in particular linear, models from the Zernike coefficients. Some of these image aberrations are defined in the context of the description or the figures.

As an alternative, some of these derived image aberrations can also be determined directly by measurements or prediction models. Combinations of measurements and prediction models are also employed. This is possible for example in the case of models of the image aberration prediction which come under the term model-based control. In that case, values such as, for example, air pressure and/or temperature, specifically ambient temperature of the objective, are used as parameters in a model for the image aberration prediction. These parameters are measured and the model is calibrated using the measured values. The image aberrations are subsequently predicted on the basis of the calibrated model. In this case, the parameters can be measured in a temporally periodic fashion. Prediction models for calculating unmeasurable image aberrations can be adjusted with directly measurable image aberrations as parameters for calibration. Predictions by the model and measurements can alternate: a prediction model is calibrated at predefined, preferably temporally equidistant, points in time by measurement of at least a selection of the image aberrations to be determined or other parameters from which the image aberrations to be determined can be determined. The determination of image aberrations is performed using one or a plurality of different prediction models between these points in time. For a more detailed explanation of model-based control, cf. Coleman Brosilow/Babu Joseph, Techniques of Model-Based Control, Prentice Hall International Series in Physical and Chemical Engineering Sciences, USA 2002.

With the increase in the resolution and, necessitated thereby, the reduction in the operating wavelength and/or increase in the numerical aperture, more stringent requirements are made of the imaging performance of the objective and smaller upper bounds are thus implicitly required for individual or plural image aberrations.

Furthermore, it cannot be assumed that a single adjustment in the area of manufacture of an objective will suffice to have the permissible image aberrations thereof in specification when the objective is first put into operation, since such an objective is generally not used at the place where it originates.

Furthermore, it cannot necessarily be assumed that a single adjustment of the objective will suffice to keep the latter in specification with regard to its permissible image aberrations over the lifetime of the objective.

Furthermore, it cannot necessarily be assumed that these specifications will be complied with during operation of the projection exposure apparatus. They can be violated even as early as during the transition from the exposure from one die to the subsequent die, or they can be violated even during the exposure of an individual die.

Thus, during operation of the projection exposure apparatus with light having the operating wavelength, alterations arise in the optical elements associated with the objective of the projection exposure apparatus, which alterations lead to, in part irreversible, changes in the optical properties of the objective. Compaction, rarefaction and chemically governed alterations of possible coatings of the optical elements shall be mentioned here by way of example. Further, irreversible alterations are produced by drifts of optical elements in the mounts thereof, said drifts being established with increasing time. Other alterations are reversible in their nature, such as e.g. lens heating with the alteration of form implied thereby and with the alteration of the distribution of the refractive index of the lens. These lead to time-dependent alterations of the optical properties of the objective.

Therefore, objectives for microlithography have been supplemented in the course of their development by an increasing number of manipulation possibilities. The latter can be used to counteract the changes in the optical properties of the objective in a controlled manner. Use is made of manipulators which shift, rotate, exchange, deform, heat or cool one or a plurality of optical elements associated with the objective, such as lenses, mirrors or diffractive optical elements. In particular, aspherized plane plates are provided as exchange elements in the objective. Exchange elements can also be optical elements of an objective which are provided with manipulators. These elements are preferably some of the first and last optical elements of the objective as seen in the direction of light propagation, or some of the optical elements situated in the vicinity of an intermediate image of the objective, or some of the optical elements situated in the vicinity of a pupil plane of the objective. The term vicinity is defined here with the aid of the so-called paraxial subaperture ratio. In this respect, cf. WO2008034636A2, for example; in particular pages 41 and 42 therein, which contain the definition of the subaperture ratio, shall be incorporated within their full scope in this application. An optical element is referred to as in vicinity of a pupil plane or near a pupil plane if the absolute value of its paraxial subaperture ratio is close to 1; by way of example, all optical elements which have a paraxial subaperture ratio of greater than 0.8 should be referred to as near the pupil. Correspondingly, all optical elements which have a paraxial subaperture ratio with an absolute value of less than 0.2 should be referred to as near the field or near an (intermediate) image or equivalently in vicinity of an (intermediate) image plane. The term (intermediate) image is equivalently named as field. Thus, by way of example, WO2008037496A2 discloses an objective for microlithography containing an optical element to which a multiplicity of forces and/or torques are applied by a manipulator, such that said optical element attains a local variability with regard to its form.

Thus, by way of example, WO2008034636A2 or WO2009026970A1 discloses a plane plate in an objective for microlithography. Conductor tracks to which current can be applied are situated in or on said plane plate. In the case of the change in temperature caused as a result, the refractive index of the plane plate can be influenced locally, such that the plane plate has a local variability with regard to its refractive index.

Thus, by way of example, EP851305B1 discloses a pair of plane plates, so-called Alvarez plates, in an objective for microlithography. This pair of Alvarez plates has an asphere in each case on the mutually facing surfaces of the plates, said aspheres compensating for one another in terms of their optical effect in a predetermined relative positioning of the plates with respect to one another. If one or both of the plates is or are moved perpendicularly to the optical axis of the objective, then the optical effect of these Alvarez plates is established.

Thus, for example, EP1670041A1 discloses an apparatus which serves for the compensation of image aberrations that are introduced into the objective for microlithography specifically as a result of the absorption of dipole illumination. An optical element situated in a pupil plane of the objective experiences non-rotationally symmetrical heating in the case of dipole illumination. The optical element has applied to it additional light from a second light source, which emits light preferably having a different wavelength than the operating wavelength, at least approximately complementarily to said heating. Undesired image aberrations are thereby compensated for or at least reduced.

Manipulators that deform an optical element are distinguished by their particularly rapid response behavior. A general introduction to rapidly responding manipulators from the field of telescope technology is given in R. K. Tyson: Principles of Adaptive Optics, Academic Press, Inc., ISBN 0.12.705900-8.

Every manipulator has a certain number of degrees of freedom. This number of degrees of freedom can vary very greatly. Thus, by way of example, a manipulator which displaces a lens in a predefined direction has precisely one degree of freedom. By contrast, a manipulator which includes electrical conductor tracks which apply heat to a lens has degrees of freedom in a manner corresponding to the number of conductor tracks to which voltage can differently be applied.

In the context of this application, the term adjustment is understood to mean not just the alteration of the spatial arrangement of the optical elements of the objective with respect to one another, but any manipulation of the objective using the manipulators listed above.

In addition to the statements made above, the term adjustment is understood below to mean three subforms:
the initial adjustment during the assembly of the objective,
the repair adjustment, requiring an interruption in the operation of the projection exposure apparatus, and
the fine adjustment during the operation of the projection exposure apparatus.

The adjustment which is necessary, under certain circumstances, before the first use of the projection exposure apparatus at the site of use is intended likewise to come under the term of repair adjustment.

The fine adjustment takes place, inter alia, for the correction of image aberrations which arise on account of the heating of the objective. In the case of the fine adjustment, adjustment in real time is also an expression employed.

The following time periods for carrying out the fine adjustment, that is to say for determining the image aberrations, calculating the movement distances of the manipulators—this calculation referred to hereinafter as "solving the inverse problem"—and moving the manipulators, are understood depending on intended use, throughput and type of the objective and the available manipulators thereof: up to 30000 ms (milliseconds), or up to 15000 ms (long-time behavior), or up to 5000 ms, or up to 1000 ms, or up to 200 ms, or up to 20 ms, or up to 5 ms or up to 1 ms (short-time behavior).

The fine adjustment is subdivided in particular into the three subsections
determining the image aberrations
solving the inverse problem
moving the manipulators For these three subsections, the following time periods for carrying them out are estimated relative to one another: determining the image aberrations and solving the inverse problem relative to moving the manipulators 50% to 50% and determining the image aberrations relative to solving the inverse problem 60% to 40%. Therefore, up to 6000 ms, or up to 3000 ms, or up to 1000 ms, or up to 200 ms, or up to 40 ms, or up to 4 ms, or up to 1 ms, or up to 0.2 ms, are generally available for solving the inverse problem during the fine adjustment.

SUMMARY

The present disclosure is concerned with the problem area of the need to rapidly solve the inverse problem, and thus primarily the problem of the fine adjustment. However, it can also be used for either of the other two subforms: initial adjustment or repair adjustment.

The task of the adjustment, in particular the fine adjustment, consists, in the event of an overshooting of at least one of the upper bounds by at least one of the specified image aberrations, in driving the manipulators in such a way that said bound is undershot again.

Two alternatives can occur in this case:
1. Independently of an overshooting of upper bounds, fine adjustments are performed recurrently with a certain time cyclicity. In this case, the time cycle can be oriented to the above time cycles: 30 000 ms, or 15 000 ms (long-time behavior), or 5000 ms, or 1000 ms, or 200 ms, or 20 ms, or 5 ms or 1 ms. For this purpose, the above-mentioned time cycle is predefined by a timer.
2. When one of the upper bounds is exceeded, it can happen that the manipulators cannot be driven in such a way that the overshot upper bound is undershot again. In this case, the upper bound can be relaxed in order to guarantee a solution. In this case, all the upper bounds are preferably relaxed using a proportionality factor.

The expression "the upper bound" should be interpreted purely mathematically here. An individual upper bound can be one for an individual image aberration. However, said upper bound does not have to correspond to the specification of a maximum permissible image aberration up to which the objective is in specification. By way of example, upper bounds are to be chosen such that throughout the operation of the projection exposure apparatus, no image aberration is overshot with regard to its specification. This necessarily means that the manipulators have to be used in a temporally timely fashion, such that an overshooting of the specifications is prevented. This can be achieved by fixing the upper bounds as smaller than the specifications: for example 10%, 20% or even 50%. Besides the absolute value of an image aberration, the upper bounds can also include the absolute value of its gradient, that is to say the absolute value of the first derivative with respect to time, or a combination, for example summation or maximum formation, of both values. The upper bounds can in turn depend on the field point under consideration, for example a structure that is particularly difficult to image on the reticle.

Furthermore, the manipulators have a varying response behavior, which likewise has the consequence that upper bounds for image aberrations which can be set using manipulators that act relatively slowly or act sluggishly are fixed as smaller than those which can be set using relatively fast manipulators. The term relativity should not be interpreted as a quantitative measure here but rather serves only for distinguishing the manipulators used in the objective from one another. By way of example, manipulators which alter the position of an optical element have a faster response behavior than those which apply heat to an optical element. Further examples are manipulators which alter the form of an optical element: they lie in the class of relatively fast manipulators, and manipulators which act by exchanging optical elements, such as aspherized plane plates, for example. The latter lie in the class of relatively slow manipulators. This has the consequence that the control intervals are to be adapted to this response behavior of the manipulators.

It should furthermore be ensured that the control intervals for each individual manipulator are designed in such a way that the latter, in each of its degrees of freedom, can actually attain the maximum moving range provided for this degree of freedom before the next control interval begins. No manipulator is permitted still to be effecting movement at the end of a control interval. Movement should be understood in the literal sense in the case of a manipulator which alters the position of an optical element. In the case of a manipulator which deforms an optical element, the optical element must assume a fixed form upon the regulation interval being attained. A manipulator which applies heat or cold to an optical element has to ensure in its rest state that the heat and/or cold feed is designed in such a way that the form of the optical element and—in the case of a transmissive optical element—the distribution of the refractive index in the optical element are in a—from a temporal standpoint—static state.

A further problem that has to be solved is that, in the case of a setting change, a change of reticles for the new beginning of a batch, the new manipulator setting has to be altered virtually discontinuously. That is to say that the manipulators have to be moved within an extremely short time from their present positions into new positions, which may be relatively far away from the present positions. This problem arises particularly in the case of the relatively sluggish manipulators mentioned above.

The disclosure features techniques to determine the movements of the manipulators on the basis of available image aberration data from measurements or prediction models, such that the image aberrations satisfy a predefined specification after the movement of the manipulators. In the context of the fine adjustment, in particular, these movements are intended to be determinable in real time. In this case, determination in real time should be understood to mean the guaranteed determination within a maximum time duration predefined a priori in each case, in particular 30000 ms, or 15000 ms, or 5000 ms, or 1000 ms, or 200 ms, or 20 ms, or 5 ms or 1 ms.

For the control of the manipulators, in general an inverse problem has to be solved numerically in order to determine the individual movements of the manipulators. This is owing to the fact that in general an image aberration b to be adjusted is predefined. Furthermore, the effects $a_i$ of the manipulators for standard movements $x_{i0}$ are known. These effects are also defined as sensitivities of the individual manipulators. A distinction is made between static, scan-integrated and fading sensitivities, which are defined in the context of the description of the figures. The movements $x_i$ of the manipulators which together adjust the image aberration b are sought. That is to say that the problem $\Sigma_i a_i x_i = b$ has to be resolved according to the manipulator actuating distances $x_i$ if a solution exists.

An image aberration distribution comprising a plurality of image aberrations $b_j$, j=1, . . . , n, which are intended to be optimized simultaneously is generally present. In this case b is a vector $(b_j)$ and the sensitivities $a_j$ form a matrix $(a_{ij})$.

The control of one or a plurality of manipulators is understood to mean the following:
 (I) the determination of the image aberrations to be corrected, that is to say of the right side b,
 (II) the determination of the movements $x_i$ of the manipulator or manipulators, that is to say the inversion of the above matrix $(a_{ij})$, and
 (III) the performance of the resulting movements of the manipulators themselves.

This present disclosure primarily addresses the above problem (II).

Known techniques for solving inverse problems as in (II) includes the Gaussian algorithm, the Moore-Penrose inverse, cf. for example: Generalized Inverses: Theory and Applications, Adi Ben-Israel, et. al. Springer, New York, 2003, or Andreas Rieder, Keine Probleme mit Inversen Problemen [No problems with inverse problems], Vieweg, 2003, Definition 2.1.5, p. 22, or Angelika Bunse-Gerstner, Wolfgang Bunse, Numerische Lineare Algebra [Numerical linear algebra], Teubner Studienbücher, 1985, Definition 1.5, 1, p. 17, principle 1.5.6, p. 20, section "Singulärwertzerlegung and Pseudoinverse" ["Singular value decomposition and pseudo-inverses"], pp. 27-28, and iterative methods for inverting matrices.

What is numerically problematic is the ill-conditioning of the inverse problem to be solved, said ill-conditioning resulting from the combination of a high number of degrees of freedom of the manipulators in conjunction with partly similar optical effects of individual degrees of freedom from among said degrees of freedom.

As the number of said degrees of freedom increases, where said degrees of freedom should not be considered individually for each manipulator of the objective, but rather interact, the ill-conditioning of the inverse problem becomes increasingly worse and the task of regularization arises.

Regularization methods include explicit regularizations such as the Tikhonov regularization, cf. Rieder, A., "Keine Probleme mit inversen Problemen", Vieweg, 2003, the weights of which are preferably adapted after each, every second or after some other predefined number of iteration steps. In the case of the Tikhonov regularization, the computational time for solving the inverse problem rises in relation to the non-regularized problem and, depending on the manipulator system used, can last up to a number of minutes. This is acceptable for the initial adjustment and repair adjustment, but unacceptable for the fine adjustment during operation of the objective. Under certain circumstances, computational times for solving the inverse problem and hence controllabilities for the manipulator system in the sub-seconds range in real time are expected here, that is to say that a solution to the inverse problem has to be guaranteed in the sub-seconds range. In addition, the weights in the Tikhonov regularization only indirectly affect the manipulator movements and, in particular, the maximum possible movements of the manipulators used are not fully utilized.

Further methods for solving the inverse problem consist in the implicit regularization by suitable linear programming, quadratic programming or combinations of the two. Cf. e.g. Rieder, A., "Keine Probleme mit inversen Problemen", Vieweg, 2003, in particular example 3.3.11, pp. 70-71, example 3.5.3, p. 80, chapter 4 "Tikhonov-Phillips Regularisierung" ["Tikhonov-Phillips regularization"], pp. 93-105, in particular FIGS. 4.1 and 4.2 (pp. 102, 103), which shall hereby be incorporated within their full scope in this application.

Finally, mention shall be made of nonlinear optimization strategies such as the minimax optimization in US20050231700, which shall hereby be incorporated within its full scope in this application.

With increasing requirements made of the throughput in chipmaking for the operator of the projection exposure apparatus, in the future, the time period that can be provided for solving the inverse problem will decrease further. An excessively long time period would generally lead to a sustained overshooting of one of the upper bounds by the image aberrations associated therewith. In such a case, the operation of the projection exposure apparatus would have to be stopped, or the throughput would have to be reduced, or rejects would have to be expected. In general, it is expedient to divide the entire adjustment time of the fine adjustment into 50% for determining the image aberrations and solving the inverse problem, this in turn being divided approximately 60% to 40%, and 50% for moving the manipulators. Sluggish manipulators, for example those which apply heat and/or cold to an optical element, or those which exchange an optical element, for example a plane plate, are dealt with separately in the further embodiments. Thus, only 20% of the total adjustment time is available for solving the inverse problem. In absolute values, there is available for this generally only up to 40 ms, or up to 4 ms, or up to 1 ms, or up to 0.2 ms.

At the same time, additional specifications that are not defined by the image aberrations but rather result from the manipulator system used demand, as the number of manipulators and degrees of freedom thereof increases, further numerous boundary conditions that have to be met by the solution to the inverse problem. Thus, by way of example, the above-mentioned displacement of a lens has a maximum movement in the same way as the above-mentioned electrical conductor tracks have a maximum power consumption. Specifications for manipulators can be maximum or minimum manipulation movements, manipulation speeds, manipulation accelerations Summation, in particular summation of squares or maximum and/or minimum formation or mean value formation from manipulation movements, manipulation speeds, manipulation accelerations, are likewise used. These boundary conditions, or synonymously also called ranges or movement ranges, are ever more restrictive as the number of degrees of freedom of the manipulators increases. This has the consequence that simple regularization techniques, such as the Tikhonov regularization, for example, can be employed only to a restricted extent.

The disclosure features techniques that comply with specifications with regard to the maximum permissible image aberrations, but also formulate specifications regarding and comply with the maximum permitted ranges of the manipulators.

Each degree of freedom of a manipulator can be interpreted mathematically as a one-dimensional space of image aberrations. In the case of a theoretical, arbitrary movements of the manipulators with a total of n degrees of freedom, this results in an n-dimensional space of the image aberration combinations that can be set by the manipulators. The restriction of these degrees of freedom to the respective ranges governed by the design or by the structural space results in an n-dimensional polyhedron of possible movement distances for the manipulators, referred to hereinafter as adjustment polyhedron. By way of example, one edge of the polyhedron may correspond to an interval from a minimum possible current flow up to a maximum possible current flow. The minimum current flow can be zero in this case. Alternatively, one edge of the polyhedron may correspond, by way of example, to an interval from a structural space-governed minimum spatial movement distance up to a structural space-governed maximum spatial movement distance of an optical element. In this case, the minimum movement distance can be negative.

Finally, it is increasingly necessary to answer the question regarding the quality of a single solution to the inverse problem if this solution is not unambiguous. Quality is intended to be understood here as a general term for a series of criteria, such as:

the single solution is a solution from a plurality of possible solutions which result in different control possibilities for the manipulators, some of which are preferred. Preference can be given for example to driving the fewest possible manipulators. Another preference would be to minimize as far as possible the maximum movements of the manipulators to be driven, in order that the adjustment can be realized as rapidly as possible. In this case, the maximum movement can be understood both spatially and temporally, the single solution is a solution from a plurality of possible solutions which result, after the driving of the manipulators, in an image aberration distribution which has a better performance of the lithography apparatus than the image aberration distributions induced by the other possible solutions, then such a solution is preferred.

the single solution is one solution from a plurality of solutions which is dependent stably on the image aberrations, that is to say that if it can be assumed that a real manipulator movement which will always deviate a little from the calculated manipulator movement, depending on the setting accuracy of the manipulator, will attain a real image aberration level comparable to the calculated image aberration level, then such a solution is preferred.

the single is one solution from a plurality of solutions which moves manipulators in directions which correspond to directions of movements which would correct an image aberration level forecast in the long term, that is to say that if there is variation with the movements of the manipulators in an expected direction, then such a solution is preferred.

Ultimately, the solubility of the inverse problem should also be ensured, in principle, which results in the requirement for the choice of suitable upper bounds for the image aberrations.

The objective together with its manipulators, the controls thereof, possible sensor, memory and/or regulation technology for the manipulator system, together with possible measurement technology for the image aberrations of the objective, are referred to hereinafter as projection apparatus.

The requirements underlying the statement of the problem addressed by the present disclosure are ensured using a projection apparatus for microlithography, a projection exposure apparatus for microlithography, and a method for operating a projection exposure apparatus for microlithography according to the following formulations.

These formulations describe embodiments of the disclosure and are numbered for the sake of clarity.

1. A projection apparatus for microlithography comprising
    an objective for imaging an object field,
    at least one or a plurality of manipulators for manipulating at least one or a plurality of optical elements of the objective,
    a control unit for controlling the at least one or the plurality of manipulators,
    a determining device for determining at least one image aberration of the objective,
    a memory containing upper bounds for one or a plurality of specifications of the objective, including upper bounds for the at least one image aberration and/or the movements for the at least one or the plurality of manipulators,
    characterized in that
    when determining an overshooting of one of the upper bounds by one of the image aberrations and/or an overshooting of one of the upper bounds by one of the manipulator movements,
    by control of the at least one or of the plurality of manipulators
    within at most 30000 ms, or 10000 ms, or 5000 ms, or 1000 ms, or 200 ms, or ms, or 5 ms, or 1 ms,
    an undershooting of the upper bounds can be effected.

2. A projection apparatus for microlithography comprising
    an objective for imaging an object field,
    at least one or a plurality of manipulators for manipulating at least one or a plurality of optical elements of the objective,
    a control unit for controlling the at least one or the plurality of manipulators,
    characterized in that
    the control unit
    contains a first device for determining a movement of the at least one or the plurality of manipulators by solving an inverse problem,
    in particular contains a second device for the numerical stabilization of the inverse problem,
    the numerical stabilization is, in particular, an SVD stabilization and/or a Tikhonov stabilization with weight $\gamma$, in particular an L-curve method, and/or a cg stabilization and/or a preconditioning.

3. A projection apparatus for microlithography comprising
    an objective for imaging an object field,
    at least one or a plurality of manipulators for manipulating at least one or a plurality of optical elements of the objective,
    a control unit for controlling the at least one or the plurality of manipulators,
    a memory containing upper bounds for one or a plurality of specifications of the objective, including upper bounds for the at least one image aberration and/or the movements for the at least one or the plurality of manipulators,
    characterized in that
    the control unit
    contains a third device for converting the inverse problem into a minimization problem,
    contains a fourth device for converting the upper bounds into boundary conditions for the minimization problem,
    contains a fifth device for solving the minimization problem, in particular by means of linear programming, in particular the Simplex method, and/or quadratic programming and/or a quasi-Newton method and/or a cg method and/or an interior point method and/or an active sets method and/or simulated annealing and/or sequential quadratic programming and/or a genetic algorithm and/or a ruin and recreate method or by means of toggling two or a finite set of the above methods.

4. The projection apparatus according to formulation 2 and formulation 3 or according to formulation 1 and formulation 2 or according to formulation 1 and formulation 3.

5. The projection apparatus according to formulation 1 or formulation 1 and formulation 4,
    characterized in that
    the image aberrations can be determined by the determining device at more than one, preferably more than 9, very preferably more than 29, extremely preferably more than 80 pairwise different field points of the image field, which are preferably arranged in rectangular grids, or rhomboidal grids, or spoke-shaped grids.

6. The projection apparatus according to any of the preceding formulations,
    characterized in that
    it contains at least three manipulators for manipulating at least three optical elements, wherein at least one of the optical elements is near a pupil, one is near a field and one is neither near a field nor near a pupil.

7. The projection apparatus according to any of the preceding formulations,
    characterized in that
    the control unit can effect a control of the at least one or of the plurality of manipulators in at most 15000 ms, or at most 5000 ms, or at most 2000 ms, or at most 500 ms, or at most 100 ms, or at most 10 ms, or at most 2 ms or 0.5 ms.

8. The projection apparatus according to any of the preceding formulations,
    characterized in that
    the projection apparatus includes a plurality of manipulators, in particular includes a first class and a second class of manipulators, and the controllability of the first class of manipulators can be effected more rapidly by a factor of greater than 1, or greater than 2, or greater than 5, or greater than 10, or greater than 100, or greater than 1000, than the controllability of the second class of manipulators.

9. The projection apparatus according to formulation 8,
    characterized in that
    the second class of manipulators can be provided with a restriction of preferably 80%, or 50%, or 20%, or 10%, or 1%, of their maximum possible movement distance governed by their design or by the structural space within the objective.

10. The projection apparatus according to formulation 1 or formulation 1 and any of formulations 4 to 9, characterized in that
it is possible to afford tolerance for a selection of the specifications of image aberrations with an overshooting by 50%, or 20%, or 15%, or 10%, or 5%, or 2%, or 1%, for a short time period of 60000 ms, or 20000 ms, or 10000 ms, or 5000 ms, or 1000 ms, or 200 ms, or 20 ms, in particular with an overshooting by 50% for a time period of 60000 ms, or 20% for a time period of 20000 ms, or 15% for a time period of 10000 ms, or 10% for a time period of 5000 ms, or 5% for a time period of 1000 ms, or 2% for a time period of 200 ms, or 1% for a time period of 20 ms.

11. The projection apparatus according to any of the preceding formulations, characterized in that
the at least one or the plurality of manipulators can reach their respective rest positions after their respective maximum possible movement distance within 15000 ms, or 5000 ms, or 2000 ms, or 500 ms, or 100 ms, or 10 ms, or 2 ms, or 0.5 ms.

12. The projection apparatus according to formulation 1 or formulation 1 and any of formulations 4 to 11, characterized in that
the determination can be effected by measurement, in particular interferometric measurement, and/or temporal extrapolation and/or spatial extrapolation and/or spatial interpolation and/or simulation.

13. The projection apparatus according to any of the preceding formulations, characterized in that
the at least one or the plurality of manipulators can displace and/or tilt and/or rotate the optical element and/or replace the latter by at least one exchange element and/or deform the optical element and/or apply heat and/or cold to the optical element.

14. The projection apparatus according to formulation 13, characterized in that
the exchange element is a, preferably aspherized, plane plate, or a pair of plates, in particular Alvarez plates, or a filter, or a diaphragm.

15. The projection apparatus according to formulation 13, characterized in that
the at least one or the plurality of manipulators can apply to the optical element additional light having a wavelength which is preferably a different wavelength than the operating wavelength, and/or this application of additional light can preferably be performed in a region which is a partial region of the region to which light having the operating wavelength is complementarily applied.

16. The projection apparatus according to any of formulations 13 to 15, characterized in that
the at least one optical element is the first or last optical element in the light direction, or is situated in the vicinity of an intermediate image of the objective, or is situated in the vicinity of a pupil plane of the objective.

17. The projection apparatus according to any of the preceding formulations, characterized in that
the total number of degrees of freedom of the at least one or the plurality of manipulators is more than 10, or more than 20 or more than 50 or more than 100 or more than 200 or more than 500 or more than 1000.

18. The projection apparatus according to formulation 1 or formulation 1 and any of formulations 4 to 17, characterized in that
the at least one image aberration comprises scan-integrated variables, the summands of which are provided with a density function.

19. The projection apparatus according to formulation 18, characterized in that
the density function is a ramp function or a Gaussian function or a function similar to a Gaussian function or a ramp function.

20. The projection apparatus according to formulation 1 or formulation 1 and any of formulations 4 to 19, characterized in that
the specifications comprise maximum and/or minimum manipulation movements and/or
manipulation speeds and/or
manipulation accelerations and/or
a summation, in particular summation of squares, or a maximum formation, or minimum formation or mean value formation from these.

21. The projection apparatus according to any of the preceding formulations, characterized in that
the at least one manipulator can deform the at least one optical element or the plurality of manipulators can deform the plurality of optical elements and the specifications comprise maximum and/or minimum torques for this manipulator or for these manipulators.

22. The projection apparatus according to formulation 13, characterized in that
the at least one or the plurality of manipulators can apply heat and/or cold to the at least one or the plurality of optical elements and the specifications comprise maximum and/or minimum power consumptions and/or power gradients for this manipulator or these manipulators.

23. The projection apparatus according to formulation 22, characterized in that
the application of heat can be effected by infrared light or by a Peltier element.

24. The projection apparatus according to formulation 22 or 23, characterized in that
the application of cold can be effected by a Peltier element.

25. The projection apparatus according to formulation 1 or formulation 1 and any of formulations 4 to 24, characterized in that
the at least one image aberration is scale error and/or depth of focus and/or telecentricity error and/or best focus and/or fading and/or overlay error and/or depth of focus and/or rms and/or grouped rms and/or residual rms and/or an individual Zernike coefficient.

26. The projection apparatus according to formulation 2 or formulation 2 and any of formulations 4 to 25, characterized in that
the numerical stabilization is a Tikhonov stabilization and the second device carries out the latter iteratively, wherein the weight $\gamma$ or the weight matrix $\Gamma$ associated with the Tikhonov stabilization is adapted upon each or every second or after a predefined finite number of iteration steps.

27. The projection apparatus according to formulation 1 or formulation 1 and any of formulations 4 to 26, characterized in that
by means of the control unit and/or the memory, one or a plurality of specifications and/or a merit function are held in variable fashion by means of Gembicki variables, in particular by means of multivariable specs.

28. The projection apparatus according to formulation 2 or formulation 2 and any of formulations 4 to 27, characterized in that
the control unit uses a direct or iterative method for solving the inverse problem.

29. The projection apparatus according to formulation 2 or formulation 2 and any of formulations 4 to 27, characterized in that
the first device, for solving the inverse problem, uses the Gauss method or a Moore-Penrose inverse.

30. The projection apparatus according to formulation 28, characterized in that
the iterative method is terminated on the basis of an a priori error estimation or an a posteriori error estimation or after a predefined number of maximum iterations or after a finite, predefined time interval.

31. The projection apparatus according to formulation 2 or formulation 2 and any of formulations 4 to 30, characterized in that
the control unit contains a sixth device, which as preference prefers the driving of the fewest possible manipulators or prefers the minimization of the maximum movement of the manipulators or prefers the stablest solution or prefers the solution which best corresponds to a forecast development of the image aberration distribution in case of the inverse problem has more than one solution.

32. The projection apparatus according to formulation 1 or formulation 1 and any of formulations 4 to 31, characterized in that
the determination contains an alternating sequence of calculations from a prediction model and measured value determinations.

33. The projection apparatus according to formulation 32, characterized in that
the prediction model is based on model-based control, wherein air pressure and/or temperature, in particular the external temperature of the objective, are measured and used as parameters in the underlying model.

34. A projection apparatus for microlithography comprising
one or a plurality of manipulators having a total of more than n=5, or more than n=10, or more than n=20, or more than n=50, or more than n=100, or more than n=500, or more than n=1000, degrees of freedom,
a control unit for controlling or regulating the manipulator or manipulators,
characterized in that
the control unit ensures control of the manipulator or manipulators in real time, in particular 15000 ms, or 5000 ms, or 1000 ms, or 200 ms, or 20 ms, or 5 ms, or 1 ms.

35. A projection exposure apparatus for microlithography, characterized in that
it comprises a projection apparatus according to any of the preceding formulations.

36. A method for operating a projection exposure apparatus for microlithography with a projection apparatus according to any of the preceding formulations, said projection apparatus comprising the projection exposure apparatus.

37. The method according to formulation 36, characterized in that
the regulation or control of the manipulators takes place from reticle to reticle, or from batch to batch, or from wafer to wafer, or from die to die, or during the exposure of an individual die, or during the initial adjustment or during a repair adjustment.

38. The method according to formulation 36 or 37, characterized in that
the regulation or control is effected in equidistant time intervals of at most 30 000 ms, or 10000 ms, or 5000 ms, or 1000 ms, or 200 ms, or 20 ms, or 5 ms, or 1 ms.

39. A method for operating a projection apparatus for microlithography with a projection apparatus according to formulation 13 or any of formulations 22 to 24, characterized in that
heat and cold are applied to the at least one or the plurality of optical elements and these applications contain a sequence of temporally alternating applications of heat and cold.

40. A method operating a projection exposure apparatus for microlithography with a projection apparatus as claimed in any of the formulations 1 to 35
characterized in that
the control unit controls the manipulator or manipulators in real time, in particular 15000 ms, or 5000 ms, or 1000 ms, or 200 ms, or 20 ms, or 5 ms, or 1 ms.

BRIEF DESCRIPTION OF THE DRAWINGS

The disclosure is explained below on the basis of the exemplary embodiments illustrated in the figures, in which.

DETAILED DESCRIPTION

Figure 1:
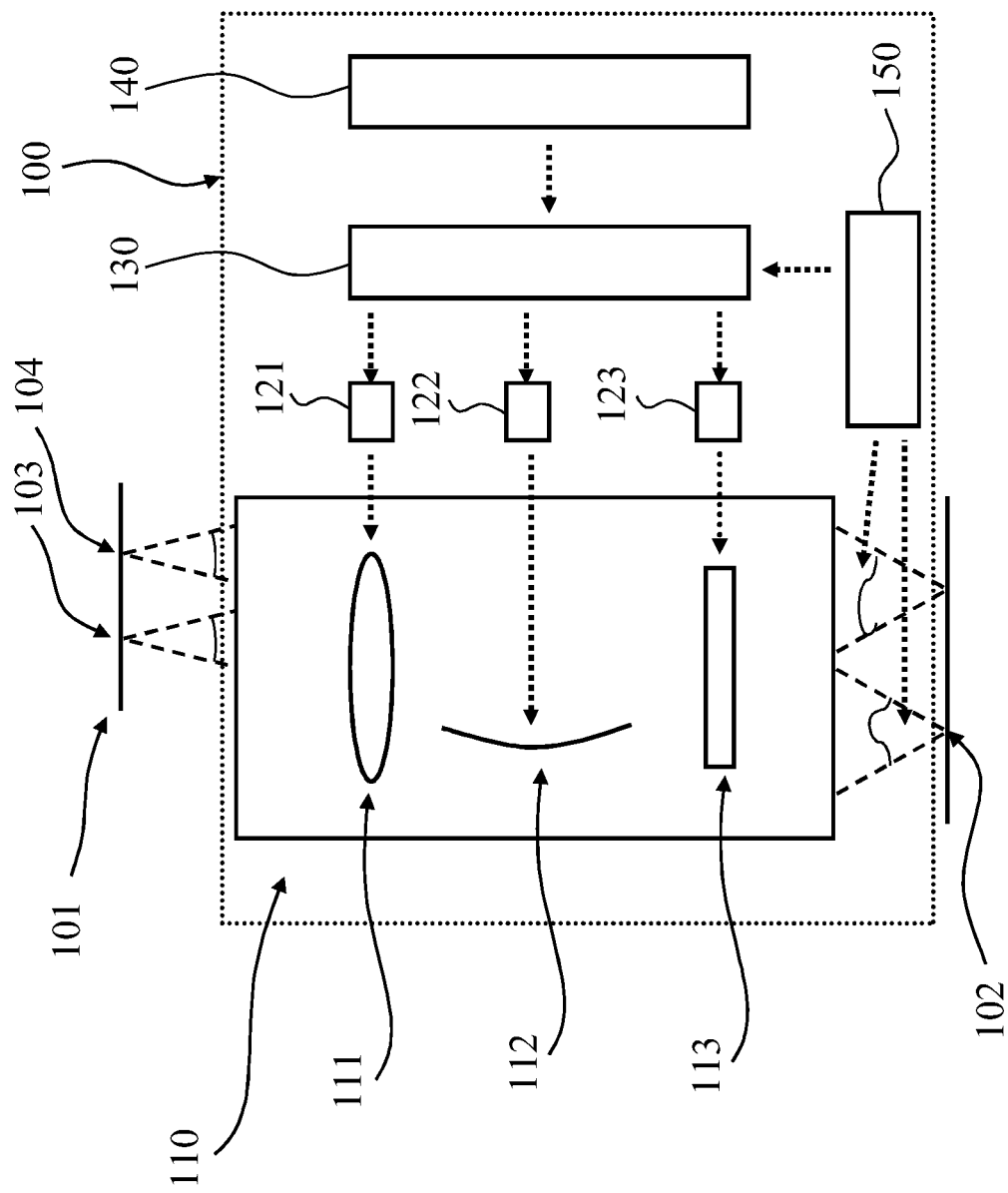
FIG. 1: shows a basic schematic diagram of a projection apparatus for microlithography with objective, determining unit, control unit, memory and manipulator system

FIG. 1 shows an exemplary embodiment of a projection apparatus 100 for microlithography for imaging an object field 101 onto an image field 102. The projection apparatus 100 contains a projection objective 110, referred to as objective hereinafter. Two field points 103 and 104 situated in the object field 101 are illustrated by way of example, said field points 103 and 104 being imaged into the image field 102 by the objective 110.

The objective 110 contains optical elements such as lenses 111, mirror 112 and a plane plate 113. A manipulator 121 acts on one of the lenses, which manipulator can displace, bend, heat and/or cool the lens. A second manipulator 122 acts on the mirror 112 in the same way or in a different way than manipulator 121, and a third manipulator 123 serves for exchanging the plane plate 113 for a further plane plate (not illustrated here), which is aspherized.

Given a predefined aperture, maximum light beams delimited by the aperture emerge from the two field points 103 and 104. The outermost rays of said light beams are illustrated here as interrupted lines. These outermost rays delimit the wavefronts respectively associated with the field points 103 and 104. For illustration purposes, said wavefronts are assumed to be spherical. A wavefront sensor and/or further sensors and/or a prediction model forms a determining unit 150, which supplies information about image aberrations on the basis of the measurement of the wavefronts after the passage thereof through the objective 110. Said further sensors are, for example, air pressure sensors, sensors for measuring the temperature inside of the objective 110 or sensors which measure the temperature on lenses such as lens 111 or on the rear side of mirrors such as mirror 112.

The manipulators 121,122,123 are controlled by a control unit 130. The control unit can also be embodied as a regulating unit.

The control unit 130 obtains upper bounds for image aberrations and manipulator ranges in the form of specifications from a memory 140 and also information about the measured image aberrations or wavefronts from the determining unit 150.

The control unit 130 contains an adjustment algorithm, which, upon determination of an overshooting of one of the upper bounds by one of the image aberrations at one of the field points by regulation and associated manipulation of the one or of the plurality of optical elements 111,112,113 within 30000 ms, or 10000 ms, or 5000 ms, or 1000 ms, or 200 ms, or 20 ms, or 5 ms, or 1 ms, effects an undershooting of the upper bounds for the one or the plurality of specifications. The different time intervals above result from the different applications of adjustment to the projection exposure apparatus. In particular, the time periods 30000 ms, or 10000 ms, or 5000 ms, or 1000 ms, are advantageous for the initial adjustment. The time periods 30000 ms, or 10000 ms, or 5000 ms, or 1000 ms, or 200 ms, or 20 ms, are advantageous for the repair adjustment. Finally, the time periods 200 ms, or 20 ms, or 5 ms, or 1 ms, are advantageous for the fine adjustment.

Figure 2:
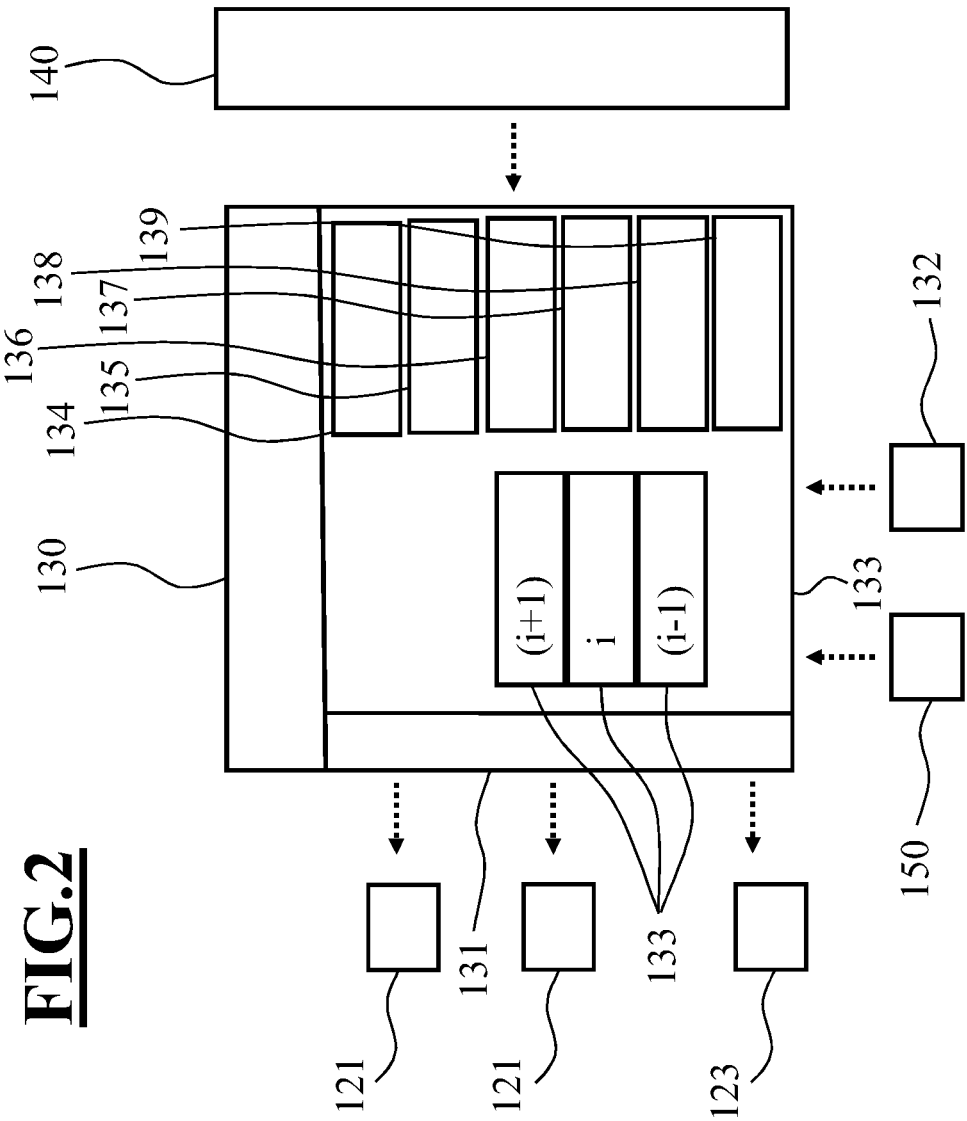
FIG. 2: shows a basic schematic diagram of a control unit for the fine adjustment

FIG. 2 shows the control unit 130 in the case of the fine adjustment. In this case, said control unit comprises a manipulator supervision unit 131, which forms the interface to the manipulators 121, 122, 123, and which is connected to a computing unit 133, containing one or a plurality of processors 133i. A timer 132 predefines the abovementioned cycle times of 200 ms, or 20 ms, or 5 ms, or 1 ms, or other suitable intervals in which the computing unit 133 determines the movements of the individual manipulators 121, 122, 123 on the basis of the incoming information about the image aberrations or wavefronts, supplied by the determining unit 150, and the manipulator specifications from the memory 140. The computing unit 133 includes a first device 134, which determines the manipulator movements $x_i$ as a solution to an inverse problem $Ax=b$ where $x=(x_i)$, optionally a second device 135 for the numerical stabilization of the inverse problem, optionally a third device 136 for converting the inverse problem into a minimization problem, optionally a fourth device 137 for converting the manipulator specifications from the memory 140 into boundary conditions for the minimization problem, optionally a fifth device 138 for solving the minimization problem, optionally a sixth device 139 for preferring different solutions to the inverse problem, if such different solutions exist. More detailed observations will be given in this respect later on.

Figure 3:
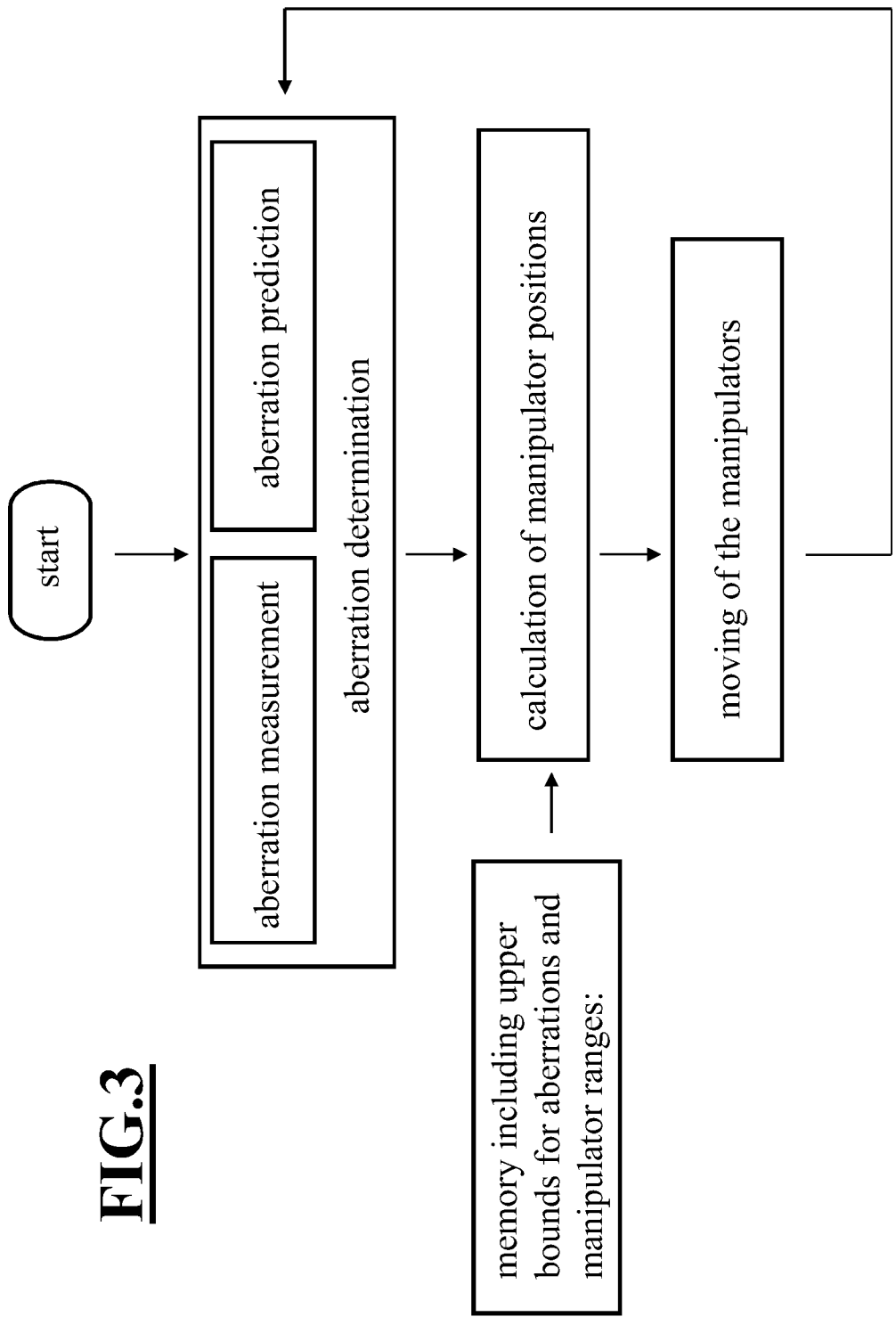
FIG. 3: shows a basic schematic diagram of an adjustment algorithm of a first type

FIG. 3 shows an embodiment of an adjustment algorithm. After the objective has been put into operation, the image aberrations of the objective are determined at regular or irregular time intervals. This determination of the image aberrations is performed by an image aberration measurement or by an image aberration prediction. Individual data on which this prediction is based are generally determined interferometrically in the form of wavefronts in the case of the measurement. A device for interferometrically determining wavefronts is set out in WO200163233A2, which shall hereby be incorporated by reference fully in this application.

The wavefronts and/or aerial images are measured with respect to a plurality of field points. These are arranged on a rectangular grid, for example, and correspond to a matrix having m×n field points $p_{ij}$. Typical numbers of field points are 5×7, 3×13, 5×13 or 7×13. Other possible forms of a grid arrangements are rhomboidal grids or spoke-shaped grids which follow a curved field profile. The field points of each of these grid forms can be arranged in a matrix.

The measurement data thus obtained are optionally freed of numerical noise by filtering. The wavefronts $\omega(p_{ij})$, associated with the individual field points $p_{ij}$, whereby the wavefronts of the aberrations, that is to say the deviations from the ideal spherical form, are meant in the context of this application, are numerically decomposed into Zernike polynomials $Z_l$ or a, preferably orthonormal, function system up to a predefined order n:

$$\omega(p_{ij}) = \sum_{l=1}^{n} \alpha_{ijl} Z_l.$$

The order n of this expansion is generally 36, 49, 64 or 100. For the definition of the Zernike polynomials, cf. e.g. DE102004035595A1 or table 11-1 from *Handbook of Optical Systems*, Herbert Gross, ed., Vol. 1: *Fundamentals of Technical Optics*. The Zernike polynomials presented therein follow the fringe numbering $Z_1(r,\phi)=1$ $Z_2(r,\phi)=r \cos \phi$ $Z_3(r,\phi)=r \sin \phi$ $Z_4(r,\phi)=2r^2-1$ $Z_5(r,\phi)=r^2 \cos 2\phi$ $Z_6(r,\phi)=r^2 \sin 2\phi$ $Z_7(r,\phi)=(3r^3-2r)\cos \phi$ $Z_8(r,\phi)=(3r^3-2r)\sin \phi$ $Z_9(r,\phi)=6r^4-6r^2+1$, which is listed here up to the order n=9. The highest occurring exponent r determines the radial order of the Zernike polynomial Z, and the highest occurring exponent $\phi$ determines the azimuthal order of Zernike polynomial Z. The Zernike polynomials are orthogonal with respect to the scalar product $$(Z_l, Z_s) = \frac{1}{\pi} \int_0^1 \int_{-\pi}^{\pi} Z_l(r, \varphi) Z_s(r, \varphi) r \, dr \, d\varphi$$

and have the norm $$\|Z\| = \frac{k}{2(q+1)},$$

where k=2 if Z has a radial order greater than 0, and k=1 if Z has radial order 0, and q denotes the azimuthal order.

On the basis of the coefficients $\alpha_{ijl}$, image aberrations such as scale error, telecentricity error, overlay and depth of focus, best focus and further image aberrations produced by integration over a plurality of field points are determined: the latter are, for example, the rms (root mean square) and also grouped rms such as, for example, $rms_{spherical}$, $rms_{coma\ x}$, $rms_{coma\ y}$, $rms_{coma}$, $rms_{ast\ 90}$, $rms_{ast\ 45}$ and $rms_{ast}$, $rms_{3foil\ x}$, $rms_{3foil\ y}$ and $rms_{3foil}$, residual rms, and also fading.

The rms at a field point $p_{ij}$ is given by $$rms^2(p_{ij}) = \sum_{l=5}^{n} \alpha_{ijl}^2,$$

where n=36 or n=49 or n=100 holds true. The centered $rms_z$ at a field point $p_{ij}$ is given by $$rms_z^2(p_{ij}) = \sum_{l=5}^{36} \alpha_{ijl}^2.$$

The residual $rms_{res}$ at a field point $p_{ij}$ is given by $$rms_{res}^2(p_{ij}) = \sum_{l=37}^{n} \alpha_{ijl}^2,$$

where the values 50 or 101 are also used instead of 37. The grouped rms at a field point $p_{ij}$ are given by $$rms_{spherical}(p_{ij})^2 = \alpha_{ij9}^2 + \alpha_{ij16}^2 + \alpha_{ij25}^2 + \ldots,$$

$$rms_{coma\ x}(p_{ij})^2 = \alpha_{ij7}^2 + \alpha_{ij14}^2 + \alpha_{ij23}^2 + \ldots,$$

$$rms_{coma\ y}(p_{ij})^2 = \alpha_{ij8}^2 + \alpha_{ij15}^2 + \alpha_{ij24}^2 + \ldots,$$

$$rms_{coma}(p_{ij}) = \max\{rms_{comax}(p_{ij}), rms_{comay}(p_{ij})\},$$

$$rms_{ast90}(p_{ij})^2 = \alpha_{ij12}^2 + \alpha_{ij21}^2 + \alpha_{ij32}^2 + \ldots,$$

$$rms_{ast45}(p_{ij})^2 = \alpha_{ij13}^2 + \alpha_{ij22}^2 + \alpha_{ij33}^2 + \ldots,$$

$$rms_{ast}(p_{ij}) = \max\{rms_{ast90}(p_{ij}), rms_{ast45}(p_{ij})\},$$

$$rms_{3\ foil\ x}(p_{ij})^2 = \alpha_{ij10}^2 + \alpha_{ij19}^2 + \alpha_{ij30}^2 + \ldots,$$

$$rms_{3\ foil\ y}(p_{ij})^2 = \alpha_{ij11}^2 + \alpha_{ij20}^2 + \alpha_{ij31}^2 + \ldots,$$

or $$rms_{3foil}(p_{ij}) = \max\{rms_{3foilx}(p_{ij}), rms_{3foily}(p_{ij})\},$$

The fading, $FAD_x$ and $FAD_y$, in the x and y direction, respectively, is a scan-integrated image aberration and a measure of the field-dependent distortion of a structure to be imaged. During the operation of the projection exposure apparatus, the position of the structure to be imaged varies on account of the field-dependent distortion in the x and y directions. The structure is therefore imaged with a reduced contrast at the averaged position. The fading intensity is characterized by a mean standard deviation of the distortion and is calculated for example in the x direction for a projection optical unit that scans in they direction, as follows:

Firstly, a distinction is made between the so-called core structure and the peripheral structure. When using an x-dipole illumination (see, e.g., "Handbook of optical systems", vol. 2, W. Singer, M. Totzeck, H. Gross, pp. 257, which shall hereby be incorporated by reference fully in this application), vertically oriented parallel lines, for example, represent the core structure since they have to be maged with a higher resolution. Horizontal structures, such as horizontally oriented parallel lines, for example, are referred to in this case as a peripheral structure.

Besides the distinction between core structure and peripheral structure, the field-point-dependent structure offset $\Delta x_{ij}$, for a field point $x_{ij}$ with indices ij, generally also depends on the distance between the structures to be imaged, referred to here as pitch $\theta_\nu$. In general, an interval of pitches is considered: $\theta_1$=2*structure width to $\theta_N$=10*structure width, where the structure width is 60 nm, 45 nm, 32 nm, or only 22 nm. The interval is subdivided equidistantly with a sufficiently fine step size of $\Delta\theta$=15 nm or 10 nm or 5 nm or 1 nm. For each field point $p_{ij}$, where for example i=1, . . . , 13 in the x direction and j=1, . . . , 7 in the y direction, and for each pitch $\theta_\nu$, firstly the generally field-point-dependent and structure-dependent offset $\Delta x_{ij}$ in the x direction is determined. This structure offset $\Delta x_{ij}$ generally be measured directly or else be derived using linear factors and an associated wavefront measurement. A simulation or a hybrid method formed from measurement and simulation can also be employed instead of a measurement.

The scanner-weighted and pitch-dependent mean value of the structure offset in the x direction is defined for core structure and peripheral structure, depending on the horizontal field point index i, in each case as $$\overline{x}_i(\vartheta_v) = \sum_{j=1}^{7} g_j \Delta x_{ij}(\vartheta_v)$$

Only the core structure is considered below, for the sake of clarity. All the formulae are correspondingly applicable to the peripheral structure. Furthermore, a distinction is made here only in the x direction on account of the scan integration in the y direction for the field points $p_{ij}$. The $g_j$ are scanner weights resulting from the intensity distribution of the underlying illumination. In general, at j=1, . . . , 7 field points, $p_{ij}$ evaluated in the y direction and the $g_j$ correspond to a ramp function, for example, i.e.

$$g_j = j/k_1,\ 1 \le j \le k_1;\ g_j = 1,\ k_1 < j < k_2,\ g_j = 1-(j-k_2)/(k-k_2+1),$$
$$k_2 \le j \le k,$$

with k, $k_1$ and $k_2$ chosen in accordance with the illumination intensity. As an alternative, the $g_j$ can also follow some other density function, such as a Gaussian function, for example. In this case, the density functions can each be normalized to one. Functions similar to ramp or Gaussian functions are furthermore alternatively employed as well. In this case, the similarity of a function $f'$ to a predefined function $f$ should be understood to mean a quantified deviation with respect to a predefined function ζ. In this case, said deviation is measured by a likewise predefined norm $\|\ \|$. The norm used is primarily the maximum norm $$\|f\|_{max} = \max_x |f(x)|.$$

The predefined deviation used is a percentage deviation $\|f-f'\| \leq \alpha \|f\|$ where $\alpha = 1.1$, or $\alpha = 1.5$.

In this case, the underlying illumination can be coherent, partly coherent, a dipole illumination, a quadrupole illumination, an annular illumination or some other freely defined illumination setting.

To finish the definition of fading the scanner-weighted variance $\sigma_i^2$ is then calculated as:

$$\sigma_i^2(\vartheta_v) = \sum_{j=1}^{7} g_j(\Delta x_{ij}(\vartheta_v) - \bar{x}_i(\vartheta_v))^2$$

The mean standard deviation is thus $$MSD_i^x(\theta_v) = \sqrt{\sigma_i^2(\theta_v)}$$

The maximum value over the field points and over all the pitches $\theta_v$ $$FAD_x = \max_{i,\vartheta_v}(MSD_i^x(\vartheta_v))$$

is then designated as x-fading $FAD_x$.

Analogous relationships are applicable to the fading in the y direction $FAD_y$, except that a variable $\Delta y_{ij}$ the structure-dependent offset in the y direction is used instead of $\Delta x_{ij}$.

Figure 10:
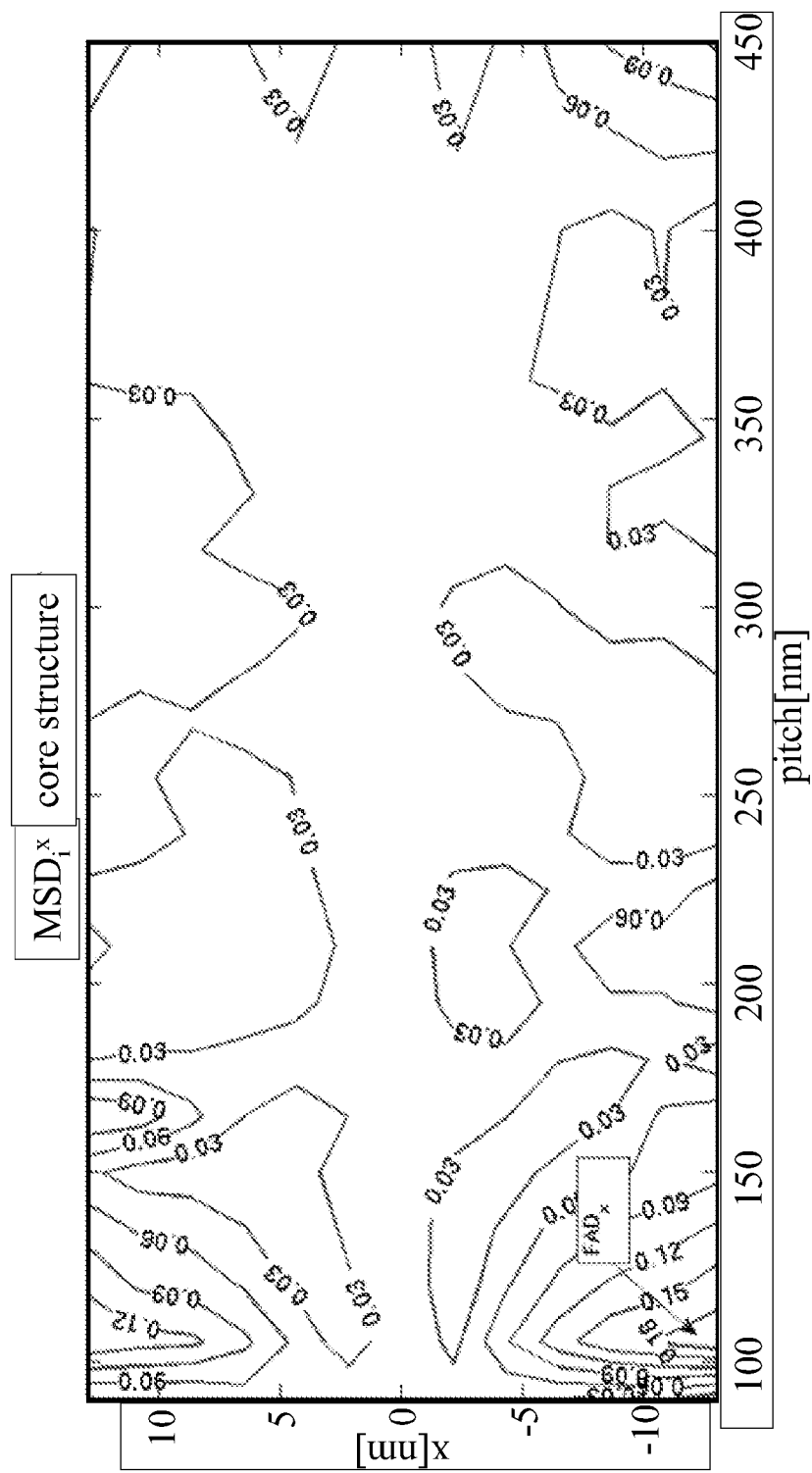
FIG. 10: shows an illustration of fading for the core structure in the x direction

FIG. 10 continuously illustrates $MSD_i^x$ for the core structure in the case of an x-dipole illumination measured over an object field of from x=-13 mm to x=13 mm and for a pitch of $\theta_1 = 2*$structure width to $\theta_N = 10*$structure width. The structure width is 45 nm. $FAD_x$ is assumed at the point depicted.

The image aberration overlay, OVL, is likewise dependent on core structure, peripheral structure and pitch and is a measure of the scanner-averaged distortion. As previously defined separately for each structure orientation, for a predefined, finite sequence of pitches $\theta_v$, v=1, . . . , N and field points $x_i$, i=1, . . . , 13 in the x direction, the offset, or synonymously centroid, is defined by $$Off_x = \sum_i \sum_v \bar{x}_i(\vartheta_v) \Big/ \sum_i \sum_v 1.$$

The offset defines the expected value, once again only the core structure being considered below. For each, now fixed, pitch $\theta_v$, there is then precisely one maximum overlay value $OVL_{x,v}$ $$OVL_{x,v} = \max_i |Off_x - \bar{x}_i(\vartheta_v)|$$

The maximum over all the pitches is finally designated as the overlay error $OVL_x$ in the x direction for the given structure orientation $$OVL_x = \max_v OVL_{x,v}.$$

Analogous relationships are applicable to the overlay error in the y direction $OVL_y$, except that the scanner-integrated variable $\bar{y}_i$ is considered instead of $\bar{x}_i$. The overlay error for the peripheral structure is determined in a corresponding manner.

Figure 11:
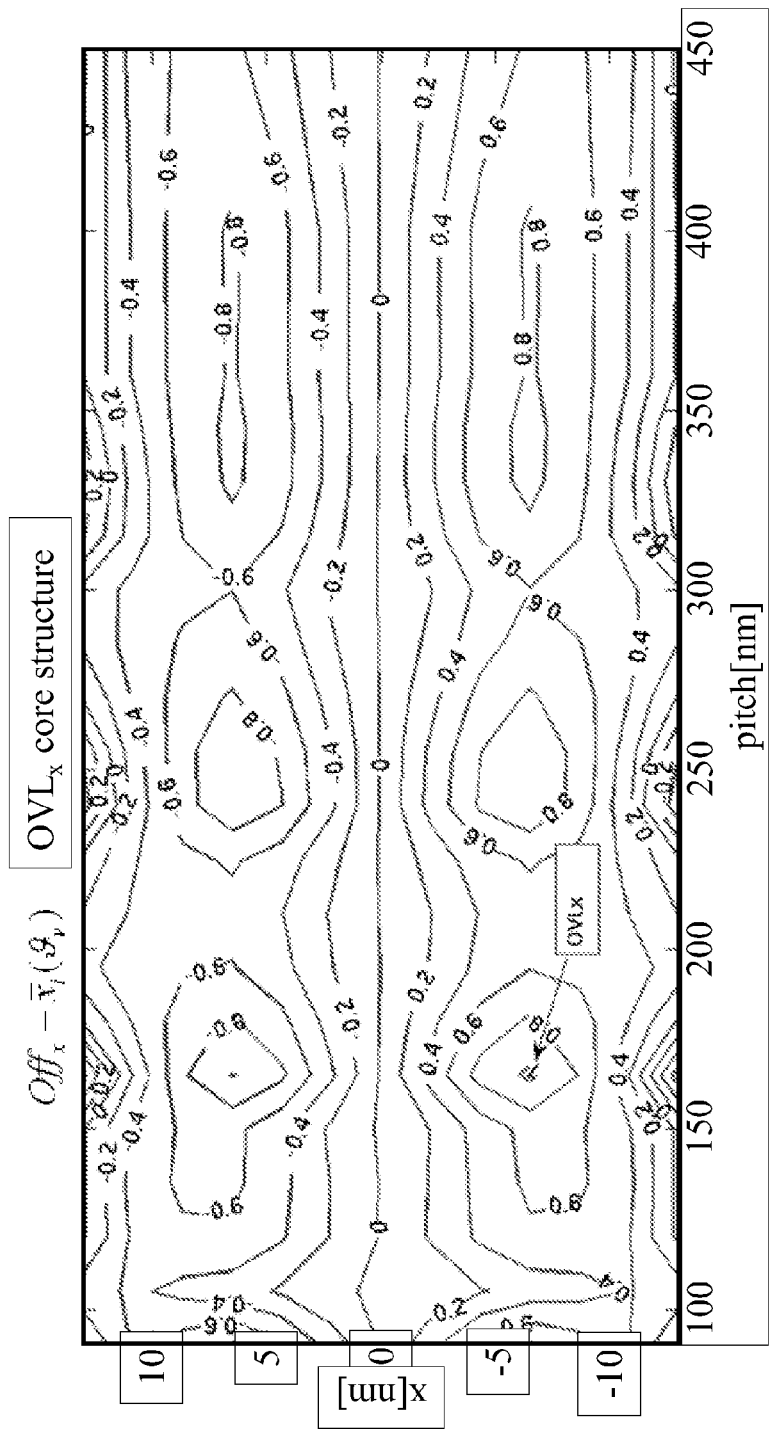
FIG. 11: shows an illustration of overlay for the core structure in the x direction

FIG. 11 continuously illustrates, for a typical x-dipole, the value $Off_x - \bar{x}_i(\theta_v)$ in the case of the core structure measured over an object field of x=-13 mm to x=13 mm and for a pitch of $\theta_1 = 2*$structure width to $\theta_N = 10*$structure width. The structure width is 45 nm. $OVL_x$ is assumed at the point depicted.

The image aberration best focus, BF, is a measure of the scanner-integrated focus error and likewise depends on the pitch considered. In accordance with the above definitions for the overlay, for each field point and for each pitch firstly—synonymously with the pitch-dependent mean value of the structure offset—the structure-dependent average focus position is determined by measurement or simulation or a hybrid method. A distinction is made between the core structure and the peripheral structure in this case, too. There is, of course, no longer a distinction according to x and y. The centroid, synonymously offset, is then determined over all the pitches and over all the field points in the x direction, in a manner analogous to that in the definition of the overlay. It defines the expected focus position. From the latter, the maximum deviation of the scanner-averaged focus position is subsequently determined for each pitch. The maximum deviation over all the pitches is finally designated as the best focus error.

Figure 12:
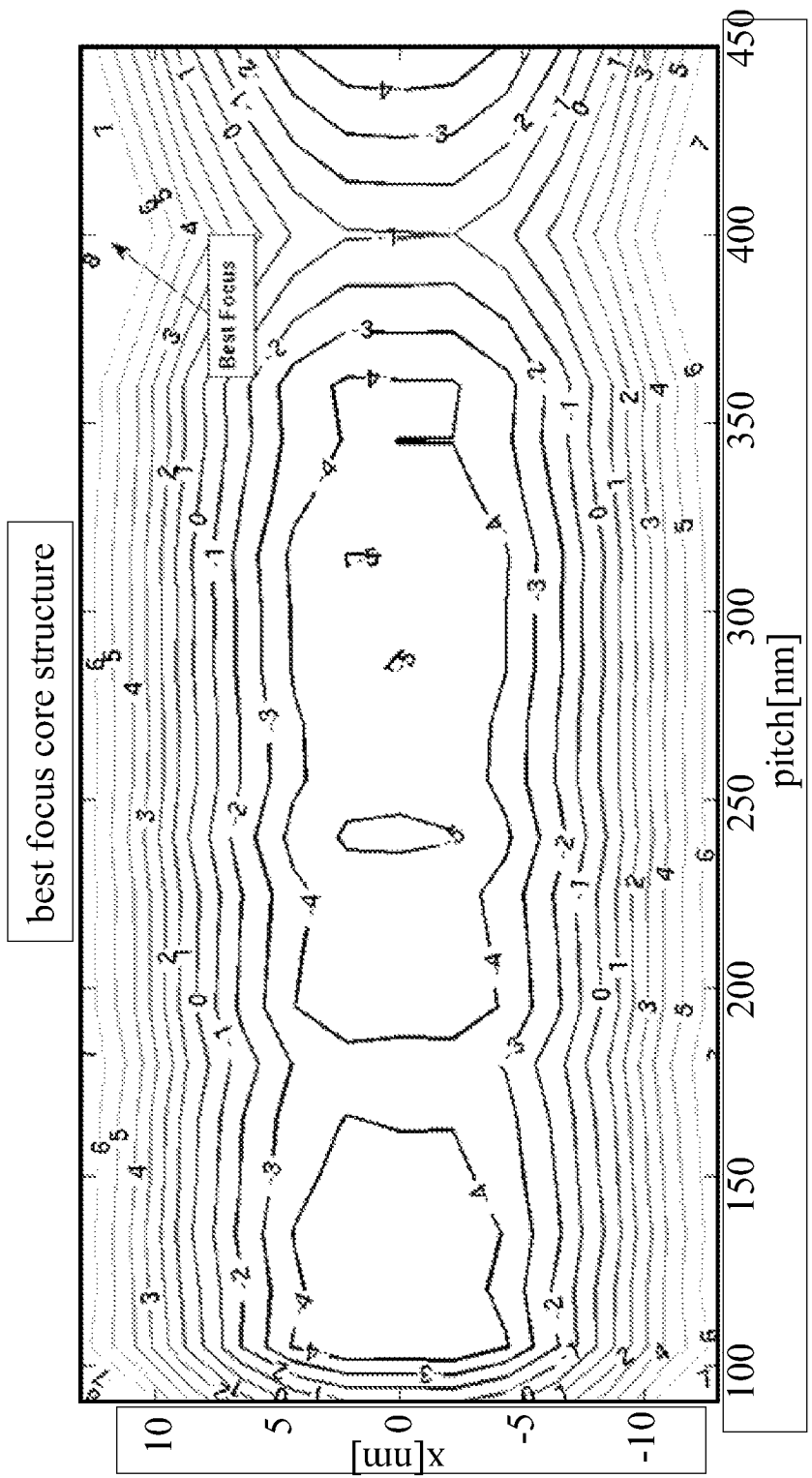
FIG. 12: shows an illustration of best focus for the core structure

FIG. 12 continuously illustrates the average focus position for a typical x-dipole and in the case of the core structure measured over an object field of x=-13 mm to x=13 mm and for a pitch of $\theta_1 = 2*$structure width to $\theta_N = 10*$structure width. The structure width is 45 nm. The best focus error is assumed at the depicted point Best Focus.

Beside those integrated aberrations also individual coefficients themselves as determined above are also appropriate as image aberrations.

For all the image aberrations or at least those image aberrations which are relevant to the imaging performance of the objective with regard to the imaging performance currently desired, such as, e.g., overlay, best focus, fading both for core and for peripheral structures, and individual Zernike coefficients, and also rms, grouped rms and residual rms, upper bounds are read from a memory. Appropriate upper bounds include for example for overlay 5 nm, 2 nm, 1 nm, 0.5 nm or 0.1 nm. Best focus can be specified with 50 nm, 20 nm, 10 nm, 5 nm or 1 nm. For fading, 10 nm, 5 nm, 2 nm or 1 nm can constitute upper bounds. 1.0 nm or 2.0 nm, by way of example, is appropriate for individual Zernike coefficients. These upper bounds are generally not permitted to be overshot by the corresponding image aberrations.

The aim of ensuring that all the relevant image aberrations are below their respective upper bounds after the setting of the manipulators produces a series of first boundary conditions. Namely complying with upper bounds, hereinafter referred to generally as spec, for 1) Zernike specs: $spec_M$ for example 2.0 nm for $Z_i$, i≤6 and 1.5 nm for $Z_i$, 6<i≤36 RMS specs: $spec_R$ for example 3.0 nm for rms, 1.0 nm for $rms_z$ for Zernikes specified in greater detail, such as $Z_i$, i=5, . . . , 49 and 2.0 nm for $rms_{res}$ for the residual rms 2) grouped RMS specs: $spec_G$ for example 0.8 nm for $rms_{ast}$, $rms_{coma}$ and $rms_{3foil}$ 3) Fading specs: $spec_F$ for example 5.0 nm (core and periphery)

4) OVL specs: for example 2.0 nm core, 5.0 nm periphery

5) Best Focus specs: for example 20.0 nm core, 50.0 nm periphery

In addition, specifications for at least some of the manipulators are read from a further or the same memory 140. They include the maximum movements of the manipulators. Appropriate maximum movements include the following, by way of example:
1. maximum movement of a manipulator which displaces a lens in the direction of the optical axis, 100 micrometers,
2. maximum movement of a manipulator which displaces a lens orthogonally thereto, 20 micrometers, and
3. maximum movement of a manipulator which tilts a lens about an axis orthogonal to the optical axis 300 microrad.

In the case of a mirror, the corresponding values are 40 micrometers, 35 micrometers, and 140 microrad, respectively. A manipulator which bends a lens can for example be maximally moved to an extent such that the positional alteration of each point of each of the two lens surfaces is at most 1 micrometer in the direction of the optical axis. Depending on the lens form and the positions of the deforming force inputs and/or torques, upper bounds thus arise indirectly for said forces and/or torques. In the case of a manipulator which applies heat and/or cold to an optical element, the following upper bounds are applicable, by way of example:
4. maximum temperature change +/−0.65 K. A maximum temperature change that is not symmetrical with respect to zero, such as −0.5 K to +0.75 K, for example, is also used,
5. maximum power input +/−150 W/m$^2$. A maximum power input that is not symmetrical with respect to zero, such as −120 W/m$^2$ to +200 W/m$^2$, for example, is also used here.

There then follows the time-critical step (II) of calculating the optimum manipulator movements, after which, in a further step, the manipulators are set in accordance with the movement respectively determined for them.

The image aberrations resulting from the movement of an individual degree of freedom of a manipulator and their expansion into Zernike polynomials can be determined a priori. This is generally done by simulation or measurement in the case of a standard movement assigned to the manipulator and to one of its degrees of freedom.

This is explained below on the basis of a manipulator which displaces a lens of the objective in a defined direction. This manipulator has one degree of freedom. Its effect on the individual wavefronts at a predefined selection of field points $p_{ij}$ is determined by measuring or simulating the wavefronts of the objective in the case of a predefined standard movement x, generally one micrometer, of the manipulator and subtracting therefrom the wavefronts of the objective in the case of a unmoved manipulator. This subtraction is realized by the expansion of the respective wavefronts into Zernike polynomials and subtraction of the coefficients of the two expansions. The expansions into the Zernike polynomials are performed up to an order n.

By way of example, the values i=7, j=13 and n=36 or 49 are used. In this case, a total of i·j·n=7·13·36=3276 image aberrations are determined in accordance with the expansion of the wavefronts at all the given field points $p_{ij}$.

Besides the coefficients of the Zernike polynomials, use is also made of other image aberrations, such as, for example, the residual $rms_{res}$ defined above. These can either be calculated using the wavefronts determined—as explained above—or they are measured or they are simulated.

The difference thus obtained is designated as the sensitivity a of the manipulator. It defines the optical effect of the manipulator in the case of its standard movement x. For small movements, said optical effect is proportional to the sensitivity a.

If the manipulator has more than one degree of freedom, then the sensitivities are calculated separately for each of its degrees of freedom, its standard movement being predefined for each degree of freedom. This holds true for all the manipulators of the projection apparatus. A matrix A of sensitivities is obtained:

$$A=(a_{mn})_{m=1,\ldots,i\cdot j\cdot k, n=1,\ldots,l},$$

where j is the number of field points in the scanning direction, i is the number of field points orthogonally to the scanning direction, k is the summed number of all the degrees of freedom of all the manipulators of the projection apparatus, and l is the number of image aberrations calculated.

The standard movements are given for example by
1 micrometer for a manipulator which displaces a lens perpendicular to the optical axis of the projection objective,
1 micrometer for a manipulator which displaces a lens in the direction of the optical axis of the projection objective,
1 Watt/cm$^2$ power for each heating zone of a heating manipulator
1 bar pressure in the case of the bending of a lens element
1 millimeter for the relative displacement of a pair of Alvares plates A manipulator which exhibits a linear behavior, such as, for example, manipulators which slightly shift the position of optical elements, can be used as continuously movable on account of its effect proportional to the displacement, since its effect can be calculated for all movements on the basis of its effect in the case of its standard movement. In order to be able to continuously move manipulators which do not exhibit a linear behavior, such as, for example, manipulators which apply a high degree of heat to a lens or Alvarez plates with a great relative displacement of a number of millimeters, their effect at different movements is determined, in particular measured or simulated, and their effect is interpolated with the aid of the data thus obtained.

In the case aberrations that leave the linearity range, linear interpolation is likewise effected in accordance with the methods specified above. Such aberrations can be for example the lithographic system parameters such as overlay core structure, overlay peripheral structure, best focus core structure or best focus peripheral structure.

The total number of sensitivities can be more than n=10, 20, 50, 100, 500 or 1000.

The sensitivities A thus defined are also referred to as static sensitivities since these are determined individually for each field point $p_{ij}$. If the projection exposure apparatus is operated in scanning operation, then scan-integrated sensitivities $\overline{A}$ are also employed, which are defined as follows.

Given a density function such as the above-described ramp functions or a Gaussian function, the scan-integrated sensitivities $\overline{A}$ are obtained from the static sensitivities A by the respective image aberrations or coefficients of the Zernike polynomials being scan-integrated in the case of their standard movements, that is to say the coefficients, weighted with the given density in the scanning direction, that is to say in the direction of the movement of the reticle, are added and subsequently divided by the number of summands. In the case of scan-integrated sensitivities, therefore, the matrix of the sensitivities acquires the form $$\overline{A}=(\overline{a}_{mn})_{m=1,\ldots,i\cdot k, n=1,\ldots,l},$$

that is to say that it has fewer rows than the matrix of the static sensitivities by a factor j.

The image aberration fading $FAD_x$, $FAD_y$ is already by definition scan-integrated.

Besides the image aberration fading, fading sensitivities $\tilde{A}$ are also defined. These are obtained from the static sensitivities by subtracting the scan-integrated sensitivities $\overline{A}$ from the static sensitivities A: $\tilde{A}=A-\overline{A}$. In this case, the scan-integrated sensitivities are assumed to be constant in the scanning direction.

The sensitivities are always designated by A hereinafter, which can be taken to mean both static and scan-integrated or fading sensitivities. If reference is explicitly made to scan or fading sensitivities, then these are again designated by $\overline{A}$ or $\tilde{A}$, respectively.

The sensitivities of all the manipulators of the projection apparatus span a vector space.

$$V=\{x_1a_1+\ldots+x_na_n: x_1, \ldots, x_n \text{ real}\}$$

The latter is as is also referred to as a (mathematical) adjustment space.

On account of the movement distance restrictions given, V is generally not a vector space but rather a convex set, more precisely a polyhedron, the (mathematical) adjustment polyhedron already defined above.

If an image aberration b is intended, then, to be set or compensated for by the manipulators of the objective, then it is necessary to solve the linear equation system $$x_1a_1+\ldots+x_na_n=b$$

or for short $$Ax=b$$

A is a matrix containing the sensitivities of the respective manipulators with regard to their degrees of freedom, and x is a vector describing the unknown movements of the respective manipulators. It should be taken into consideration here that the dimension of the matrix A is smaller by the factor j, the number of field points in the scanning direction, if scan-integrated sensitivities are involved.

In this case, the image aberration b is generally not an element of V and so the above equation generally does not have a solution. The case where a plurality of such solutions x exist can likewise occur.

Therefore, instead of said equation, the following optimization problem is solved:

$$\min\|Ax-b\|_2^2, \quad\quad\quad (a)$$

with Euclidean norm $\|\ \|_2$, which can be found by solving the normal equation $$A^tAx=A^tb \quad\quad\quad (a')$$

Instead of a minimum problem like (a) obviously a equivalent maximum problem can be stated by max $-(Ax-b, Ax-b)$ In this case, it is possible to use direct methods such as the Gaussian elimination method or Moore-Penrose inverse or alternatively iterative methods such as the quasi-Newton method or else the cg method (conjugate gradient method). In this respect, cf. Angelika Bunse-Gerstner, Wolfgang Bunse, Numerische Lineare Algebra, Teubner Studienbücher, 1985, in particular the algorithm 3.7.10, pp. 153-156, and for stabilization purposes the algorithm 3.7.11, pp. 157-158. Iterative methods can be terminated on the basis of an a priori error estimation, an a posteriori error estimation or after a fixedly predefined number of iteration steps, such as, for example, 500, 200, 100, 50, 20, 5, or 1, iteration steps.

The Euclidean norm $\|\ \|_2$ is always used hereinafter, but it can also be provided with weights $d=(d_i)$:

$$\|b\|_{2,d}^2 = \sum_i (d_ib_i)^2, b=(b_i).$$

This embodiment is not explicitly mentioned below; however, for each exemplary embodiment, a weighted Euclidean norm constitutes an alternative to the Euclidean norm.

Such a weighting d of the Euclidean norm is employed for example when the image aberration $b_i$ corresponds to the coefficient of a Zernike polynomial. In accordance with the fringe numbering, cf. *Handbook of Optical Systems*, Herbert Gross, ed., Vol. 1: *Fundamentals of Technical Optics*, the following is set in this case:

$$d_i = \frac{k}{2(q+1)}.$$

In other words, the image aberration corresponding to a Zernike coefficient is additionally weighted with the norm of the corresponding Zernike.

Furthermore, such a weighting of the Euclidean norm is employed in particular when the image aberration exhibits a production-dictated field profile. Thus, the use of aspherical lenses that are near the field and have a highly pronounced asphericity exhibits the effect of excessively increased image aberrations at the edge of the object field. In order to prevent the influence of such an excessive increase from becoming overly great, field points are weighted to a lesser extent at the edge of the object field than in the field center. By way of example, the following procedure is adopted in order to solve this problem.

If x denotes the field coordinate perpendicular to the scanning direction, 0 is assumed as the center of this coordinate, and $-x_{max}$ and $x_{max}$ denote the minimum and maximum field coordinate, respectively, in this coordinate, then it is found that the scan-integrated Zernikes or the scan-integrated image aberrations in part tend to assume at the field edge $-x_{max}$ and $x_{max}$ and in its vicinity high values; cf. for example the best focus from FIG. 12 for a fixed pitch, or the image aberration $MSD_i^x$ from FIG. 10.

Since an as far as possible constant field profile of the scan-integrating image aberrations perpendicular to the scanning direction is desirable, however, the Euclidean norm is correspondingly weighted by more weight being imparted to the field edge than to the field center as seen in relative terms. As such a weighting, the following weighting, formulated here for the image aberration best focus BF, has proved to be advantageous:

$$g_x = 1 + \left(\frac{BF(-x_{max})+BF(x_{max})}{2BF(0)}-1\right)\left(\frac{x}{x_{max}}\right)^2.$$

Corresponding weightings are also employed for the other scan-integrating image aberrations such as fading $FAD_x$ and $FAD_y$, overlay $OVL_X$ and $OVL_y$, rms and residual rms.

Weightings are also employed in combined fashion, such as, for example, in the case of a common optimization with regard to static and scan-integrated image aberrations.

Further embodiments of the solution to the problem (II) or (a') now follow.

The above iterative methods, e.g., quasi-Newton method or cg method, for solving (a') can be terminated upon an a priori time bound being overshot, such that the solution is determined only approximately. This is advantageous particularly in the case for real-time optimizations as in the case described. The following cases alternatively occur for such an only approximate solution:
- (i) If an a priori or an a posteriori error estimation exists for the iterative method, it is possible to determine whether the approximate solution can be used since the image aberrations are uniformly continuously dependent on the manipulator movements.
- (ii) A check is made to determine whether the solution to the inverse problem, and the manipulator setting that is thus optimum according to the predefined criteria, can be shifted into the next regulation interval. This is done by calculation or simulation of the resulting image aberrations if the manipulators were moved in accordance with the approximate solution.
- (iii) If (i) or (ii) are not possible, then a solution to an alternative inverse problem is generated with the aid of a rapidly convergent method, for example a Tikhonov regularization. For this alternative inverse problem, only those manipulators whose movement range is noncritical are taken into account for a reduced adjustment polyhedron. These are for example displacements of optical elements whose movement range is generally sufficiently large.

In general, the problem (a') is ill-conditioned, that is to say that the condition number $$\kappa(A^tA) = \frac{\max_{\|x\|=1} \|A^tAx\|_2}{\min_{\|x\|=1} \|A^tAx\|_2}$$

of the problem (a') is generally very high and can overshoot values of 1.0E6, 1.0E8 or even 1.0E12. The condition of an individual manipulator can also reach values of up to 1.0E3. This leads to an instability of the numerical methods mentioned above. This can have the effect that the calculated solution impairs the problem, or that the algorithm regards the optimization problem as insoluble. This is the case particularly for the traditional simplex method.

Methods for regularizing such high-dimensional, ill-conditioned (synonymously: ill-posed) problems include Singular-Value-Decomposition (SVD decomposition) with singular value truncation, and also Tikhonov regularization. In the case of SVD decomposition, the matrix A is diagonalized with regard to its eigenvectors, and the resulting "new" degrees of freedom of the manipulator system are sorted according to the absolute value of their eigenvalues. Degrees of freedom which correspond to eigenvectors with eigenvalues of an absolute value of less than 1.0E-7, for example, are not utilized in the adjustment. In this respect, cf. Andreas Rieder, Keine Probleme mit Inversen Problemen, Vieweg, 2003, chapter 2.3 "Spektraltheorie kompakter Operatoren: Die Singulärwertzerlegung" ["Spectral theory of compact operators: the singular value decomposition"], pp. 28-35, in particular definition 2.3.6, and also Angelika Bunse-Gerstner, Wolfgang Bunse, Numerische Lineare Algebra, Teubner Studienbücher, 1985, pp. 26-27, formulation 1.6.10, for numerical calculation pp. 288-296, in particular algorithm 4.8.1. These contents shall hereby be incorporated within their full scope in this application. A further possibility of regularization is preconditioning. Cf. Angelika Bunse-Gerstner, Wolfgang Bunse, Numerische Lineare Algebra, Teubner Studienbücher, 1985, in particular section "Vorkonditionierung" ["preconditioning"], pp. 156-160, which shall hereby be incorporated by reference within its full scope in this application.

Tikhonov regularization involves solving the minimization problem $$\min\|Ax-b\|_2^2+\|Gx\|_2^2 \quad (a'')$$

with a suitably chosen matrix G instead of the problem (a).

In this case a multiple of the unit matrix is especially appropriate as a choice for G. In this case, the above minimization problem is presented as $$\min\|Ax-b\|_2^2+\gamma\|x\|_2^2 \quad (a''')$$

In the case of the matrix G, a correlation matrix is alternatively used. The latter is formed by inputting the individual degrees of freedom $x_i$ as random variables. The distribution thereof over their respective interval of possible movements is determined statistically. In this case, as a first possibility, a starting distribution is taken as a basis, the parameters of said starting distribution being estimated using statistical methods during the operation of the projection exposure apparatus (a posteriori), or, as a second possibility, a look-up table is used (a priori). In the case of the first possibility, Gaussian distributions, in particular, are used as starting distributions with the expected values $E(x_i)$ and the variances $\sigma(x_i)$ as parameters to be estimated.

Tikhonov regularization seeks a compromise from minimum error $\|Ax-b\|_2^2$ and, in the case (a'''), minimum movements $\|x\|$ of the manipulators. The question with regard to an optimum $\gamma$ is preferably answered using the L-curve method. In the case of the latter, the movements obtained in the case of the minimization are plotted as a function of $\gamma$. The $\gamma$ which has the gradient having the largest absolute value is then selected as the optimum $\gamma$. For further details in this respect, cf. "Analysis of discrete ill-posed problems using the L-curve", P. C. Hansen, SIAM Review, 34, 4, 1992, pp. 561-580, which shall hereby be incorporated within its full scope in this application. The generalization specified in chapter 3.6 "Heuristic ("epsilon"-"free") parameter strategies, pp. 82-90, of Andreas Rieder, Keine Probleme mit Inversen Problemen [No problems with inverse problems], Vieweg, 2003, shall likewise be incorporated within its full scope in this application.

On account of the different types of manipulators, the regularizing parameter $\gamma$ is alternatively configured in vector-valued fashion, $\gamma=(\gamma_i)$, where i indicates the degrees of freedom of all the manipulators. G in (a'') is then a diagonal matrix and then acquires the form $$\min\|Ax-b\|_2^2 + \sum_i (\gamma_i x_i)^2. \quad (a^{IV})$$

The minimization problem (a$^{IV}$) can be formulated both for static sensitivities A and for scan-integrated sensitivities $\overline{A}$. In the latter case, the dimension of the Euclidean norm decreases by the factor j of the number of field points $p_{ij}$ the scanning direction. Correspondingly, the image aberration vector b is also replaced by the scan-integrated image aberration vector $\overline{b}$.

In lithographic applications wherein it is desired to achieve a specific predefined ratio of scan-integrated to static image aberrations, a combination of scan-integrated and static sensitivities is also used for formulating the minimization problem:

$$\min\left(j\alpha\|\bar{A}x - \bar{b}\|_{2,d_{\bar{A}}}^2 + (1-\alpha)\|\tilde{A}x - \tilde{b}\|_{2,d_{\tilde{A}}}^2 + \sum_i (\gamma_i x_i)^2\right)$$

The weights d are occasionally set to 0 since not all the Zernike coefficients influence the fading. In particular, the spherical coefficients, that is to say those whose Zernike polynomials are rotationally symmetrical, are weighted with 0.

In this case, the image aberration vector $\tilde{b}$ is defined by $\tilde{b}=b-\bar{b}$, where $\bar{b}$ is assumed to be constant in the scanning direction, j is the number of field points in the scanning direction and $\alpha$, $d_{\bar{A}}$, $d_{\tilde{A}}$ and $\gamma_i$ are weights that are chosen in accordance with the predefined ratio and the employed degrees of freedom of the manipulators. The standard value for $\alpha$ is $\alpha=0.5$.

What can prove to be problematic in the case of the above Tikhonov regularizations is that the regularizing parameter $\gamma$ only affects the square of the movements of the individual manipulators and thus ignores the sign of the movements. This can result in the formation of a drift of the affected manipulator in a preferred direction, which ultimately entails the risk of an overshooting of the manipulator range. This is combated in two ways:

A posteriori: (a''') is replaced by $$\min\|Ax-b\|^2 + \gamma_1\|x\|^2 + \gamma_2\|x-x'\|^2 + \gamma_3 x + \gamma_4(x-x') \qquad (a^v)$$

In this case, the parameters $\gamma_1$ and $\gamma_2$ are scalars, and $\gamma_3$ and $\gamma_4$ are vectors having dimensions corresponding to the degrees of freedom of the manipulators. x' are the movements at which the individual manipulators are situated at the current point in time. x are the notified movements that are to be assessed. $\gamma_1$ is the proportionality constant used to weight the total movement x of the manipulators, independently of their instantaneous movement state x' and their movement direction. It defines the extent to which an excessively high total movement of the manipulators is intended to be penalized. $\gamma_2$ is the proportionality constant used to weight the additional movement x-x' necessary to attain the movement x from the movement x', independently of its direction. It defines the extent to which an instantaneous movement of the manipulators is penalized. $\gamma_3$ is a vector. Its direction predefines the direction in which the total movement x of the manipulators is unfavorable, and its absolute value defines the extent to which an excessively high total movement of the manipulators in this direction is penalized. $\gamma_4$ is a vector. Its direction predefines the direction in which an additional movement x-x' of the manipulators is unfavorable, and its absolute value defines the extent to which an excessively high additional movement of the manipulators in this direction is penalized.

Figure 6:
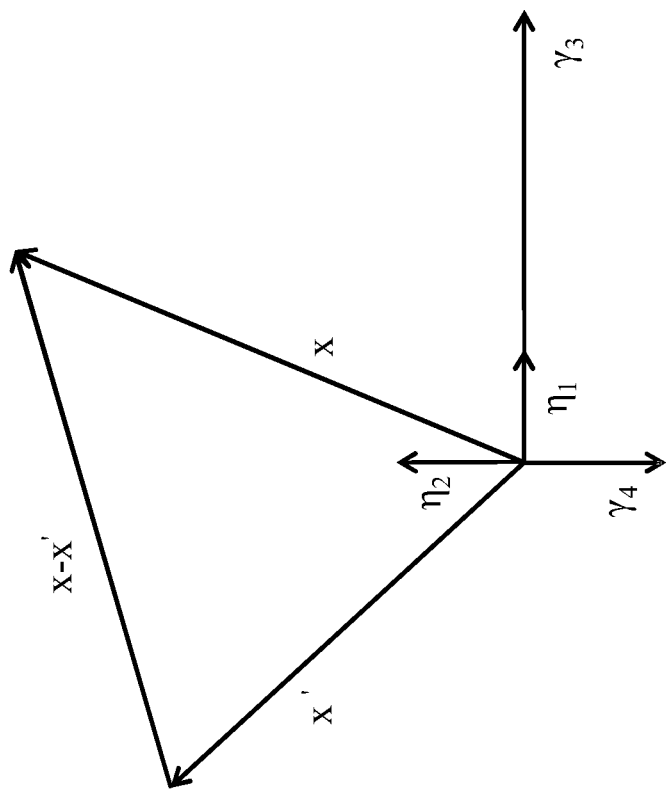
FIG. 6: shows an illustration of a Tikhonov regularization

FIG. 6 illustrates the mode of operation of the vectors $\gamma_3$ and $\gamma_4$. For illustration two degrees of freedom are considered, hence x is a two-dimensional vector. The $1^{st}$ degree of freedom, designated by $\eta_1$, corresponds to a displacement of a lens on the optical axis. The direction of $\eta_1$ is that of the direction in which the optical element lying closest to the lens is to be found. The maximum possible displacement distance is naturally not larger in this direction than in the opposite direction. Therefore, the over-all movement x which is to be assessed and which provides an end position of the lens in this direction is penalized a priori in accordance with (a$^v$) with ($\gamma_3$,x) if $\gamma_3$ points in the direction of $\eta_1$, e.g. $\gamma_3$=(1,0). The $2^{nd}$ degree of freedom, designated by $\eta_2$, corresponds to actively heating of a lens. Since heating that is caused actively can be attained more rapidly than passive cooling, an increase of the current temperature is rewarded and $\gamma_4$ points counter to the direction of $\eta_2$, e.g., $\gamma_4$=(0,-1). In order to attain the notified movement x, it is necessary to effect movement from the current movement x' by x-x'. Since $\gamma_4$ points in the direction of cooling, this is rewarded a posteriori in accordance with (a$^v$) with ($\gamma_4$,x-x').

A priori: In (a'''), $\gamma$ is replaced by a suitable function such as, for example, $$\min\|Ax-b\|^2 - \sum_i \ln(\min\{|x_i - x_{i,min}|, |x_i - x_{i,max}|\}) \qquad (a^{v'})$$

where $[x_{i,min}, x_{i,max}]$ in each case describes the individual range of the i-th degree of freedom of the manipulator. Cf. in addition the "interior point method" which is explained further below.

What is disadvantageous about these Tikhonov weightings with parameters $\gamma_i$ is that for a given movement of the manipulators $x=(x_i)$, the residual image aberrations Ax-b and the manipulator movements $x_i$ couple only indirectly, that is to say by way of the merit function (a''')-(a''). In this case, the type of coupling is independent of the image aberration level that can be attained and also independent of the manipulator movements necessary therefore.

One variant of the Tikhonov regularization mentioned above consists in calculating a first manipulation prescription $x_1$ with a regularizing, vector-valued, parameter $\gamma_1$. This manipulation prescription $x_1=(x_{1i})$ is then examined as to the extent to which individual degrees i of freedom of manipulators are moved little or not at all. In the case of such degrees of freedom, the associated regularizing parameter $\gamma_{2i}<\gamma_{1i}$ is decreased, such that the associated degree of freedom of the manipulator contributes less to the merit function (a'')-(a'''). Conversely, all degrees of freedom whose movements, in the case of the calculated prescription, are close to their range limits are allocated a higher regularizing parameter $\gamma_{2i}>\gamma_{1i}$. These increases and decreases can be chosen in each case by 10%, or 20%, or 50% or 100%. With this new parameter $\gamma_2=(\gamma_{2i})$, a second manipulation prescription $x_2$ is calculated and compared with $x_i$. That manipulation prescription $x_{1,2}$ which has the smaller residual image aberration $\|Ax_{1,2}-b\|$ is preferred to the other manipulation prescription if it comprises no range overshooting. Alternatively, others of the preferences mentioned above are appropriate in the selection of the manipulator prescriptions to be implemented, in particular that of the stability of the solution x.

As an alternative thereto, this method is carried out in multistage fashion with $x_{1, 2, \ldots, n}$ manipulation prescriptions and residual image aberrations $\|Ax_{1, 2, \ldots, n}-b\|$, where the manipulation prescription which comprises no range overshooting and achieves the smallest residual image aberration is finally selected. In this case, "moved little" is understood to mean a movement of less than 10%, or less than 20% or less than 50% of the available range for the relevant degree of freedom, and "close to the range limit" is understood to mean a movement of more than 50%, or more than 80% or more than 90% of the available range for the relevant degree of freedom. In addition, these gradations 50%, 20%, 10% can also be varied during this multistage method.

As an alternative thereto, the individual image aberration weightings can also be carried out in multistage fashion. This is preferably performed with the aid of a weighted Euclidean norm $\|\ \|_{2,d}$, the weighting $d=(d_i)$ of which is varied. (a) then has the following form in the i-th method step $$\min\|Ax_i - b\|_{2,d_i}^2,$$

where for i=0 $d_0$ as start value is set to 1 and then $d_i$ for i≥1 is functionally dependent on the specifications $spec_i$ of the individual image aberrations $b_i$ and the residual image aberration $b_i = Ax_i - b$ that can be achieved in the previous method stage. It has proved to be expedient to predefine the following functional relationship:

$$d_i = \frac{|b_{i-1}|^{0.3}}{spec_i} \min\{1, 1 - 0.1(spec - |b_{i-1}|)\},$$

if i is an even number and $$d_i = \exp\left(\frac{|b_{i-1}|}{spec_i} - 1\right),$$

if i is an odd number.

This weighting thus defined is to be performed individually for each specification spec of an image aberration. This can involve weightings of individual Zernikes at selected field points, scan-integrated image aberrations such as fading $FAD_x$, $FAD_y$ or fully integrating image aberrations such as rms.

These two multistage methods can also be combined.

Methods which implicitly regularize weakly, such as, e.g., the cg method (conjugate gradient method), are alternatively employed. Details and numerous further methods can be gathered from, e.g., Rieder, A., "*Keine Probleme mit inversen Problemen*", Vieweg, 2003 which is hereby incorporated by reference within their full scope in this application.

Methods of the type "Ruin and Recreate" are furthermore alternatively used. In this case, an already determined solution $x^1_1, \ldots, x^1_n$ to the inverse problem is taken as a basis, which solution is intended to be improved. A portion of the manipulators, e.g. i=m, (m+1), ..., n, is then "shut down", that is to say their degrees of freedom are not used. A solution $x^2_1, \ldots, x^2_{m-1}$ with this reduced set of manipulators is then determined. The solution thus determined is naturally worse than the previous solution (Ruin). The shut-down manipulators are then "activated" again, although $x^2_1, \ldots, x^2_{m-1}$ is no longer altered (Recreate), that is to say that $x_m, x_{m+1}, \ldots, x_n$ are available as degrees of freedom. Overall, a solution $x^2_1, \ldots, x^2_n$ is thus generated, which is compared with the solution $x^1_1, \ldots, x^1_n$.

Ruin and Recreate is used particularly in iterative methods as an intermediate step which is intended to prevent the iterative method from getting stuck at a suboptimum solution.

In general, however, there is no intention at all to reduce a specific image aberration to zero. The objective only has to ensure an imaging performance suitable for the lithography. Said imaging performance is generally ensured by upper bounds for those image aberrations which are critical for the imaging performance of the objective. They include for example scale error, telecentricity error, overlay and depth of focus, and also image aberrations arising as a result of integration of a plurality of field points, such as rms, grouped rms, Fading, and also lithographic requirements and further wavefront dimension figures. Cf. $spec_M$, $spec_R$, $spec_G$ and $spec_F$ from 1)-6) as indicated above.

For the further description, initially no distinction is made with regard to different image aberrations and the relevant upper bound is always designated by spec.

Instead of equation (a), now a solution to the inequality $$|Ax-b| \leq spec \quad (b)$$

or equivalently $$Ax-b \leq spec-(Ax-b) \leq spec$$

is sought, which always has a solution given a suitable spec predefinition. The inequality sign ≤ should in this case be interpreted in vector-valued fashion. This affords the possibility of interpreting the inequality (b) as a side condition of the minimization problem $$\min c^t x \quad (b')$$

where the latter with a selectable weight vector c affords the possibility of influencing the relative manipulator movements $x = (x_1, \ldots, x_n)$.

Linear programming methods are used as an algorithm for solving (b), (b'). Besides the "Simplex method" (see Jarre, F., Stoer, J., "*Optimierung*" ["*Optimization*"], Springer, 2004 or more general "active set methods" of linear programming, the "interior point method" is used (see Fiacco, A. V., McCormick, G. P., "*Nonlinear Programming: Sequential Unconstrained Minimization Techniques*", John Wiley & Sons, 1968, Karmarkar, N., "*A new polynomial-time algorithm for linear programming*", Combinatorica 4 1984), no. 4, 373-395, or Mehrotra, S., "*On the implementation of primal-dual interior point method*", SIAM J. Optim. 2 1992), no. 4, 575-601. The latter guarantees polynomial convergence, in contrast to the Simplex method. These sources shall hereby be incorporated by reference within their full scope in this application.

In the case of the "interior point method", (b') is replaced by $$\min c^t x - \mu \sum_{i=1}^{n} \ln x_i \quad (c')$$

while the side conditions (b) are maintained. (c') is solved with the aid of the Newton method, in which case $\mu \to 0$ holds true in the course of the (iterative) method depending on the results of the Newton method.

As a further alternative to the minimization problem (b), (b') and the linear programming used for solving said problem, quadratic programming is used. This involves solving, instead of (b') the problem $$\min \frac{1}{2} x^t H x + c^t x \quad (d')$$

under the side conditions $$Ax-b \leq spec-(Ax-b) \leq spec \quad (d)$$

The matrix H is again chosen in a suitable manner, e.g. the identity matrix.

The methods from Dantzig-Wolfe and alternatively from Hildreth-d'Esopo or Quadprog are used for solving (d), (d'). Cf. C. Hildreth, A quadratic programming procedure, Naval Res. Logistics Quart. 4 1957) 79-85 (Erratum, ibid., p. 361). D. A. D'Esopo, A convex programming procedure, Naval Res. Logistics Quart. 6 1959) 33-42. The Simplex Method for Quadratic Programming Philip Wolfe Econometrica, Vol. 27, No. 3 (July, 1959), pp. 382-398. Gill, P. E. and W. Murray, and M. H. Wright, *Practical Optimization*, Academic Press, London, UK, 1981. These sources shall hereby be incorporated by reference within their full scope in this application.

In contrast to the problem (b), (b'), the condition of the problem (d) and (d') incorporates not only the matrix of the side conditions A, but also the condition of the matrix H. The following orders of magnitude are usually found:
Condition of the matrix H in (d): 3.8E12
Condition of the entire side conditions in (d'): 3.2E5

A further method used for solving (d) and (d') is the "Downhill Simplex Method", cf. Nelder, J. A., R. Mead, "*A Simplex Method for Function Minimization*", Computer J. 7 1965), pp 308-313, which shall hereby be incorporated by reference within its full scope in this application. This method is a derivative-free method which generally has linear convergence and is numerically robust. However, as a result of manipulator restrictions, predefined edges of the adjustment polyhedron can be implemented only inadequately.

Besides these methods mentioned, even further methods are used such as e.g. simulated annealing, cf. Dueck et. al., "Threshold Accepting: A General Purpose Optimization Algorithm Appearing superior to Simulated Annealing", Journal of Comp. Physics, Vol. 9, pp. 161-165, 199, or evolutionary (e.g., genetic) algorithms, which shall hereby be incorporated by reference within its full scope in this application. The disadvantage of these methods is firstly they are generally stochastic in nature and secondly the convergence toward the global minimum is not necessarily provided.

Hitherto, the problem area has remained open as to how the spec predefinitions should be chosen in order that a solution to the inverse problem can be ensured in the first place.

For this purpose, it is possible to modify the problem (b) and (b') to $$\min t, |Ax-b| \leq t \text{ spec} \tag{e}$$

spec accordingly becomes a variable spec: t spec This problem can be solved with the aid of linear programming. A disadvantage of this method is that it constrains a purely linear problem and does not permit simple regularization (see Gembicki, F. W., "*Vector Optimization for Control with Performance and Parameter Sensitivity Indices*", Ph.D. Thesis, Case Western Reserve Univ., Cleveland, Ohio, 1974 and U.S. Pat. No. 7,301,615).

Methods of nonlinear programming are also alternatively used for solving the problems (a)-(e). In this respect, see Gill, P. E., W. Murray, M. H. Wright, "*Numerical Linear Algebra and Optimization*", Vol. 1, Addison Wesley, 1991 and K. Schittkowski (1981): The nonlinear programming method of Wilson, Han and Powell. Part 1: Convergence analysis, Numerische Mathematik, Vol. 38, 83-114, Part 2: An efficient implementation with linear least squares subproblems, Numerische Mathematik, Vol. 38, 115-127 which shall hereby be incorporated by reference within their full scope in this application.

The following method, called "active constraints method" hereinafter, is also used as a further variant: the matrix $\overline{A}_k$ of the "active constraints" is formed iteratively from the set of the above side conditions. This is carried out inductively as follows:

Induction Basis:

Is the start state if the latter meets the side conditions. Should this not be the case, then the side conditions are weakened until this is the case. The adjustment polyhedron is as it were "inflated". This inflation is possible since the specifications are specified with the aid of the Gembicki variables t, i.e. it is possible to relax t such that the side conditions are fulfilled. For the purpose of generating a start state, alternatively it is possible to use, e.g., Tikhonov regularization with stronger movement distance restriction. Alternatively, it is even possible to take the unoptimized state as a start state, in which case a higher number of iterations will be necessary in order to attain the vicinity of the optimum.

Indication Step:

Suppose then that the state $x_k$ meets all the side conditions. Some side conditions are met almost exactly, that is to say that in (d) "=" holds true apart from a small deviation $\epsilon$, e.g., $\epsilon < 1E-8$. These are the active constraints. The space that is orthogonal to the active constraints with respect to the Euclidean scalar product is then formed and the minimization problem (d') is solved in said space. If actuating distances of the manipulators that are obtained in this way are not within the permitted range, then they are suitably trimmed at the edge of the permitted range, whereby the state $x_{k+1}$ that is permissible with respect to the actuating distances of the manipulators is attained.

Details concerning this induction step can be gathered e.g. from W. Alt, "*Nichtlineare Optimierung*" ["*Nonlinear optimization*"], Vieweg 2002. This source shall hereby be incorporated by reference within its full scope in this application.

Consequently, a sequence $(x_k)$ is constructed which converges toward the global optimum x. In this respect, also cf. (Gill, P. E., W. Murray, M. H. Wright, "*Numerical Linear Algebra and Optimization*", Vol. 1, Addison Wesley, 1991). Besides the traditional QPSOL, a Fortran program for quadratic programming, LSSOL, in particular, shall be mentioned here (cf. the program package http://www.sbsi-sol-optimize.com/asp/sol_product_lssol.htm from Stanford Business Software Inc.).

As an alternative, instead of the start state, the result of the calculation of a solution using linear programming, as is proposed as a standard method in the literature, could also be utilized as an induction basis. This is even absolutely necessary if Gembicki variables are not used. On account of the unsatisfactory and poorly estimable convergence behavior of linear programming, this is disadvantageous for real-time optimizations.

Genetic or rather, generally, evolutionary algorithms can also be used for solving the inverse problem. They are characterized in that they iteratively run through the phases of initialization, evaluation, selection, recombination and mutation until a suitable termination criterion is fulfilled.

The numerical methods specified above are not only used in pure form, rather they can also be changed for each necessary solution to an inverse problem. In particular, this change, in the case of iterative methods, can also be performed in the form of approximations to the solution which would bring no a priori undershooting of the overshot upper bounds, if, in the case of such an approximation, a change to an alternative method promises a better convergence.

The optimization methods already listed have strengths, but also weaknesses. These are specifically:

Quadratic optimization without side conditions (a), (a'), (a''), (a'''): owing to a lack of side conditions only implicit access to a large portion of the variables to be optimized (e.g., Zernike-Specs) and also the risk of violation of the movement distance restrictions for the manipulator movements Linear programming (b'), (c'): quadratic optimization terms cannot be taken into account Quadratic programming (d'): nonlinear side conditions cannot be taken into account; the question regarding optimum spec predefinitions is open Therefore, there is the additional problem of how the necessary regularization is suitably integrated into the non-trivial optimization method to be chosen.

What is disadvantageous about the idea of F. Gembicki is that on the one hand it is an extension of the linear programming—without any direct possibility for regularization—and on the other hand it only optimizes an individual, global spec.

On the one hand, this can lead to very large, virtually impracticable movement distances; on the other hand, all the specs are deliberately exhausted to the permitted limit. This can have the effect that, for the purpose of a minimum global spec improvement, some specs are exhausted considerably further.

The disclosure uses a further algorithm, which combines the positive properties of the algorithms mentioned above whilst avoiding their disadvantages. It is outlined as follows—the term "multivariable specs" is defined further below.
1. Return of a quadratic optimization problem under linear and quadratic side conditions to the quadratic programming
2. Simplification of the start value finding by use of variable and/or multivariable specs
3. Tikhonov regularization with quadratic programming
4. Adaption of the "active constraints method" to multivariable specs and application to quadratic programming Specifically, besides the matrix A, comprising the sensitivities of the manipulators, the upper bounds, referred to as specs, are defined in the following manner:

Side Conditions of Linear Type:
1) Zernike specs, characterized by a vector with spec predefinition $spec_A$
2) determined (measured and/or (partly) extrapolated) error, characterized by a vector with spec predefinition b
3) maximum movements of manipulators, characterized by a vector with spec predefinition $spec_V$ and a current movement distance state $v_b$. It can happen here that the actual maximum movements are to be calculated from the actuating distances with the aid of a matrix V (e.g. in the case of heat and temperature side conditions)
4) lithographic system variables such as e.g. overlay or best focus, characterized by a matrix L and a vector with spec predefinition $spec_L$
5) further linear optimization side conditions, characterized by a matrix M and a vector with spec predefinition $spec_M$ Side Conditions of Nonlinear Type:
6) Fading specs, characterized by the positive definite Hermitian matrix F with spec predefinition $spec_F$
7) RMS specs, characterized by the positive definite Hermitian matrix R with spec predefinition $spec_R$
8) grouped RMS spec, characterized by the positive definite Hermitian matrix G with spec predefinition $spec_G$
9) further quadratic optimization side conditions, characterized by a matrix Q and a vector with spec predefinition $spec_Q$ The optimization problem to be considered therefore has the following maximum possible side conditions:

$$Ax-b \leq spec_A$$

$$-Ax+b \leq spec_A$$

$$L(Ax-b) \leq spec_L$$

$$-L(Ax-b) \leq spec_L$$

$$M(Ax-b) \leq spec_M$$

$$-M(Ax-b) \leq spec_M$$

$$V(Ax-v_b) \leq spec_V$$

$$-V(Ax-v_b) \leq spec_V$$

$$x^t Fx - 2b^t Fx + b^t b \leq spec_F$$

$$x^t Rx - 2b^t Rx + b^t b \leq spec_R$$

$$x^t Gx - 2b^t Gx + b^t b \leq spec_G$$

$$x^t Qx - 2b^t Qx + b^t b \leq spec_Q \quad (f)$$

The upper and lower limits do not have to be symmetrical, for example. One-sided limits may also be necessary.

Firstly, a suitable minimization function is additionally chosen freely. However, this can have the effect that the calculated solution x has a very large norm and thus has very large manipulator movements. This has the effect that large changes to the manipulator actuating distances have to be made in the case of small changes in the objective state. This can greatly impair practical implementability.

The use of Tikhonov regularization with a suitably chosen weight matrix $W_{Tikh}$ solves this problem. The weight matrix $W_{Tikh}$ is preferably generated by identical weighting of different degrees of freedom of identical type. The minimization problem, with the above side conditions being maintained, then reads $$\min x^t W_{Tikh}{}^t W_{Tikh} x \quad (f')$$

Linear programming cannot be applied to this statement of the problem owing to the nonlinear optimization term in (f'). On account of the nonlinear side conditions from (f)—the last four lines thereof—the advantages of quadratic programming (good and stable convergence toward the minimum, selection from various fast algorithms) likewise cannot initially be utilized.

Linear and nonlinear side conditions are present, then, in (f). Besides the two sources for nonlinear programming as specified above, the problem (f) can be solved with the aid of SQP, sequential quadratic programming. For details see W. Alt, "*Nichtlineare Optimierung*", Vieweg 2002, which is incorporated by reference within its full scope. The method of sequential quadratic programming is based on iteratively locally linearizing the optimization problem and applying the above-described linear programming to this linearization in order thus to obtain a new start point for the linearization. The method of SQP additionally advantageously permits side conditions (f) and merit function (f') to be formulated with the aid of arbitrary functions.

As an alternative, the quadratic side conditions in (f) can be replaced as followed by a multiplicity of linear side conditions, such that the problem resulting therefrom can be solved using the quadratic programming described further above. The quadratic side conditions span a respective ellipse which can be described by approximation with any desired accuracy by the section of a finite number of hyperplanes (given by a respective linear side condition).

A further method for resolving the side conditions (f) is explained below, this method being very advantageous with regard to the computational speed in comparison with SQP.

With the aid of Lagrange multipliers (see Gill, P. E., W. Murray, M. H. Wright, "*Numerical Linear Algebra and Optimization*", Vol. 1, Addison Wesley, 1991 the problem (f), (f') is reformulated in a canonical manner as follows:

Solve $$\min x^t(W_{Tikh}{}^t W_{Tikh} + W_F{}^t F W_F + W_R{}^t R W_R + W_G{}^t G W_G + W_Q{}^t Q W_Q)x + 2(w_R f_R + w_G f_G + w_F f_F + w_Q f_Q)^t x \quad (f')$$

under the side conditions $$Ax-p \leq spec_A$$

$$-Ax+p \leq spec_A$$

$$L(Ax-b) \leq spec_L$$

$-L(Ax-b) \leq \text{spec}_L$ $M(Ax-b) \leq \text{spec}_M$ $-M(Ax-b) \leq \text{spec}_M$ $V(Ax-v_b) \leq \text{spec}_V$ $-V(Ax-v_b) \leq \text{spec}_V$ (f''')

In this case, $W_F$, $W_R$ and $W_G$ are suitable weight matrices for the quadratic component. These additional weight matrices can preferably also be multiplicative multiples of the unit matrix. Suitable additional weight matrices for the linear component are designated by $w_F$, $w_R$ and $w_G$.

Preferably, the text below additionally provides a solution to the problem that on the one hand the predefined spec values in the side conditions are utilized up to the limit, but on the other hand no solution can be found in the case of excessively hard, that is to say non-relaxable, spec predefinitions, since the convex set spanned by the side conditions is empty. The following procedure will be referred to as "multivariable specs".

In this respect, let $\tilde{x}:=(x,t)^t$. In this case, the vector t can be formed from a high-dimensional space such as one having for instance more than 10 dimensions, or more than 100 dimensions or even more than 1000 dimensions. As above, the manipulator actuating distances to be optimized are designated by x and the Gembicki variables to be optimized are designated by t. A suitable spec matrix adapted to the Gembicki variables is designated by $\widetilde{\text{spec}}$; it emerges from the vector spec. For a suitable weight matrix $W_{Gemb}$ for the Gembicki variables, the optimization problem consists in minimizing $$\min \tilde{x}^t(W_{Gemb}{}^t W_{Gemb} + W_{Tikh}{}^t W_{Tikh} + W_F{}^t F W_F + W_R{}^t R W_R + W_G{}^t G W_G)\tilde{x} + 2(w_R f_R + w_G f_G + w_F f_F)^t \tilde{x}$$ (f'')

under the linear side condition $Ax - p \leq \widetilde{\text{spec}}_A t$ $-Ax + p \leq \widetilde{\text{spec}}_A t$ $L(Ax-b) \leq \widetilde{\text{spec}}_L t$ $-L(Ax-b) \leq \widetilde{\text{spec}}_L t$ $M(Ax-b) \leq \widetilde{\text{spec}}_M t$ $-M(Ax-b) \leq \widetilde{\text{spec}}_M t$ $V(Ax-v_b) \leq \widetilde{\text{spec}}_V t$ $-V(Ax-v_b) \leq \widetilde{\text{spec}}_V t$ (f')

The matrices occurring therein are suitably adapted, in comparison with the embodiment above, in accordance with the variable extension now carried out. It is likewise possible to provide a portion of the specified side conditions with Gembicki variables t, while the other side conditions are provided with hard spec limits, that is to say spec limits not multiplied by the parameter t. It is likewise possible to provide some, a plurality or all of the Gembicki variables multiplicatively with an additional Gembicki variable, which regulates the size of said Gembicki variables. This can be continued iteratively in nested fashion. It is likewise conceivable to provide specifications both with a hard spec and using an additional specification with a Gembicki variable. This advantageously brings about the economical spec exhaustion in combination with adherence to the hard spec within pre-defined limits. An inflation of the adjustment polyhedron is now possible in different ways: add an additional, over-all Gembecki variable and relax it until all side conditions are fulfilled or relax only those already used Gembecki variables where the side conditions are not fulfilled. The latter method being possible to use in case of all hard side conditions are fulfilled.

The formulation of the inverse problem with the aid of the Gembicki variables, as in the case of (e), or the multivariable specs, as in the case of (f'') in conjunction with (f'''), has the additional advantage that this can ideally be combined with Quadprog for solving the problem. The algorithm of Quadprog presupposes that a start state which meets the side conditions can be specified. If said start state is determined using linear programming, this can already exceed the permissible computation time before a genuine minimization of the functional actually occurs at all. With the aid of the Gembicki variables, said state can be attained by the "inflation" of the adjustment polyhedron as already mentioned. The start point for Quadprog is thus attained by a softening of the specs and not by an alteration of the manipulator setting. An additionally afforded advantage of this combination of Quadprog and the formulation of the inverse problem with the aid of the Gembicki variables is a "numerical consistency of the manipulator movements" that is inherent to the algorithm. To put it more precisely: since the instantaneous manipulator movements are identified as good enough for the start value of Quadprog for the current inverse problem, the solution when using Quadprog numerically initially also does not depart from the optimum solution of (e), or (f'') in conjunction with (f'''), that is finally determined by Quadprog. This saves computational time in addition to the above statements.

The inverse problems to be solved generally occur in such close succession temporally that the case can arise that a new inverse problem is to be solved before the manipulators attain the movements determined in accordance with the solution to the preceding inverse problem. In accordance with the above method, the manipulators would be stopped and the current position would be used as a start value, as described above. However, since it can be assumed that the image aberrations to be compensated for change continuously in small steps, the successive inverse problems to be solved also have neighboring solutions. Therefore, as an alternative, instead of the current positions of the manipulators, the movements determined in accordance with the preceding inverse problem or the movements determined in accordance with a preceding calculation step, in case of existence, are used as the start value for Quadprog for solving the new inverse problem.

This overlap can also concern more than two inverse problems: the manipulators are moved in the direction of the solution $x_n$ to the n-th inverse problem. Before all the manipulators attain their end positions in accordance with said solution $x_n$, the subsequent inverse problems n+1, . . . , n+m accumulate. For the start value of Quadprog for solving the n+j-th inverse problem, the solution to the n+j−1-th problem, as described above, using polyhedron inflation is then used. This procedure will be referred to as "cascading Quadprog".

In the case of an iterative solution to the inverse problem, the following property of the fine adjustment is also advantageously utilized: in the case of heating of the objective, the image aberrations initially vary greatly. With increasing heat absorption, however, a saturation state is established which only varies slightly from die to die. Furthermore, the solution to the adjustment problem is continuously dependent on the varying boundary conditions such as the heat input, for example. This has the consequence that even in the case of an only approximate numerical solution to the inverse problem and thus suboptimal regulation of the manipulator system, these ensure compliance with the upper bounds of the specification.

This inertia of the heat absorption also has disadvantages, however, in the fine adjustment. If, during operation of the projection exposure apparatus, the illumination setting or the reticle is changed or if a new batch is begun, then a virtually discontinuous variation of the image aberration profile occurs. Therefore, the solution to the inverse problem no longer necessary lies in the vicinity of the previous manipulator movements. In such a case, a relatively sluggish manipulator, such as a manipulator which applies heat to an optical element, for example, can require an unreasonable time period to attain the movement resulting from the new solution to the inverse problem. This problem can be solved in two ways:

1. The sluggish manipulator is specified with regard to its movements between expected discontinuities in the image aberration profiles in such a way that its maximum movements to be used correspond to its maximum possible movements by a mean value not amounting to 100%. Values of 80%, or 50% or 20%, or 10%, of the maximum possible movements are advantageous here.
2. The movement distance to be expected in the future and its future direction are determined for the sluggish manipulator using a prediction model, a short-term impairment of the present image aberration level is afforded tolerance by increasing the specifications, for example by 50%, or 20%, or 15%, or 10%, or 5%, or 2%, or 1% and the sluggish manipulator is moved in its future direction as far as is permitted by the reductions of the specifications. In this case, "short-term" should be understood to mean a time interval which extends into the future and which amounts for example to 60000 ms, or 20000 ms, or 10000 ms, or 5000 ms, or 1000 ms, or 200 ms, or 20 ms. Within this time interval, the reduced specification has to be guaranteed by the prediction model. In this case, the movement of the sluggish manipulator in its future direction is generally accompanied by the movement of less sluggish manipulators. Particularly advantageous here are the pairings (50%, 60000 ms), (20%, 20000 ms), (15%, 10000 ms), (10%, 5000 ms), (2%, 1000 ms), (2%, 200 ms), (1%, 20 ms) for increasing the specifications in association with the time interval reaching into the future, for which these have to be ensured.

What are appropriate for the image aberration profile, in the case of point 2. above, are in particular the image aberrations overlay, best focus, fading both for core structures and for peripheral structures, and individual Zernike coefficients, and also rms, grouped rms and residual rms, and also any desired subsets thereof.

Previously, individual methods for solving (II) were presented. The manipulator actuating distances were subdivided merely using a distinction between fast and slow manipulators. However, the above methods can also be combined. This procedure is referred to as "toggling".

In the case of two algorithms, toggling is manifested as follows:

With a first algorithm, $Alg_1$, at high speed a first manipulator adjusting distance $x_1$ is identified, which solves the minimization problem (a)–(a') at high speed, but only yields an a priori suboptimal solution, i.e. $\min\|Ax-b\|$ is not necessarily attained by $x=x_1$ and the residual image aberration $b_1=Ax_1-b$ is not minimal with regard to the norm used. However, $Alg_1$ ensures that a solution which does not entail any overshootings of the individual manipulator ranges is determined in the available time. By way of example, Tikhonov regularizations in accordance with (a")–(a') are employed as $Alg_1$. In this case, the parameter $\gamma$ for this Tikhonov regularization is chosen in such a way that no overshootings of the respective manipulator ranges occur.

With a second algorithm, $Alg_2$, a rather sluggish, not precisely predictable convergence behavior of the minimization problem (a)–(a') is accepted for its solution $x_2$, where the main emphasis is on the optimality of the solution $x_2$, that is to say that a smaller norm of the residual image aberration $b_2$ can generally be expected for $b_2=Ax_2-b$. By way of example, the "active constraints method" or the "Gembicki algorithm" is used as $Alg_2$.

These two algorithms are then "toggled", that is to say that $Alg_1$ and $Alg_2$ are used in parallel and the results of $Alg_2$ are employed precisely when $b_2$ is less than $b_1$ with regard to its norm and at the same time its solution $x_2$ does not leave the manipulator range. If this is not the case, it is possible to have recourse to the solution $x_1$ of $Alg_1$.

If the decision is made in favor of $Alg_2$, then after a new image aberration measurement the difference between image aberration determined and a newly measured image aberration can additionally be subsequently optimized in the remaining time and with the aid of $Alg_1$.

This method is refined further if $Alg_1$ is applied iteratively until $Alg_2$ has its result. Then, as an alternative, an image aberration prediction is made in each iteration step and the fast algorithm $Alg_1$ is applied to the new image aberrations.

This parallel solution of inverse problems, or parallelization of the minimum search, is preferably used in the context of a plurality of computing processors. A plurality of such processors can also serve to ensure that, within an individual algorithm, too, a numerical parallelization is carried out in the case of the matrix multiplications necessary there. In particular, the Strassen algorithm is used. Cf. Volker Strassen: *Gaussian Elimination is not Optimal*, Numer. Math. 13, pp. 354-356, 1969 which shall hereby be incorporated by reference within their full scope in this application.

Figure 4:
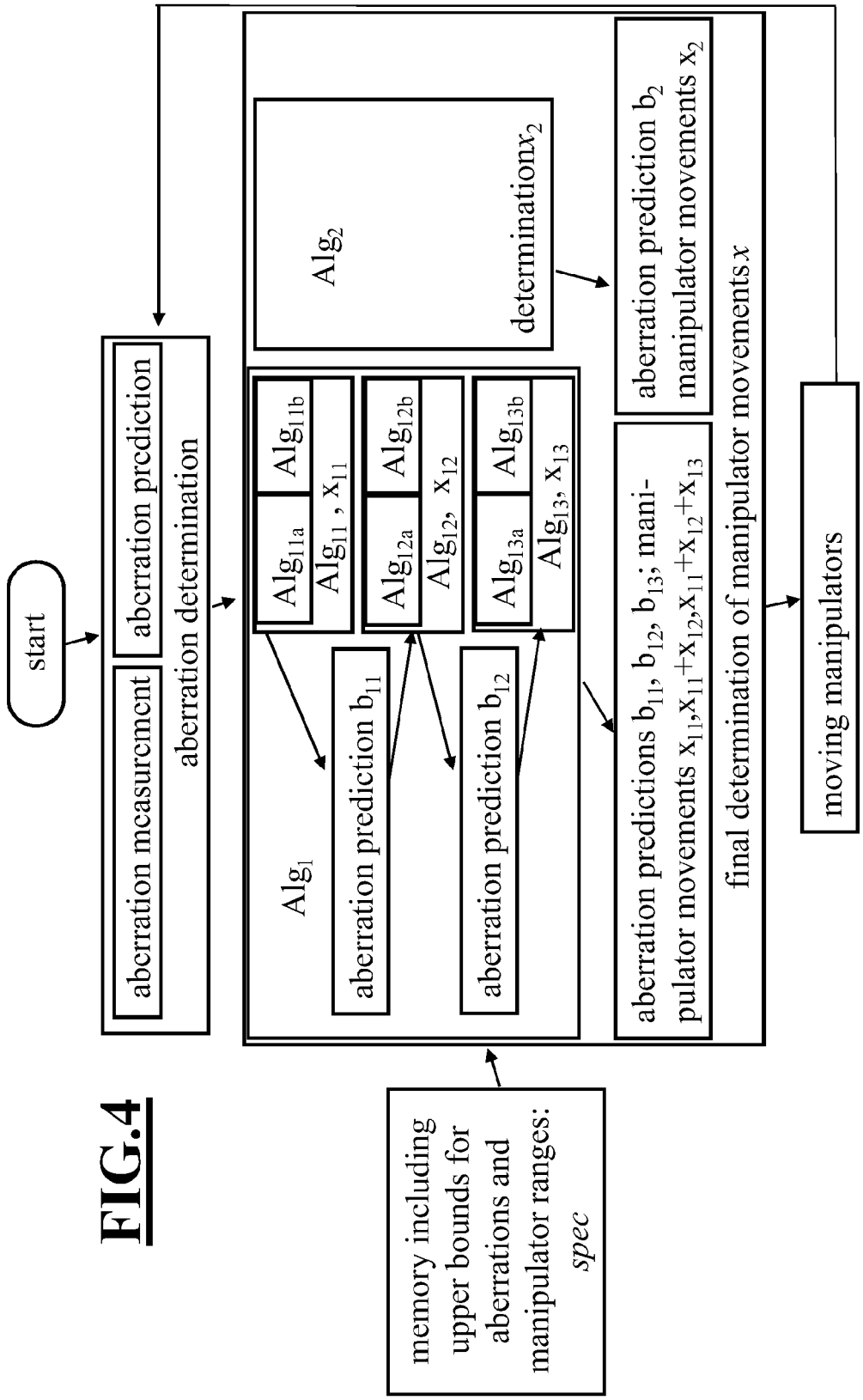
FIG. 4: shows a basic schematic diagram of an adjustment algorithm of a second type

FIG. 4 shows a combination of these two parallelizations. Two algorithms $Alg_1$ and $Alg_2$ for the minimum search are executed in parallel, $Alg_1$ comprising an iterative sequence of algorithms $Alg_{1i}$, i=1, 2, 3, which are in turn subdivided into the algorithms $Alg_{1ia}$ and $Alg_{1ib}$, i=1, 2, 3, that are to be numerically processed in parallel. After $Alg_{11}$ has ended, the initially resulting manipulator movements $x_{11}$ become the basis of an image aberration calculation $b_{11}=Ax_{11}-b$, which in turn supplies the input for the application of $Alg_{12}$, subdivided into $Alg_{12a}$ and $Alg_{12b}$. Triple iteration thus yields $$b_{11}=Ax_{11}-b,\ b_{12}=Ax_{12}-b_{11},\ b_{13}=Ax_{13}-b_{12}$$

and $$b_2=Ax_2-b.$$

Afterwards, the results $x_{11}$, $x_{11}+x_{12}$ and $x_{11}+x_{12}+x_{13}$ and $x_2$ are compared with regard to range overshootings and residual image aberrations $b_{11}$, $b_{12}$, $b_{13}$ and $b_2$ and the optimum solution, that is to say the one which results in a minimum residual image aberration without range violations, is output as manipulator movement distance x.

Figure 5:
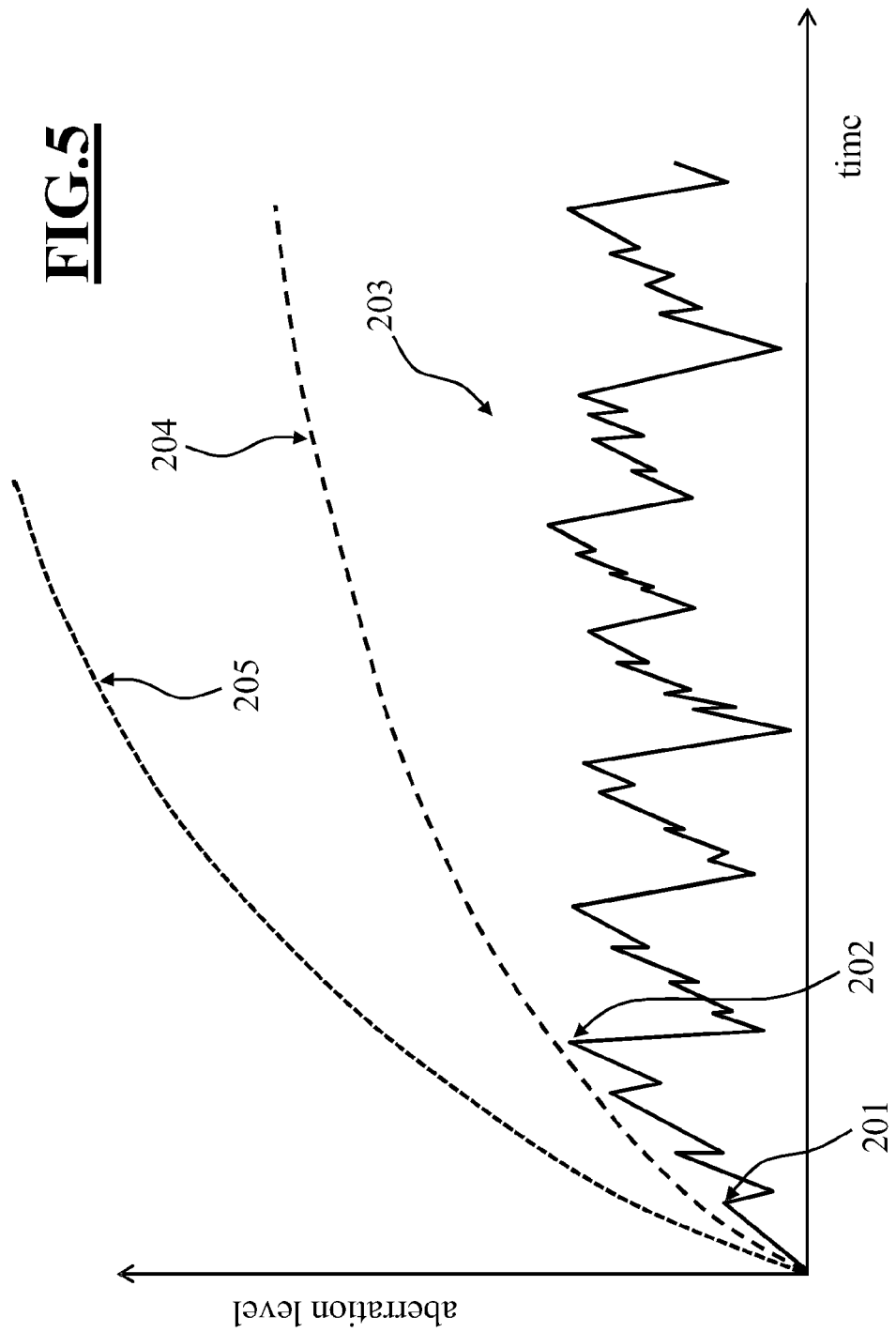
FIG. 5: shows an illustration of the performance of a projection exposure apparatus when using toggling for solving the inverse problem

Optionally, the results $x_{11}$ and $x_{11}+x_{12}$ can be reached by the manipulators in the meantime of solving $b_{12}=Ax_{12}-b_{11}$ and $b_{13}=Ax_{13}-b_{12}$, respectively in order to ensure continuously small image aberrations. This is illustrated in FIG. 5, in which time is plotted on the abscissa and the image aberration level is plotted on the ordinate. $Alg_1$ yields its first result at the point 201 and an adjustment of the manipulators by $x_{11}$ subsequently lowers the image aberration level. The latter subsequently deteriorates again and the manipulators are subsequently moved by $x_{12}$ to the position $x_{11}+x_{12}$. This is continued until $Alg_2$ has terminated and, in the case illustrated here, yields a lower image aberration level using its solution $x_2$. This is implemented at the point 202. An approximately cyclic profile 203 of the image aberration level results. The curve 204 shows for comparison the expected profile of the image aberration level in the case where only $Alg_1$ is used. The curve 205 shows for comparison an expected profile of the image aberration level in the case where no manipulator system is used.

In particular, Tikhonov regularizations in accordance with (a'')–(a') with a varying parameter $\gamma=\gamma(i)$ are used as algorithms $Alg_{1i}$.

If an algorithm for solving the inverse problem does not attain the predefined specifications spec, then the latter are relaxed, as already indicated. Besides a relation by a predetermined percentage such as 10%, 50% or 100%, a so-called "joker regulation" is used. In the case of the latter, individual image aberrations are combined in groups, which are then relaxed jointly in the sense of a summation. Quantitatively, the same gradations 10%, 50% or 100% are used in this case. Appropriate groups include, in particular, Zernike coefficients having an identical azimuthal behavior. By way of example, all the Zernike coefficients $a_i$ with respect to the Zernike polynomials $\{Z_5, Z_{12}, Z_{21}, \ldots\}$ which are of the type $P(\rho)\cos(2\phi)$; P polynomial, that is to say behave azimuthally like $\cos(2\phi)$, form such a group. The relaxation for this group is then given as above by a percentaged relaxation of $$\sum_{i=5,12,21,\ldots} |a_i|.$$

The background for the choice of exactly such groups is based on the fact that the intention primarily is to prevent image aberrations that have an identical azimuthal behavior from cumulating.

Figure 7:
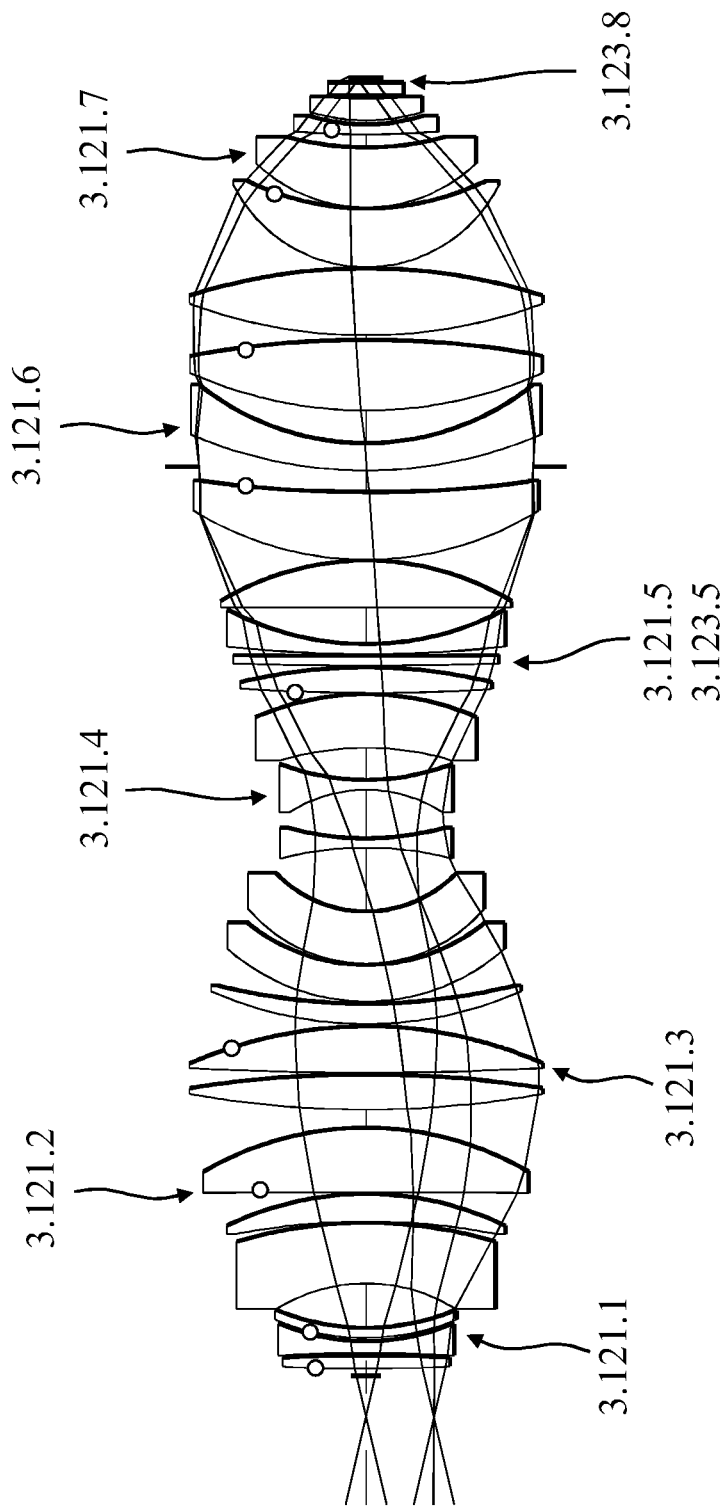
FIG. 7: shows a projection apparatus of a first type for microlithography with objective and manipulator system

FIG. 7 shows a distribution of the manipulators on the basis of an objective design from the prior art. The manipulators are listed in the following table:

TABLE 1

| Manipulator distribution with regard to the exemplary embodiment from FIG. 7. ||
| --- | --- |
| 3.121.1 | XY |
| 3.121.2 | Z |
| 3.121.3 | XY |
| 3.121.4 | XYZ tilt |
| 3.123.5 | Exchange/Aspherization |
| 3.121.5 | Heating/Cooling |
| 3.121.6 | Z |

TABLE 1-continued

| Manipulator distribution with regard to the exemplary embodiment from FIG. 7. ||
| --- | --- |
| 3.121.7 | XY |
| 3.121.8 | Exchange/Aspherization |

In this case:
- "Z" is understood as displacement in the direction of the optical axis of the objective (one degree of freedom)
- "XY" is understood as displacements in the directions perpendicular to the optical axis of the objective (two degrees of freedom)
- "XYZ tilt" is understood as displacement in the direction of the optical axis of the objective, in the directions perpendicular to the optical axis of the objective and as a tilt about two axes perpendicular to the optical axis of the objective (five degrees of freedom)
- "Exchange/Aspherization" are 36 or 49 or 100 or more degrees of freedom since a freeform surface calculated from such a number of basis functions is generally used for the aspherization; in addition, these functionalities can be combined. This is the case for example with a pair of Alvarez plates configured in exchangeable fashion: in this case, two aspherized plane plates are displaced relative to one another. In this respect, also cf. EP851304A2.
  The above number of degrees of freedom follows the square numbers and follows the orthonormal system of Zernike polynomials which is suitable not only for describing wavefront deformations but also for describing aspheres. Besides the Zernike polynomials, splines or wavelets are also used for describing aspheres and give rise to different numbers of degrees of freedom.
  In a manner not illustrated here, in the case of the initial adjustment, this aspherization takes place not only on one or both optically active surfaces of plane plates but also on one or both optically active surfaces of some of the optical elements, preferably lenses or mirrors.
- "Heating/Cooling" can be interpreted as p=n×m degrees of freedom, depending on how many locations are used for heating and/or cooling. Use is normally made of n=4=m, n=7=m, n=10=m, n=15=m, or n=20=m.

The manipulators 3.121.5 and 3.123.5 can be used alternatively or in combination at the plane plate.

Between 85 and 313 degrees of freedom are accordingly obtained, wherein the manipulators of the type "Z", "XY", "XYZ", "XYZ tilt" and also the manipulators of types "Heating/Cooling" and "Deforming" have to be driven and regulated in real time and the inverse problem (II) is solved using the techniques described above.

Finally, a distinction is made between manipulators which are provided for the initial, repair and fine adjustment. By way of example, individual Z and XYZ tilt manipulators can be provided for the initial, repair and fine adjustment and some different individual XY manipulators can be provided just for the initial adjustment.

Table 2 lists the design data of the exemplary embodiment concerning FIG. 7. The design corresponds to the seventh exemplary embodiment from WO2003075096. This involves an objective for microlithography having a rotationally symmetrical inline design and a maximum numerical aperture of 0.9. It is corrected on an on-axis object field up to a maximum field height of 56.08 mm at an operating wavelength of 193 nm. The imaging scale is −0.25.

TABLE 2

Design data concerning the exemplary embodiment from FIG. 7.

NA: 0.9
2Y': 28.04

Wavelength:
193.37 nm
beta: 0.25

| FN | Radius | Thickness/Distance | Medium | Refractive index at 193.37 nm | 1/2 free diameter |
|---|---|---|---|---|---|
| 0 | 0.000000 | 0.000000 | AIR | 1.00030168 | 56.080 |
| 1 | 0.000000 | 40.078816 | AIR | 1.00030168 | 56.080 |
| 2 | 6478.659586 | 10.843586 | SIO2 | 1.5607857 | 65.807 |
| 3 | −1354.203087 | 2.423172 | N2 | 1.00029966 | 66.705 |
| 4 | −1087.803717 | 9.621961 | SIO2 | 1.5607857 | 67.029 |
| 5 | 183.366809 | 2.746191 | N2 | 1.00029966 | 70.249 |
| 6 | 206.367009 | 8.085674 | SIO2 | 1.5607857 | 71.462 |
| 7 | 193.387116 | 36.794321 | N2 | 1.00029966 | 72.483 |
| 8 | −140.799170 | 50.095072 | SIO2 | 1.5607857 | 73.484 |
| 9 | −373.463518 | 1.000056 | N2 | 1.00029966 | 103.736 |
| 10 | −561.452806 | 22.561579 | SIO2 | 1.5607857 | 107.508 |
| 11 | −263.612680 | 1.000757 | N2 | 1.00029966 | 111.562 |
| 12 | −49392.564837 | 53.841314 | SIO2 | 1.5607857 | 124.515 |
| 13 | −266.359005 | 15.247581 | N2 | 1.00029966 | 130.728 |
| 14 | −40.618795 | 29.011390 | SIO2 | 1.5607857 | 141.816 |
| 15 | −926.722503 | 1.005611 | N2 | 1.00029966 | 142.120 |
| 16 | 2732.904696 | 38.725042 | SIO2 | 1.5607857 | 141.999 |
| 17 | −356.203262 | 2.005496 | N2 | 1.00029966 | 141.858 |
| 18 | 318.151930 | 16.617316 | SIO2 | 1.5607857 | 124.740 |
| 19 | 513.819497 | 1.562498 | N2 | 1.00029966 | 122.663 |
| 20 | 171.455701 | 30.277694 | SIO2 | 1.5607857 | 111.385 |
| 21 | 154.841383 | 1.064446 | N2 | 1.00029966 | 98.077 |
| 22 | 127.756842 | 43.191495 | SIO2 | 1.5607857 | 94.695 |
| 23 | 104.271940 | 52.476004 | N2 | 1.00029966 | 74.378 |
| 24 | −283.692700 | 8.000000 | SIO2 | 1.5607857 | 68.565 |
| 25 | 242.925344 | 39.949820 | N2 | 1.00029966 | 64.404 |
| 26 | −117.414779 | 8.181192 | SIO2 | 1.5607857 | 63.037 |
| 27 | 197.144513 | 26.431530 | N2 | 1.00029966 | 69.190 |
| 28 | −244.477950 | 44.225451 | SIO2 | 1.5607857 | 71.085 |
| 29 | −230.356430 | 1.409104 | N2 | 1.00029966 | 88.427 |
| 30 | 1472.096761 | 21.137737 | SIO2 | 1.5607857 | 99.340 |
| 31 | −450.715283 | 1.259334 | N2 | 1.00029966 | 101.126 |
| 32 | 3573.378947 | 8.391191 | SIO2 | 1.5607857 | 105.206 |
| 33 | 7695.066698 | 1.258010 | N2 | 1.00029966 | 106.474 |
| 34 | 1029.326175 | 8.390466 | SIO2 | 1.5607857 | 108.186 |
| 35 | 243.058844 | 29.823514 | N2 | 1.00029966 | 112.152 |
| 36 | 29057.985214 | 38.911793 | SIO2 | 1.5607857 | 114.058 |
| 37 | −232.205631 | 1.000000 | N2 | 1.00029966 | 116.928 |
| 38 | 270.144711 | 55.850950 | SIO2 | 1.5607857 | 139.162 |
| 39 | 1183.955772 | 20.935175 | N2 | 1.00029966 | 138.048 |
| 40 | 0.000000 | −2.958031 | N2 | 1.00029966 | 138.244 |
| 41 | 368.838237 | 22.472410 | SIO2 | 1.5607857 | 141.049 |
| 42 | 220.058627 | 26.974362 | N2 | 1.00029966 | 137.707 |
| 43 | 355.728536 | 58.022036 | SIO2 | 1.5607857 | 140.923 |
| 44 | −861.478061 | 4.104304 | N2 | 1.00029966 | 142.103 |
| 45 | 420.713002 | 55.049896 | SIO2 | 1.5607857 | 142.502 |
| 46 | −478.998238 | 1.000000 | N2 | 1.00029966 | 141.431 |
| 47 | 122.579575 | 48.569396 | SIO2 | 1.5607857 | 106.623 |
| 48 | 223.612364 | 1.000000 | N2 | 1.00029966 | 99.428 |
| 49 | 132.028747 | 49.487311 | SIO2 | 1.5607857 | 88.176 |
| 50 | 247.223694 | 10.595002 | N2 | 1.00029966 | 65.249 |
| 51 | 712.954951 | 8.355490 | SIO2 | 1.5607857 | 57.430 |
| 52 | 163.735059 | 3.094307 | N2 | 1.00029966 | 47.446 |
| 53 | 154.368613 | 19.294967 | SIO2 | 1.5607857 | 44.361 |
| 54 | 677.158668 | 2.851896 | N2 | 1.00029966 | 33.956 |
| 55 | 0.000000 | 10.000000 | SIO2 | 1.5607857 | 29.686 |
| 56 | 0.000000 | 4.000000 | AIR | 1.00030168 | 22.559 |
| 57 | 0.000000 | 0.000000 | AIR | 1.00030168 | 14.020 | aspherical constants

| | FN | | | | |
|---|---|---|---|---|---|
| | 2 | 6 | 12 | 17 | 30 |
| K | 0 | 0 | 0 | 0 | 0 |
| C1 | 1.38277367E−07 | 1.02654080E−08 | −3.36870323E−09 | 2.29017476E−10 | −1.51349530E−08 |
| C2 | −1.88982133E−11 | 1.22477004E−11 | 1.77350477E−13 | 4.92394931E−14 | 9.73999326E−13 |
| C3 | 1.94899866E−15 | −1.70638250E−15 | 1.19052376E−19 | 2.34180010E−19 | 8.62745113E−18 |
| C4 | −3.04512613E−19 | 2.48526394E−19 | −1.17127296E−22 | −2.74433865E−23 | 5.94720340E−22 |
| C5 | 3.31424645E−23 | −2.38582445E−23 | −9.25382522E−27 | 8.02938234E−29 | −4.71903409E−26 |

TABLE 2-continued

Design data concerning the exemplary embodiment from FIG. 7.

| C6 | −2.70316185E−27 | 1.51451580E−27 | 4.88058037E−31 | −1.05282366E−32 | 2.87654316E−31 |
|---|---|---|---|---|---|
| C7 | 1.30470314E−31 | −6.30610228E−32 | −1.32782815E−35 | −1.44319713E−38 | 4.40822786E−35 |
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

| | FN | | | |
|---|---|---|---|---|
| | 39 | 44 | 48 | 51 |
| K | 0 | 0 | 0 | 0 |
| C1 | 5.16807805E−09 | −3.74086200E−09 | −2.07951112E−09 | −6.57065732E−09 |
| C2 | −6.52986543E−14 | 9.09495287E−14 | −3.24793684E−14 | 2.35659016E−12 |
| C3 | −6.91577796E−19 | −9.58269360E−19 | −4.06763809E−18 | −1.23585829E−16 |
| C4 | −3.61532300E−24 | 2.46215375E−23 | −4.85274422E−22 | 5.34294269E−20 |
| C5 | −1.38222518E−27 | −8.23397865E−28 | 2.39376432E−27 | −1.12897797E−23 |
| C6 | 1.06689880E−31 | 1.33400957E−32 | 2.44680800E−30 | 1.37710849E−27 |
| C7 | −1.65303231E−36 | −5.95002910E−37 | −5.62502628E−35 | −1.15055048E−31 |
| C8 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 |

Figure 8:
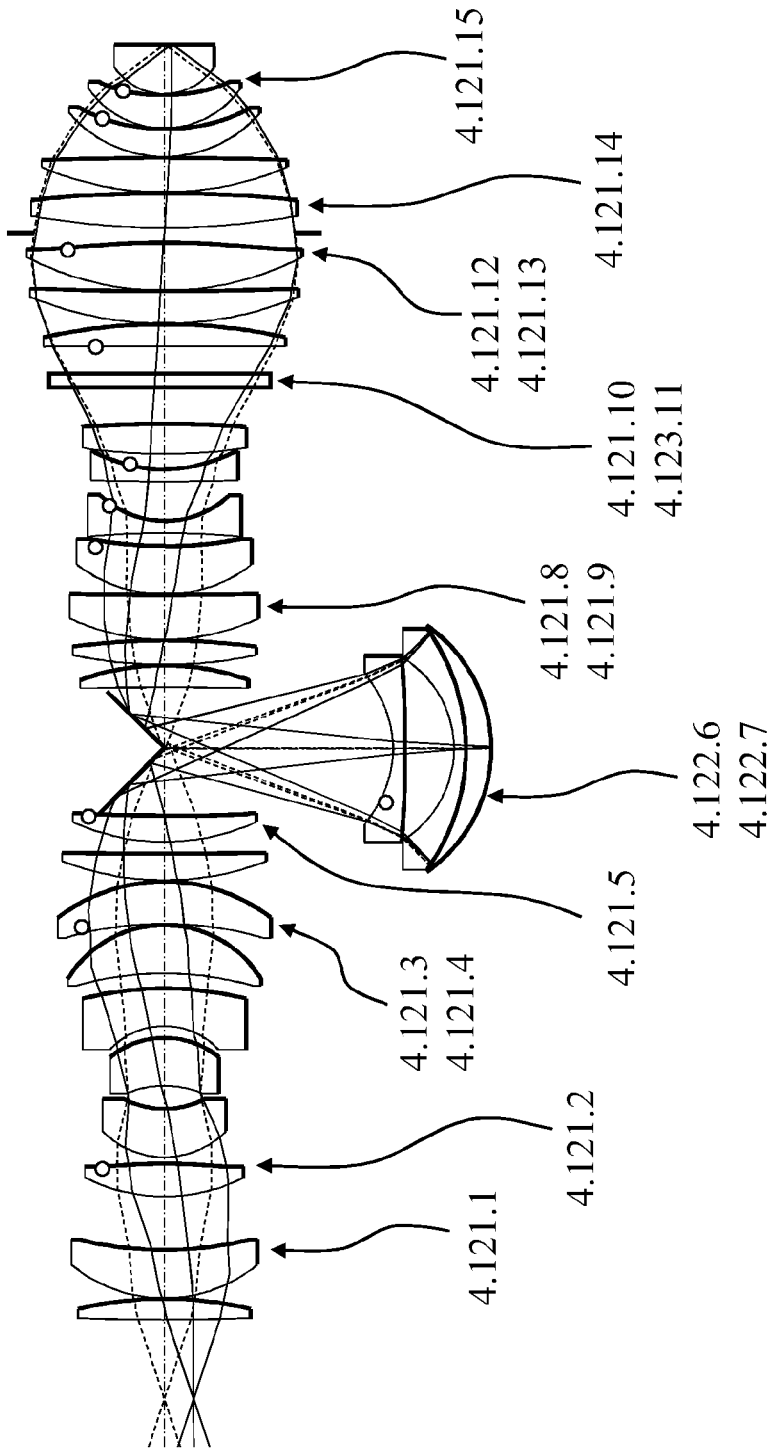
FIG. 8: shows a projection apparatus of a second type for microlithography with objective and manipulator system

FIG. 8 shows a distribution of manipulators on the basis of a further design of an objective. The manipulators therein are listed in the following table:

TABLE 3

Manipulator distribution concerning the exemplary embodiment from FIG. 8.

| 4.121.1 | XY |
|---|---|
| 4.121.2 | Z |
| 4.121.3 | XY |
| 4.121.4 | Z |
| 4.121.5 | Z |
| 4.122.6 | Deforming |
| 4.122.7 | Heating/Cooling |
| 4.121.8 | XY |
| 4.121.9 | Z |
| 4.121.10 | Heating/Cooling |
| 4.123.11 | Exchange/Aspherization |
| 4.121.12 | Z |
| 4.121.13 | Heating/Cooling |
| 4.121.14 | XY |
| 4.121.15 | XY |

In this case:

"Deforming" is understood as applying forces and/or torques to an optical element, specifically a mirror in this case, such that the latter changes its form. 36 or 49 or 100 degrees of freedom are available here since the optical element to be deformed generally models its form on the Zernike polynomials.

The manipulators 4.122.6 and 4.122.7 and also 4.121.12 and 4.121.13 can be used alternatively or in combination at the plane plate. Between 79 and 509 degrees of freedom are accordingly obtained.

Table 4 lists the design data of the exemplary embodiment from FIG. 8. The design of the objective corresponds to the fifth exemplary embodiment from WO2004019128A2. This involves an objective for microlithography having a folded design, and it is designed for immersion operation. It is corrected on an on-axis object field having dimensions of 26 mm×4 mm at an operating wavelength of 193 nm and a maximum numerical aperture of 1.25. The imaging scale is −0.25.

TABLE 2

Design data concerning the exemplary embodiment from FIG. 8.

| NA: 1.25 26 mm × 4 mm | | | | Wavelength: 193.3 nm beta: 0.25 | |
|---|---|---|---|---|---|
| FN | Radius | Thickness/ Distance | Medium | Refractive index at 193.37 nm | 1/2 free diameter |
| 0 | 0.000000 | 81.909100 | | 1.0000000 | 60.033 |
| 1 | 2634.494170 | 21.250400 | SIO2 | 1.5603261 | 84.607 |
| 2 | −395.771680 | 1.000000 | | 1.0000000 | 86.438 |
| 3 | 150.000000 | 50.000000 | SIO2 | 1.5603261 | 93.055 |
| 4 | 369.687330 | 54.915200 | | 1.0000000 | 87.911 |
| 5 | 179.714460 | 34.086800 | SIO2 | 1.5603261 | 79.061 |
| 6 | −477.803632 | 6.693200 | | 1.0000000 | 75.808 |
| 7 | 88.938160 | 50.000000 | SIO2 | 1.5603261 | 61.395 |
| 8 | 91.869190 | 23.605900 | | 1.0000000 | 41.199 |
| 9 | −98.632420 | 50.000000 | SIO2 | 1.5603261 | 38.263 |
| 10 | −88.506390 | 12.049500 | | 1.0000000 | 54.125 |
| 11 | −76.470080 | 38.657300 | SIO2 | 1.5603261 | 55.652 |
| 12 | −344.460330 | 15.702800 | | 1.0000000 | 81.919 |
| 13 | −334.926670 | 50.066100 | SIO2 | 1.5603261 | 90.780 |
| 14 | −117.238730 | 1.000000 | | 1.0000000 | 96.774 |
| 15 | −395.286603 | 43.871600 | SIO2 | 1.5603261 | 102.141 |

TABLE 2-continued

Design data concerning the exemplary embodiment from FIG. 8.

| | | | | | |
|---|---|---|---|---|---|
| 16 | −181.497120 | 1.000000 | | 1.0000000 | 106.823 |
| 17 | 289.196280 | 27.848300 | SIO2 | 1.5603261 | 102.338 |
| 18 | 5892.122010 | 12.151700 | | 1.0000000 | 100.491 |
| 19 | 227.013620 | 27.157000 | SIO2 | 1.5603261 | 91.787 |
| 20 | 3443.763345 | 69.000000 | | 1.0000000 | 88.482 |
| 21 | 0.000000 | −236.511600 | | −1.0000000 | 93.010 |
| 22 | 107.026046 | −12.500000 | SIO2 | −1.5603261 | 77.379 |
| 23 | 1144.459840 | −50.132600 | | −1.0000000 | 93.528 |
| 24 | 110.859760 | −12.500000 | SIO2 | −1.5603261 | 94.408 |
| 25 | 213.248200 | −26.158800 | | −1.0000000 | 121.413 |
| 26 | 155.158660 | 26.158800 | | 1.0000000 | 124.079 |
| 27 | 213.248200 | 12.500000 | SIO2 | 1.5603261 | 121.279 |
| 28 | 110.859760 | 50.132600 | | 1.0000000 | 94.366 |
| 29 | 1144.459840 | 12.500000 | SIO2 | 1.5603261 | 93.590 |
| 30 | 107.026046 | 236.511600 | | 1.0000000 | 78.711 |
| 31 | 0.000000 | −64.048900 | | −1.0000000 | 80.845 |
| 32 | 3037.951580 | −22.331200 | SIO2 | −1.5603261 | 81.395 |
| 33 | 259.310450 | −1.000000 | | −1.0000000 | 84.258 |
| 34 | −470.923230 | −24.545000 | SIO2 | −1.5603261 | 91.158 |
| 35 | 700.750920 | −1.000000 | | −1.0000000 | 92.143 |
| 36 | −228.288980 | −45.979800 | SIO2 | −1.5603261 | 94.586 |
| 37 | −4362.499070 | −1.000000 | | −1.0000000 | 91.793 |
| 38 | −147.001560 | −50.000000 | SIO2 | −1.5603261 | 87.420 |
| 39 | −505.438519 | −13.175800 | | −1.0000000 | 77.709 |
| 40 | 810.594260 | −12.500000 | SIO2 | −1.5603261 | 76.617 |
| 41 | −96.147375 | −40.925200 | | −1.0000000 | 67.165 |
| 42 | −2113.410760 | −12.500000 | SIO2 | −1.5603261 | 70.138 |
| 43 | −144.960906 | −16.180300 | | −1.0000000 | 73.606 |
| 44 | −562.313340 | −30.687700 | SIO2 | −1.5603261 | 75.291 |
| 45 | 1126.648250 | −80.233900 | | −1.0000000 | 81.957 |
| 46 | −3405.414609 | −22.658500 | SIO2 | −1.5603261 | 119.099 |
| 47 | 586.423270 | −1.000000 | | −1.0000000 | 121.813 |
| 48 | −361.039350 | −33.153400 | SIO2 | −1.5603261 | 134.636 |
| 49 | −3170.027570 | −1.000000 | | −1.0000000 | 135.165 |
| 50 | −310.029270 | −49.249300 | SIO2 | −1.5603261 | 138.460 |
| 51 | 809.565830 | −9.868200 | | −1.0000000 | 137.458 |
| 52 | 0.000000 | −5.372200 | | −1.0000000 | 134.639 |
| 53 | −777.317070 | −35.882400 | SIO2 | −1.5603261 | 133.952 |
| 54 | 1312.612220 | −1.000700 | | −1.0000000 | 131.798 |
| 55 | −319.735750 | −35.943900 | SIO2 | −1.5603261 | 123.507 |
| 56 | 3225.490720 | −1.000000 | | −1.0000000 | 120.740 |
| 57 | −130.495300 | −28.495000 | SIO2 | −1.5603261 | 95.630 |
| 58 | −196.7895749 | −1.000000 | | −1.0000000 | 88.921 |
| 59 | −95.22134 | −34.303600 | SIO2 | −1.5603261 | 76.079 |
| 60 | −216.9390336 | −1.000000 | | −1.0000000 | 66.955 |
| 61 | −61.85167 | −50.000000 | SIO2 | −1.5603261 | 49.647 |
| 62 | 0 | −1.000000 | H2O | −1.4368163 | 16.616 |
| 63 | 0 | 0.000000 | H2O | −1.4368163 | 15.010 | aspherical constants

| | FN | | | | |
|---|---|---|---|---|---|
| | 6 | 15 | 20 | 22 | 30 |
| K | 0 | 0 | 0 | 0 | 0 |
| C1 | 7.81812000E−08 | −1.14607000E−08 | 1.29530000E−08 | −8.88014000E−08 | −8.88014000E−08 |
| C2 | 6.03387000E−13 | 4.60861000E−13 | 2.79320000E−13 | −3.40911000E−12 | −3.40911000E−12 |
| C3 | 3.16794000E−16 | −1.61766000E−17 | −1.95862000E−17 | −1.98985000E−16 | −1.98985000E−16 |
| C4 | −3.45599000E−20 | −5.41414000E−24 | 6.49032000E−22 | −1.45801000E−20 | −1.45801000E−20 |
| C5 | 1.67268000E−24 | 5.36076000E−28 | −1.02409000E−26 | −9.23066000E−26 | −9.23066000E−26 |
| C6 | 0.00000000E+00 | −1.16131000E−31 | −4.06450000E−32 | −1.30730000E−28 | −1.30730000E−28 |
| C7 | 0.00000000E+00 | 0.00000000E+00 | 0.00000000E+00 | 0.00000000E+00 | 0.00000000E+00 |
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

| | FN | | | | |
|---|---|---|---|---|---|
| | 39 | 41 | 43 | 46 | 51 |
| K | 0 | 0 | 0 | 0 | 0 |
| C1 | −3.21829000E−08 | −1.40846000E−08 | 3.76564000E−08 | 1.54429000E−08 | −9.78469000E−09 |
| C2 | 4.08976000E−13 | 3.73235000E−12 | 2.04565000E−12 | −1.52631000E−13 | 2.15545000E−14 |
| C3 | 9.46190000E−17 | 5.78170000E−17 | 6.72661000E−17 | −1.17235000E−17 | −2.66488000E−17 |
| C4 | −1.12686000E−20 | 4.02044000E−20 | 3.35779000E−21 | −3.02626000E−22 | 1.19902000E−21 |
| C5 | 1.09349000E−24 | 1.81116000E−24 | −5.51576000E−25 | −2.05070000E−28 | −2.50321000E−26 |
| C6 | −2.30304000E−29 | −3.46502000E−28 | 2.95829000E−28 | 3.61487000E−31 | 2.10016000E−31 |
| C7 | 0.00000000E+00 | 0.00000000E+00 | 0.00000000E+00 | 0.00000000E+00 | 0.00000000E+00 |

TABLE 2-continued

Design data concerning the exemplary embodiment from FIG. 8.

| | | | | | |
|---|---|---|---|---|---|
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

| | FN | |
|---|---|---|
| | 58 | 60 |
| K | 0 | 0 |
| C1 | 2.76215000E−09 | −1.08228000E−07 |
| C2 | −4.06793000E−12 | −9.51194000E−12 |
| C3 | 4.51389000E−16 | 1.14605000E−15 |
| C4 | −5.07074000E−20 | −1.27400000E−19 |
| C5 | 1.83976000E−24 | 1.59438000E−23 |
| C6 | −6.22513000E−29 | −5.73173000E−28 |
| C7 | 0.00000000E+00 | 0.00000000E+00 |
| C8 | 0.00000000E+00 | 0.00000000E+00 |
| C9 | 0.00000000E+00 | 0.00000000E+00 |

Figure 9:
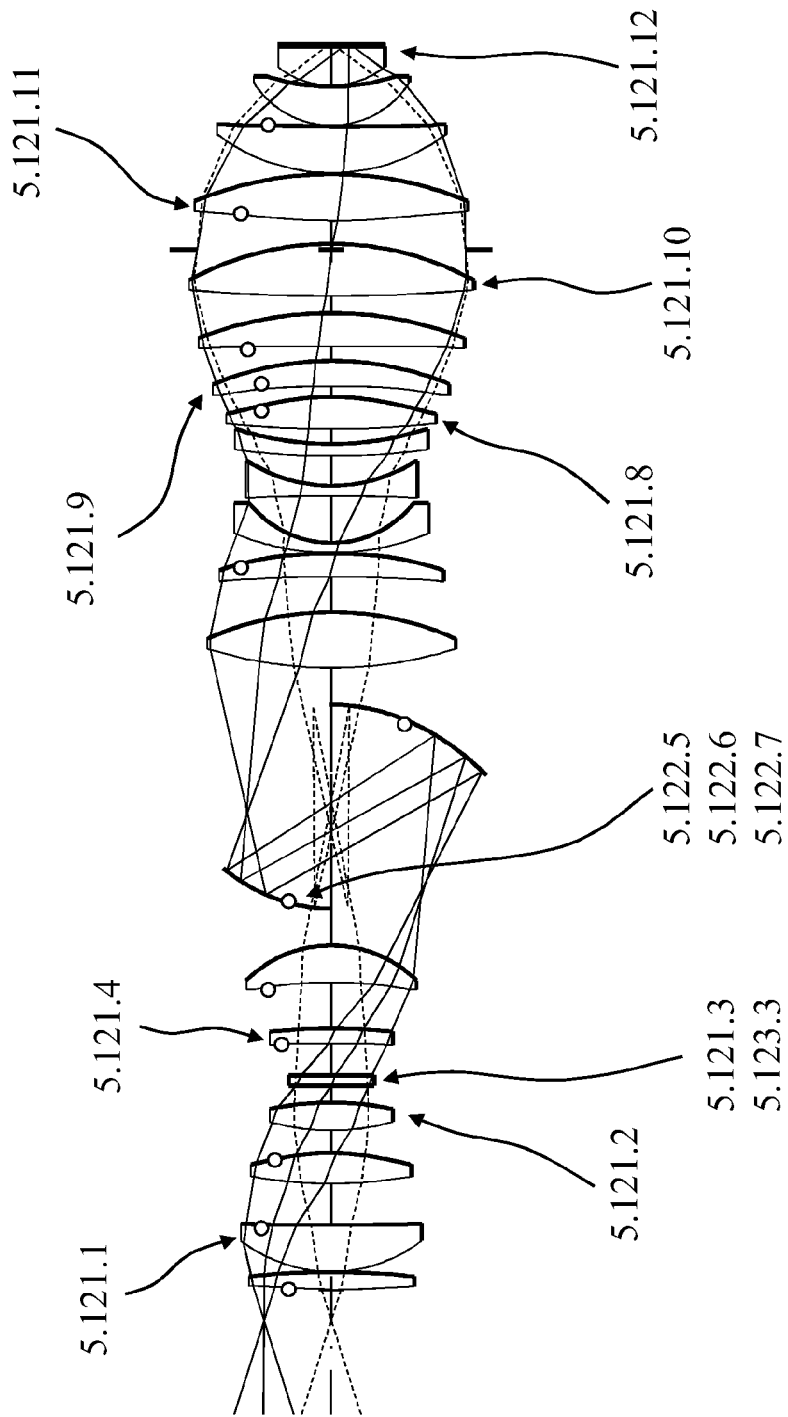
FIG. 9: shows a projection apparatus of a third type for microlithography with objective and manipulator system

FIG. 9 shows the distribution of manipulators on the basis of a further design of an objective. The manipulators therein are listed in the following table:

TABLE 5

Manipulator distribution concerning the exemplary embodiment from FIG. 9.

| | |
|---|---|
| 5.121.1 | XY |
| 5.121.2 | XYZ tilt |
| 5.123.3 | Exchange/Aspherization |
| 5.121.3 | Heating/Cooling |
| 5.121.4 | Z |
| 5.122.5 | XYZ tilt |
| 5.122.6 | Heating/Cooling |
| 5.122.7 | Deforming |
| 5.121.8 | XY |
| 5.121.9 | Deforming |
| 5.121.10 | XY |

TABLE 5-continued

Manipulator distribution concerning the exemplary embodiment from FIG. 9.

| | |
|---|---|
| 5.121.11 | XY |
| 5.121.12 | XYZ tilt |

The manipulators 5.123.3 and 5.121.3 and 5.122.5, 5.122.6 and 5.122.7 can be used alternatively or in combination at the plane plate. Between 79 and 509 degrees of freedom are accordingly obtained.

Table 6 lists the design data of the exemplary embodiment from FIG. 9. The design of the objective corresponds to the fifteenth exemplary embodiment from WO2005069055A2. This involves an objective for microlithography having a rotationally symmetrical inline design, and it is deigned for immersion operation. It is corrected on an off-axis object field having a maximum field height of 66 mm at an operating wavelength of 193 nm and a maximum numerical aperture of 1.2. The imaging scale is −0.25 and the object field has an extent of 26 mm and 5.5 mm in the x and y direction, respectively.

TABLE 6

Design data concerning the exemplary embodiment from FIG. 9.

NA: 1.2
2Y': 33.0 mm
Wavelength: 193.37 nm
beta: 0.25

| FN | Radius | Thickness/Distance | Medium | Refractive index at 193.37 nm | 1/2 free diameter |
|---|---|---|---|---|---|
| 0 | 0.000000 | 0.000000 | AIR | 1.0003096 | 66.000 |
| 1 | 0.000000 | 29.975639 | AIR | 1.0003096 | 66.000 |
| 2 | 585.070331 | 17.118596 | SIO2 | 1.5607857 | 76.447 |
| 3 | −766.901651 | 0.890161 | HELIUM | 1.0000329 | 78.252 |
| 4 | 145.560665 | 45.675278 | SIO2 | 1.5607857 | 85.645 |
| 5 | 2818.543789 | 40.269525 | HELIUM | 1.0000329 | 83.237 |
| 6 | 469.396236 | 29.972759 | SIO2 | 1.5607857 | 75.894 |
| 7 | −193.297708 | 21.997025 | HELIUM | 1.0000329 | 73.716 |
| 8 | 222.509238 | 27.666963 | SIO2 | 1.5607857 | 57.818 |
| 9 | −274.231957 | 16.483375 | HELIUM | 1.0000329 | 52.595 |
| 10 | 0.000000 | 10.117766 | SIO2 | 1.5607857 | 36.873 |
| 11 | 0.000000 | 30.361487 | HELIUM | 1.0000329 | 39.808 |
| 12 | 26971.109898 | 14.803554 | SIO2 | 1.5607857 | 54.127 |
| 13 | −562.070426 | 45.416373 | HELIUM | 1.0000329 | 58.058 |
| 14 | −510.104298 | 35.926312 | SIO2 | 1.5607857 | 76.585 |
| 15 | −118.683707 | 36.432152 | HELIUM | 1.0000329 | 80.636 |
| 16 | 0.000000 | 199.241665 | HELIUM | 1.0000329 | 86.561 |
| 17 | −181.080772 | −199.241665 | HELIUM | −1.0000329 | 147.683 |
| 18 | 153.434246 | 199.241665 | HELIUM | 1.0000329 | 102.596 |

TABLE 6-continued

Design data concerning the exemplary embodiment from FIG. 9.

| | | | | | |
|---|---|---|---|---|---|
| 19 | 0.000000 | 36.432584 | HELIUM | 1.0000329 | 105.850 |
| 20 | 408.244008 | 54.279598 | SIO2 | 1.5607857 | 118.052 |
| 21 | −296.362521 | 34.669451 | HELIUM | 1.0000329 | 118.397 |
| 22 | −1378.452784 | 22.782283 | SIO2 | 1.5607857 | 106.566 |
| 23 | −533.252331 | 0.892985 | HELIUM | 1.0000329 | 105.292 |
| 24 | 247.380841 | 9.992727 | SIO2 | 1.5607857 | 92.481 |
| 25 | 103.088603 | 45.957039 | HELIUM | 1.0000329 | 80.536 |
| 26 | −1832.351074 | 9.992069 | SIO2 | 1.5607857 | 80.563 |
| 27 | 151.452362 | 28.883857 | HELIUM | 1.0000329 | 81.238 |
| 28 | 693.739003 | 11.559320 | SIO2 | 1.5607857 | 86.714 |
| 29 | 303.301679 | 15.104783 | HELIUM | 1.0000329 | 91.779 |
| 30 | 1016.426625 | 30.905849 | SIO2 | 1.5607857 | 95.900 |
| 31 | −258.080954 | 10.647394 | HELIUM | 1.0000329 | 99.790 |
| 32 | −1386.614747 | 24.903261 | SIO2 | 1.5607857 | 108.140 |
| 33 | −305.810572 | 14.249112 | HELIUM | 1.0000329 | 112.465 |
| 34 | −11755.656826 | 32.472684 | SIO2 | 1.5607857 | 124.075 |
| 35 | −359.229865 | 16.650084 | HELIUM | 1.0000329 | 126.831 |
| 36 | 1581.896158 | 51.095339 | SIO2 | 1.5607857 | 135.151 |
| 37 | −290.829022 | −5.686977 | HELIUM | 1.0000329 | 136.116 |
| 38 | 0.000000 | 0.000000 | HELIUM | 1.0000329 | 131.224 |
| 39 | 0.000000 | 28.354383 | HELIUM | 1.0000329 | 131.224 |
| 40 | 524.037274 | 45.835992 | SIO2 | 1.5607857 | 130.144 |
| 41 | −348.286331 | 0.878010 | HELIUM | 1.0000329 | 129.553 |
| 42 | 184.730622 | 45.614622 | SIO2 | 1.5607857 | 108.838 |
| 43 | 2501.302312 | 0.854125 | HELIUM | 1.0000329 | 103.388 |
| 44 | 89.832394 | 38.416586 | SIO2 | 1.5607857 | 73.676 |
| 45 | 209.429378 | 0.697559 | HELIUM | 1.0000329 | 63.921 |
| 46 | 83.525032 | 37.916651 | CAF2 | 1.5017542 | 50.040 |
| 47 | 0.000000 | 0.300000 | SIO2 | 1.5607857 | 21.479 |
| 48 | 0.000000 | 0.000000 | SIO2 | 1.5607857 | 21.115 |
| 49 | 0.000000 | 3.000000 | H2O | 1.4364132 | 21.115 |
| 50 | 0.000000 | 0.000000 | H2O | 1.4364132 | 16.505 | aspherical constants

FN

| | 2 | 5 | 7 | 12 | 14 |
|---|---|---|---|---|---|
| K | 0 | 0 | 0 | 0 | 0 |
| C1 | −5.72012211E−08 | −4.71048005E−08 | 1.75086747E−07 | −8.29030145E−08 | −4.34813024E−08 |
| C2 | −2.97210914E−13 | 7.03645794E−12 | −1.17024854E−11 | −1.87068852E−13 | 1.58782568E−12 |
| C3 | 1.03373633E−18 | 1.09436502E−16 | 1.34272775E−15 | −7.03882158E−16 | −6.81156672E−17 |
| C4 | 2.75620768E−20 | −2.90375326E−20 | −5.44275165E−20 | 6.64851833E−20 | 5.02561613E−21 |
| C5 | −1.51222259E−24 | −1.55397282E−27 | −1.81522008E−24 | −1.33132348E−23 | −1.68149079E−29 |
| C6 | −1.03524191E−30 | 5.61276612E−29 | 2.56002395E−28 | 2.45514238E−27 | −2.36033151E−29 |
| C7 | 0.00000000E+00 | 0.00000000E+00 | 0.00000000E+00 | 0.00000000E+00 | 0.00000000E+00 |
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

FN

| | 17 | 18 | 23 | 31 | 32 |
|---|---|---|---|---|---|
| K | −1.9785 | −2.0405 | 0 | 0 | 0 |
| C1 | −2.94495560E−08 | 5.77041586E−08 | −7.05738830E−08 | 3.41405490E−08 | −4.84935278E−08 |
| C2 | 2.62639190E−13 | −5.00405031E−13 | 4.10958857E−12 | 4.06789648E−14 | 9.87851350E−13 |
| C3 | −6.10861502E−18 | 2.67421248E−17 | −1.18483664E−16 | 8.09527811E−17 | 7.36716691E−17 |
| C4 | 1.10681541E−22 | −5.69249001E−22 | 2.92033013E−21 | −4.34256348E−21 | −6.56379364E−21 |
| C5 | −2.00600333E−27 | 1.89054849E−26 | −3.23306884E−25 | 7.59470229E−25 | 6.53011342E−25 |
| C6 | 2.08120710E−32 | −1.48621356E−31 | 2.18022642E−31 | −3.40748705E−29 | −2.88019310E−29 |
| C7 | 0.00000000E+00 | 0.00000000E+00 | 0.00000000E+00 | 0.00000000E+00 | 0.00000000E+00 |
| C8 | 0.00000000E+00 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 | 0.00000000E+00 |

FN

| | 34 | 40 | 43 |
|---|---|---|---|
| K | 0 | 0 | 0 |
| C1 | 1.58884127E−08 | −4.10094031E−08 | −3.89229775E−08 |
| C2 | −1.51417786E−12 | 3.03513679E−13 | 4.76248499E−12 |
| C3 | 6.61629402E−19 | 5.71449385E−17 | −2.23473391E−16 |
| C4 | 1.71961448E−21 | −1.72291437E−21 | 8.89371535E−21 |
| C5 | −9.35857585E−26 | −9.60153088E−28 | −2.41148420E−25 |
| C6 | 2.35940587E−30 | 3.81030848E−31 | 3.42843475E−30 |

TABLE 6-continued

Design data concerning the exemplary embodiment from FIG. 9.

| C7 | 0.00000000E+00 | 0.00000000E+00 | 0.00000000E+00 |
| C8 | 0.00000000E+00 | 0.00000000E+00 | 0.00000000E+00 |
| C9 | 0.00000000E+00 | 0.00000000E+00 | 0.00000000E+00 |

Figure 13:
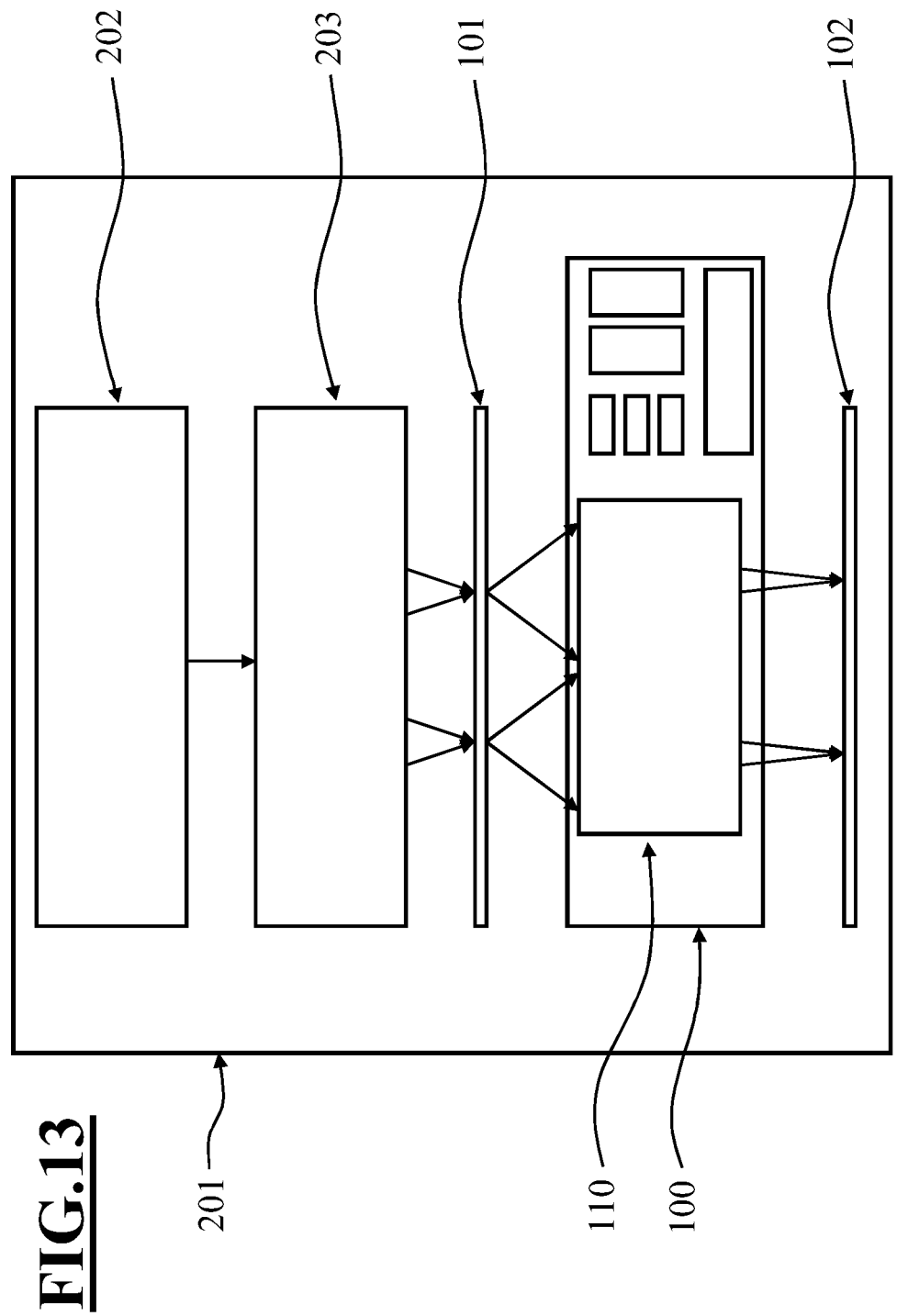
FIG. 13: shows a basic schematic diagram of a projection exposure apparatus for microlithography comprising a projection apparatus according to the disclosure.

FIG. 13 shows a projection exposure apparatus 201 for microlithography including a projection apparatus 100. The projection exposure apparatus includes a light source 202, which is generally a laser, which operates with an operating wavelength of 193 or 248 nm. Use is also made of other light sources, such as gas discharge lamps, which by their nature yield less narrow bandwidths of the operating wavelengths but have pronounced peaks at wavelengths of 365 nm, 405 nm and 435 nm (i, g and h lines). The wavelength of 13 nm is likewise employed where the light comes from a laser plasma source. The course of the illumination light through the projection exposure apparatus is illustrated schematically by arrows. The light leaves the light source 202 without appreciable light conductance (etendue). The latter is produced by the illumination system 203, which illuminates the reticle 101 under a predefined output-side aperture of the illumination system 203. The illumination system 203 also sets the illumination setting. Use is made of dipole, quadrupole or annular settings and freeform setting, which can be set using a multimirror array, for example.

After passing through the mask, which is generally defined as a binary chrome or phase-shifting mask, the illumination light reaches the projection apparatus and the objective 110 therein. Said objective is operated with a diaphragm position corresponding to a sigma setting that is optimum for the imaging of the reticle currently being used. The sigma setting is defined as the quotient of output-side aperture of the illumination system and input-side aperture of the objective.

During the exposure of a die, in the event of a change from die to die, in the event of a change from wafer to wafer, in the event of a change from reticle to reticle, or in the event of a change from batch to batch, the projection optical assembly is brought to specification again by regulation or control of manipulators upon the determination of an overshooting of an upper bound for a specified image aberration. This also holds true if, as an alternative or in addition, an overshooting of an upper bound for a specification of a manipulator is ascertained. This regulation is effected within a time period of 30000 ms, preferably 10000 ms, very preferably 5000 ms, extremely preferably 1000 ms, most preferably 200 ms, ideally 20 ms, very ideally 5 ms, extremely ideally 1 ms.

This fine adjustment can also be effected regularly in time intervals of 30000 ms, preferably 10000 ms, very preferably 5000 ms, extremely preferably 1000 ms, most preferably 200 ms, ideally 20 ms, very ideally 5 ms, extremely ideally 1 ms.

All three forms of adjustment differ in the steps
(i) Determining the manipulator movements with solution of the inverse problem,
(ii) Moving the manipulators to the new movements determined, in accordance with the solution to the inverse problem.

The above time intervals for realizing steps (i) and (ii) are advantageously approximately halved in each case: 15000 ms, preferably 5000 ms, very preferably 2000 ms, extremely preferably 500 ms, most preferably 100 ms, ideally 10 ms, very ideally 2 ms, extremely ideally 0.5 ms. In the case of a relatively sluggish manipulator it is also possible to employ other ratios such as, for example: 1.5 s, preferably 500 ms, very preferably 200 ms, extremely preferably 50 ms, most preferably 10 ms, ideally 1 ms, very ideally 0.2 ms, extremely ideally 0.05 ms.

What is claimed is:

1. A system, comprising:
an objective, comprising:
an optical element; and
a manipulator configured to manipulate the optical element, wherein the manipulator has a maximum physical range in the objective; and
a control unit configured to control the manipulator, the control unit comprising:
a first device configured to control the manipulation of the optical element by the manipulator;
a memory comprising a bound for a range of the manipulation of the optical element by the manipulator, the bound being more restrictive than a limit of the maximum physical range; and
a second device configured to calculate a value of a merit function based on at least one error and configured to minimize the merit function subordinate to the bound for the range of the manipulation of the optical element by the manipulator,
wherein the objective is a microlithography projection objective.

2. The system of claim 1, wherein the objective comprises a plurality of optical elements.

3. The system of claim 2, wherein the objective comprises a plurality of manipulators.

4. The system of claim 3, wherein each optical element has a corresponding manipulator.

5. The system of claim 4, wherein the first device is configured to control movement of each manipulator.

6. The system of claim 1, wherein the at least one error is selected from the group consisting of scale error, telecentricity error, overlay error, depth of focus error, best focus errors and errors due to image aberrations produced by integration of a plurality of field points.

7. The system of claim 1, wherein the at least one error comprises at least one image aberration.

8. The system of claim 1, wherein the merit function comprises a parameter describing a sensitivity matrix.

9. The system of claim 8, wherein the merit function comprises a regularization parameter.

10. The system of claim 1, wherein the objective comprises first, second and third optical elements, the first optical element is near a pupil plane of the objective, the second optical element is near a field plane of the objective, and the third optical element is not near a pupil plane of the objective or a field plane of the objective.

11. The system of claim 1, wherein the bound is the upper bound.

12. The system of claim, 1 wherein the control unit is configured to control the manipulator in real time within 15000 ms.

13. The system of claim 1, wherein the control unit is configured to control the manipulator in real time within 5000 ms.

14. The system of claim 1, wherein the control unit is configured to control the manipulator in real time within 1000 ms.

15. The system of claim 1, wherein the control unit is configured to control the manipulator in real time within 200 ms.

16. The system of claim 1, wherein the control unit is configured to control the manipulator in real time within 20 ms.

17. The system of claim 1, wherein the control unit is configured to control the manipulator in real time within 5 ms.

18. The system of claim 1, wherein the control unit is configured to control the manipulator in real time within 1 ms.

19. The system of claim 1, wherein the merit function comprises a linear function of a degree of freedom of the manipulation of the optical element by the manipulator.

20. The system of claim 1, wherein the merit function comprises a quadratic function of a degree of freedom of the manipulation of the optical element by the manipulator.

21. The system of claim 1, wherein the second device is configured to minimize the merit function using a linear programming.

22. The system of claim 1, wherein the second device is configured to minimize the merit function using a quadratic programming.

23. The system of claim 1, wherein calculating the value of the merit function comprises generating the merit function.

24. The system of claim 23, wherein generating the merit function comprises determining a parameter of the merit function based on a statistical distribution.

25. The system of claim 23, wherein generating the merit function comprises determining a parameter of the merit function based on a look-up table.

26. The system of claim 1, wherein calculating the value of the merit function comprises adjusting weighting coefficients of the merit function.

27. The system of claim 26, wherein the weighting coefficients represent the weighting of different degrees of freedom of the manipulation.

28. The system of claim 26, wherein the weighting coefficients represent the weighting of different errors.

29. The system of claim 1, wherein the manipulation of the optical element by the manipulator comprises at least one element selected from the group consisting of shifting the optical element, rotating the optical element and deforming the optical element.

30. The system of claim 1, wherein the manipulation of the optical element by the manipulator comprises exchanging the optical element.

31. The system of claim 1, wherein the manipulation of the optical element by the manipulator comprises at least one element selected from the group consisting of heating the optical element and cooling the optical element.

32. The system of claim 1, wherein the optical element comprises a reflective optical element.

33. The system of claim 1, wherein the optical element comprises a reflective optical element in the vicinity of a pupil plane.

34. The system of claim 1, wherein:
the objective has a folded design comprising first, second and third objective parts;
the optical element comprises a reflective optical element in the second objective part;
the first objective part comprises refractive optical elements; and
the third objective part comprises refractive optical elements.

35. The system of claim 1, wherein:
the objective has a folded design comprising first, second and third objective parts;
the optical element comprises a reflective optical element in the vicinity of a pupil plane in the second objective part;
the first objective part comprises refractive optical elements; and
the third objective part comprises refractive optical elements.

36. The system of claim 1, wherein the optical element comprises a diffractive optical element.

37. The system of claim 1, wherein the optical element comprises a refractive optical element.

38. The system of claim 1, wherein the second device is configured to calculate the merit function based on a root mean square (RMS) of the at least one error.

39. The system of claim 1, wherein the second device is configured to calculate the merit function based on a square of a root mean square (RMS) of the at least one error.

40. The system of claim 1, wherein the maximum physical range in the objective is a maximum possible movement distance governed by a design of the manipulator or by the structural space within the objective.

41. The system of claim 1, wherein the maximum physical range in the objective is a maximum possible temperature range of the manipulator.

42. An apparatus, comprising:
an illumination system; and
a projection objective, comprising:
an optical element; and
a manipulator configured to manipulate the optical element, wherein the manipulator has a maximum physical range in the objective; and
a control unit configured to control the manipulator, the control unit comprising:
a first device configured to control the manipulation of the optical element by the manipulator;
a memory comprising a bound for a range of the manipulation of the optical element by the manipulator, the bound being more restrictive than a limit of the maximum physical range permitted; and
a second device configured to calculate a value of a merit function based on at least one error and configured to minimize the merit function subordinate to the bound for the range of the manipulation of the optical element by the manipulator,
wherein the apparatus is a microlithography projection exposure apparatus.

43. The apparatus of claim 42, the projection objective comprises a plurality of optical elements.

44. The apparatus of claim 42, wherein the merit function comprises a linear function of a degree of freedom of the manipulation of the optical element by the manipulator.

45. The apparatus of claim 42, wherein the merit function comprises a quadratic function of a degree of freedom of the manipulation of the optical element by the manipulator.

46. The apparatus of claim 42, wherein the second device is configured to minimize the merit function using a linear programming.

47. The apparatus of claim 42, wherein the second device is configured to minimize the merit function using a quadratic programming.

48. The apparatus of claim 42, wherein calculating the value of the merit function comprises generating the merit function.

49. The apparatus of claim 48, wherein generating the merit function comprises determining a parameter of the merit function based on a statistical distribution.

50. The apparatus of claim 48, wherein generating the merit function comprises determining a parameter of the merit function based on a look-up table.

51. The apparatus of claim 42, wherein calculating the value of the merit function comprises adjusting weighting coefficients of the merit function.

52. The apparatus of claim 51, wherein the weighting coefficients represent the weighting of different degrees of freedom of the manipulation.

53. The apparatus of claim 51, wherein the weighting coefficients represent the weighting of different errors.

54. The apparatus of claim 42, wherein the manipulation of the optical element by the manipulator comprises at least one element selected from the group consisting of shifting the optical element, rotating the optical element and deforming the optical element.

55. The apparatus of claim 42, wherein the manipulation of the optical element by the manipulator comprises exchanging the optical element.

56. The apparatus of claim 42, wherein the manipulation of the optical element by the manipulator comprises at least one element selected from the group consisting of heating the optical element and cooling the optical element.

57. The apparatus of claim 42, wherein the optical element comprises a reflective optical element.

58. The apparatus of claim 42, wherein the optical element comprises a reflective optical element in the vicinity of a pupil plane.

59. The apparatus of claim 42, wherein:
the objective has a folded design comprising first, second and third objective parts;
the optical element comprises a reflective optical element in the second objective part;
the first objective part comprises refractive optical elements; and
the third objective part comprises refractive optical elements.

60. The apparatus of claim 42, wherein:
the objective has a folded design comprising first, second and third objective parts;
the optical element comprises a reflective optical element in the vicinity of a pupil plane in the second objective part;
the first objective part comprises refractive optical elements; and
the third objective part comprises refractive optical elements.

61. The apparatus of claim 42, wherein the optical element comprises a diffractive optical element.

62. The apparatus of claim 42, wherein the optical element comprises a refractive optical element.

63. The apparatus of claim 42, wherein the second device is configured to calculate the merit function based on a root mean square (RMS) of the at least one error.

64. The apparatus of claim 42, wherein the second device is configured to calculate the merit function based on a square of a root mean square (RMS) of the at least one error.

65. The apparatus of claim 42, wherein the maximum physical range in the objective is a maximum possible movement distance governed by a design of the manipulator or by the structural space within the objective.

66. The apparatus of claim 42, wherein the maximum physical range in the objective is a maximum possible temperature range of the manipulator.

* * * * *